(12) United States Patent
Yoshida

(10) Patent No.: US 7,579,645 B2
(45) Date of Patent: Aug. 25, 2009

(54) SEMICONDUCTOR DEVICE HAVING NON-VOLATILE MEMORY CELL

(75) Inventor: Masaaki Yoshida, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/588,479

(22) PCT Filed: Dec. 19, 2005

(86) PCT No.: PCT/JP2005/023699

§ 371 (c)(1),
(2), (4) Date: Aug. 1, 2006

(87) PCT Pub. No.: WO2006/068265

PCT Pub. Date: Jun. 29, 2006

(65) Prior Publication Data

US 2007/0164346 A1    Jul. 19, 2007

(30) Foreign Application Priority Data

Dec. 24, 2004 (JP) .............................. 2004-372775
Mar. 30, 2005 (JP) .............................. 2005-097472

(51) Int. Cl.
*H01L 29/788* (2006.01)
(52) U.S. Cl. .................. 257/314; 257/E27.014
(58) Field of Classification Search .......... 257/E27.103, 257/314–316, E21.103, 14; 365/185.29, 365/185.01, 185.05, 185.026
See application file for complete search history.

(56) References Cited

U.S. PATENT DOCUMENTS

| 5,925,907 | A  |   | 7/1999 | Hazama |         |
|-----------|----|---|--------|--------|---------|
| 6,282,123 | B1 | * | 8/2001 | Mehta  | 365/185.28 |
| 7,238,575 | B2 | * | 7/2007 | Ding   | 438/266 |
| 2003/0203575 | A1 | * | 10/2003 | Hung et al. | 438/266 |
| 2003/0235082 | A1 |   | 12/2003 | Hsu et al. | |
| 2004/0113197 | A1 |   | 6/2004 | Yoshida et al. | |

FOREIGN PATENT DOCUMENTS

CN        86104307 A        9/1987

(Continued)

OTHER PUBLICATIONS

Oct. 31, 2008 official action in connection with a counterpart Chinese patent application No. 2005800088755 (and English translation thereof).

*Primary Examiner*—Nathan W Ha
(74) *Attorney, Agent, or Firm*—Cooper & Dunham, LLP

(57) ABSTRACT

A semiconductor device is disclosed that includes a nonvolatile memory cell having a memory transistor and a selection transistor, and a peripheral circuit transistor. The memory transistor includes a memory gate oxide film that is arranged on a semiconductor substrate, and a floating gate made of polysilicon that is arranged on the memory gate oxide film. The selection transistor is serially connected to the memory transistor and includes a selection gate oxide film that is arranged on the semiconductor substrate, and a selection gate made of polysilicon that is arranged on the selection gate oxide film. The peripheral circuit transistor includes a peripheral circuit gate oxide film that is arranged on the semiconductor substrate, and a peripheral circuit gate made of polysilicon that is arranged on the peripheral circuit gate oxide film. The memory gate oxide film is arranged to be thinner than the peripheral circuit gate oxide film.

9 Claims, 50 Drawing Sheets

FOREIGN PATENT DOCUMENTS

| | | |
|---|---|---|
| CN | 1405975 A | 3/2003 |
| CN | 1510424 A | 7/2004 |
| JP | 4-80544 | 3/1992 |
| JP | 6-85275 | 3/1994 |
| JP | 8-506693 | 7/1996 |
| JP | 9-36259 | 2/1997 |
| JP | 2003-168747 | 6/2003 |
| JP | 2003-347435 | 12/2003 |
| JP | 2004-31920 | 1/2004 |
| WO | WO94/00881 | 1/1994 |
| WO | WO03/061011 A2 | 7/2003 |

\* cited by examiner

Prior Art

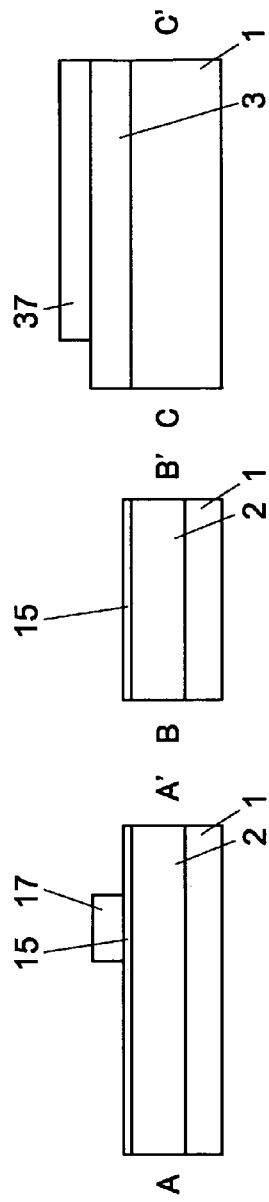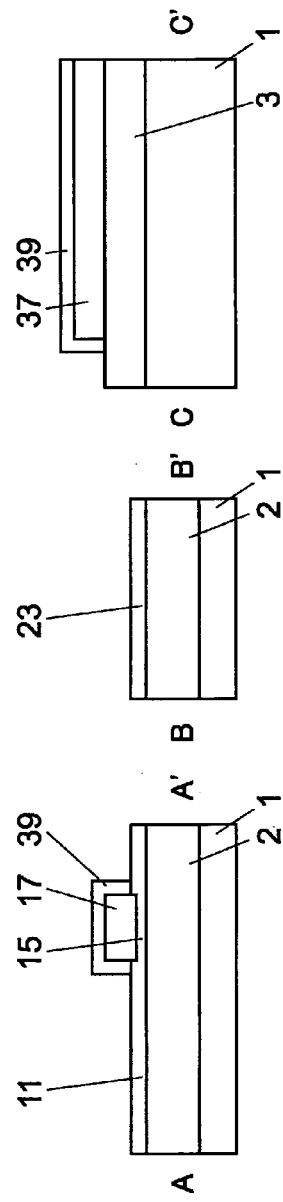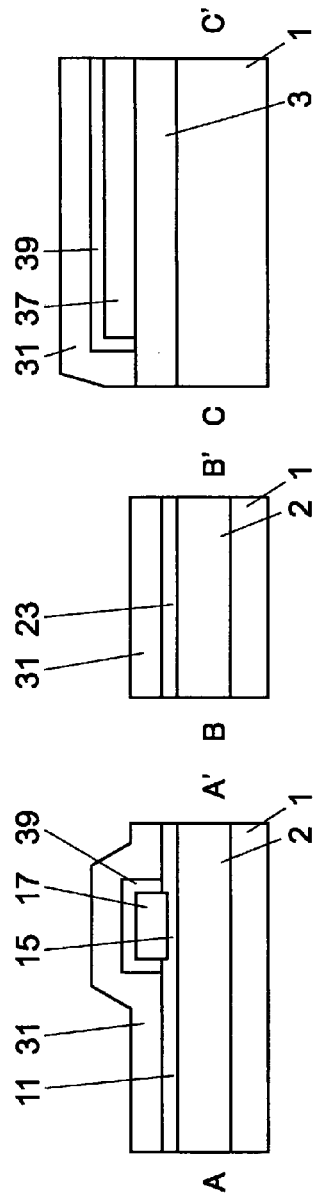
FIG.10A
FIG.10B
FIG.10C

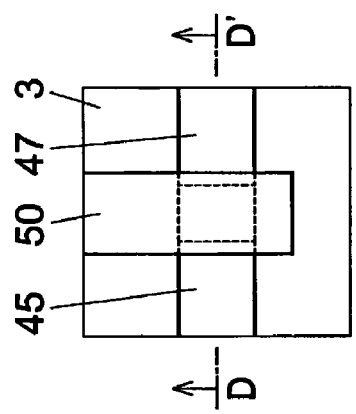
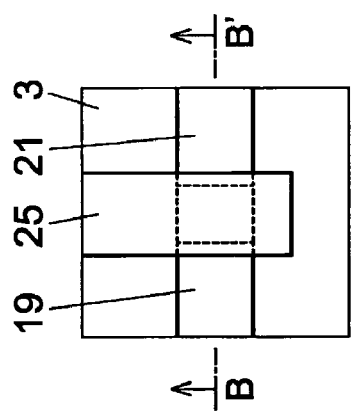
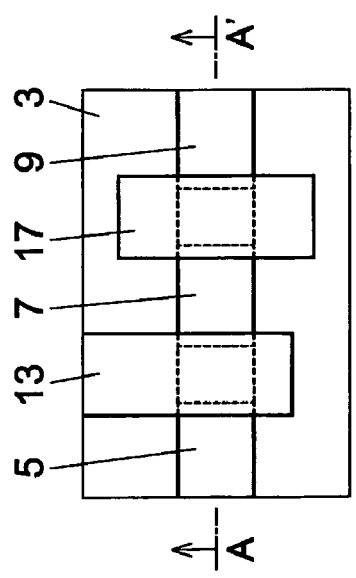
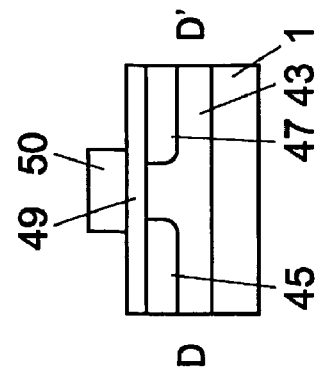
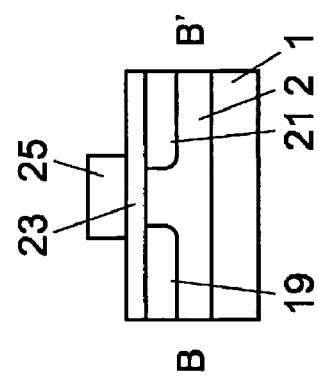
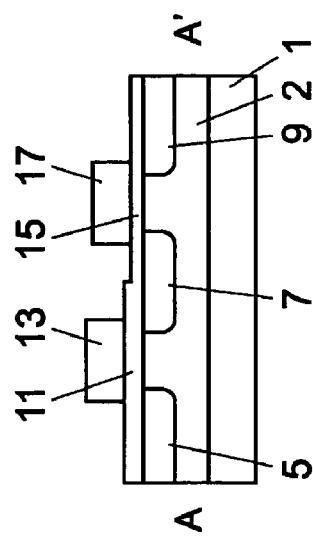

205 233 207 235 209 203

A — A'

219 225 221 203

B — B'

243 233 245 235

A — A'

205 207 209 202 201

247 225 251

B — B'

219 221 202 201

FIG.49A
205 233 207 235 209 203
A ———— A'
FIG.49B
219 225 221 203
B ———— B'
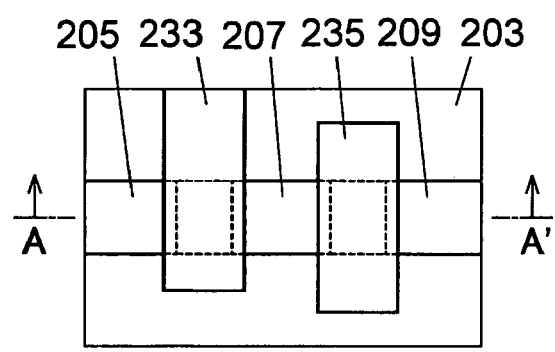
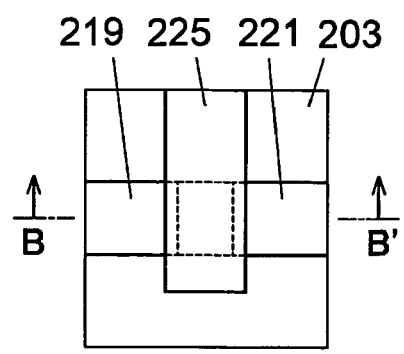
FIG.49C
265 233 257 235
A ———— A'
205   207   209 202 201
FIG.49D
259 225
B ———— B'
219   221 202 201
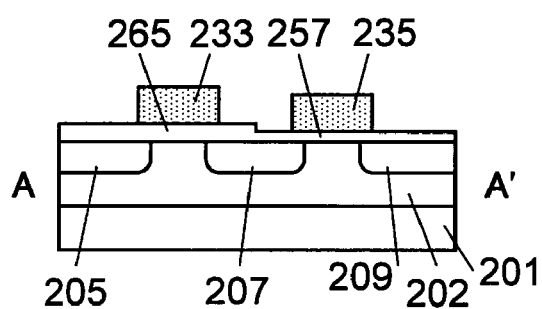
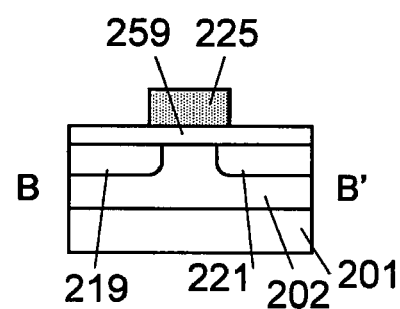

SEMICONDUCTOR DEVICE HAVING NON-VOLATILE MEMORY CELL

TECHNICAL FIELD

The present invention relates to a semiconductor device that includes a nonvolatile memory cell having a floating gate, and a peripheral circuit such as a logic circuit. Such a semiconductor device may be applied as a semiconductor device including a divider resistor circuit, a voltage detecting circuit, or a constant voltage generating circuit, for example.

BACKGROUND ART

The EEPROM (Electrically Erasable Programmable Read Only Memory), which corresponds to one form of a nonvolatile memory, may generally be classified into two types according the number of gates used. Namely, the EEPROM may be classified into a one-layer gate type nonvolatile memory and a two-layer gate type nonvolatile memory. For example, Japanese Laid-Open Patent Publication No. 6-85275 and Japanese Translated International Patent Application Publication No. 8-506693 disclose technologies relating to the one-layer gate type nonvolatile memory, and Japanese Examined Patent Publication No. 4-80544 discloses technology relating to the two-layer type nonvolatile memory.

FIG. 1 is a plan view of a one-layer gate type nonvolatile memory. The nonvolatile memory shown in FIG. 1 includes a p-type semiconductor substrate (p-substrate) 101, n-type diffusion layers 103, 105, 107, and a control gate 109. It is noted that a space is arranged between the n-type diffusion layers 103 and 105, and a space is arranged between the n-type diffusion layers 105 and 107.

A selection gate 111 made of a polysilicon film is arranged via a gate oxide film (not shown) at a region of the p-substrate 101 including the region between the n-type diffusion layers 103 and 105 to overlap with portions of the n-type diffusion layers 103 and 105. A floating gate 113 made of a polysilicon film is arranged via a silicon oxide film (not shown) to extend over a region of the p-substrate 101 including the region between the n-type diffusion layers 105 and 107 and the control gate 109. It is noted that the floating gate 113 is arranged to partially overlap with portions of the n-type diffusion layers 105 and 107 via a memory gate oxide film.

Upon performing a write operation on this one-layer gate type nonvolatile memory, namely, upon implanting electrons into the floating gate 113, the n-type diffusion layer 103 is set to 0 V, the n-type diffusion layer 107 is set to a predetermined potential Vpp, and the predetermined potential Vpp is applied to the control gate 109 and the selection gate 111. In this way, a transistor realized by the n-type diffusion layers 103, 105, and the selection gate 111 may be turned on, and electrons may be implanted from the n-type diffusion layer 105 via the memory gate oxide film into the floating gate 113.

Upon performing an erase operation on this one-layer gate type nonvolatile memory, namely, upon discharging electrons from the floating gate 113, the control gate 109 is set to 0 V, the n-type diffusion layer 107 is opened, and the predetermined potential Vpp is applied to the n-type diffusion layer 103 and the selection gate 111. In this way, the transistor realized by the n-type diffusion layers 103, 105, and the selection gate 111 may be turned on, and electrons implanted in the floating gate 113 may be withdrawn via the memory gate oxide film into the n-type diffusion layer 105 by a tunneling effect.

FIG. 2 is a cross-sectional view of a two-layer gate type nonvolatile memory. The nonvolatile memory shown in FIG. 2 includes a p-substrate 101 and n-type diffusion layers 117 and 119 that are spaced apart from one another. A floating gate 123 made of a polysilicon film is arranged via a memory gate oxide film 121 at a region of the p-substrate 101 including the region between the n-type diffusion layers 117 and 119 to partially overlap with portions of the n-type diffusion layers 117 and 119. A control gate 127 made of a polysilicon film is arranged on the floating gate 123 via a silicon oxide film 125.

Upon performing a write operation on this two-layer gate type nonvolatile memory, namely, upon implanting electrons into the floating gate 123, the n-type diffusion layer 119 is set to 0 V, the n-type diffusion layer 117 is set to a predetermined potential Vpp, and the predetermined potential Vpp is applied to the control gates 127. In this way, electrons may be implanted from the n-type diffusion layer 119 via the memory gate oxide film into the floating gate 123.

Upon performing an erase operation on this two-layer gate type nonvolatile memory, namely, upon discharging electrons from the floating gate 123, the control gate 127 is set to 0 V, the n-type diffusion layer 117 is opened, and a predetermined potential Vpp is applied to the n-type diffusion layer 119. In this way, electrons implanted into the floating gate 123 may be withdrawn via the memory gate oxide film 121 into the n-type diffusion layer 119.

Japanese Laid-Open Patent Publication No. 2003-168747 and Japanese Laid-Open Patent Publication No. 2004-31920 disclose technologies relating to a nonvolatile memory cell that does not include a control gate.

FIGS. 3A and 3B are diagrams illustrating a nonvolatile memory that does not include a control gate, FIG. 3A being a plan view and FIG. 3B being a cross-sectional view of such a nonvolatile memory. It is noted that in these drawings, components that have identical functions to those shown in FIGS. 1 and 2 are given the same numerical references.

The nonvolatile memory shown in FIGS. 3A and 3B include a p-substrate 101, and n-type diffusion layers 103, 105, and 107. It is noted that a space is arranged between the n-type diffusion layers 103 and 105, and a space is arranged between the n-type diffusion layers 105 and 107.

A selection gate 111 made of a polysilicon film is arranged via a gate oxide film 129 on a region of the p-substrate 101 including the region between the n-type diffusion layers 103 and 105 to partially overlap with portions of the n-type diffusion layers 103 and 105. A floating gate 123 made of a polysilicon film is arranged via a memory gate oxide film 121 at a region of the p-substrate 101 including the region between the n-type diffusion layers 105 and 107 to realize a memory transistor. The floating transistor 123 is arranged to partially overlap with portions of the n-type diffusion layers 105 and 107 via the memory gate oxide film 121.

Upon performing an erase operation on this nonvolatile memory, namely, upon discharging electrons from the floating gate 123, for example, ultra violet rays may be irradiated on the floating transistor 123 so that the floating transistor 123 may be initialized to a zero-charge state.

In this case, the n-type diffusion layer 103 is set to 0 V, the n-type diffusion layer 107 and the selection gate 111 are set to a predetermined potential Vpp such as 7 V, for example. In this way, a selection transistor realized by the n-type diffusion layers 103, 105, and the selection gate 111 may be turned on, and electrons implanted in the floating gate 123 may be withdrawn via the memory gate oxide film 121 into the n-type diffusion layer 105 by a tunneling effect. In this example, the n-type diffusion layer 103 and the floating gate 123 have to adequately overlap with each other. Accordingly, an embedded n-type diffusion layer is at the n-type diffusion layer 105 side arranged below the floating gate 123 as is described in Japanese Laid-Open Patent Publication No. 2003-168747.

Upon performing a write operation on this nonvolatile memory, namely, upon implanting electrons into the floating gate 123, the n-type diffusion layer 107 is set to 0 V, a predetermined potential Vpp such as 4.5 V is applied to the n-type diffusion layer 103, and the selection gate ill is set to a predetermined voltage Von such as 2 V. In this way, the selection transistor realized by the n-type diffusion layers 103, 105, and the selection gate 111 may be set on, and electrons may be implanted from the n-type diffusion layer 105 via the memory gate oxide film 121 into the floating gate 123. In this case, the embedded type n-type diffusion layer has to be present as in the case of performing the erase operation.

Also, it is noted that Japanese Laid-Open Patent Publication No. 2004-31920 discloses arranging a gate oxide film of a MOS (Metal Oxide of Silicon) transistor realizing a peripheral circuit such as a logic circuit to have the same thickness as a gate oxide film of a selection transistor and a gate oxide film of a memory transistor.

When the gate oxide films of a memory transistor that does not include a control gate, a selection transistor, and a peripheral circuit transistor are arranged to have the same thickness as is taught in Japanese Laid-Open Patent Publication No. 2004-31920, when the gate oxide film is arranged to have a thickness at a sub half level of 7.5 nm, for example, the memory gate oxide film of the memory transistor also has a thickness of 7.5 mm. In this case, it has been found through experiment by the inventor of the present invention that a predetermined potential Vpp of approximately 6-7 V or greater is required in order to obtain good writing characteristics.

However, in this case, a voltage of 6-7 V or greater, for example, has to be applied to the peripheral circuit transistor that is configured to apply the predetermined potential Vpp to the memory upon performing a write operation on the memory transistor. This means that an electric field reaching up to approximately 10 MV/cm is applied to the 7.5 nm-thick gate oxide film of the peripheral circuit transistor (referred to as 'peripheral circuit gate oxide film' hereinafter), and thereby, the peripheral circuit gate oxide film may be vulnerable to damage and the yield and reliability of the corresponding semiconductor device may be degraded. Also, according to findings of the inventor of the present invention, the snap-back voltage of a NMOS transistor (N channel MOS transistor) having a 7.5 nm-thick gate oxide film is around 6-7 V, which is substantially equal to the predetermined potential Vpp, and thereby, the peripheral circuit may be vulnerable to damage when a write operation is performed on the memory transistor, and the yield and reliability of the corresponding semiconductor device may be degraded from this aspect as well.

In order to prevent such problems, the gate oxide film thickness of the memory transistor, the selection transistor, and the peripheral circuit transistor may be set to half level of approximately 13.5 nm, for example. However, when the gate oxide film thickness is increased, the write voltage Vpp also has to be increased so that this does not solve the problems arising in the case where the gate oxide film thickness is set to sub half level. When the thickness of the gate oxide film is arranged to be approximately 13.5 nm and the write voltage Vpp is set to approximately 6-7 V, although damage to the peripheral circuit gate oxide film may be prevented, the memory gate oxide film of the memory transistor is also arranged to be 13.5 nm so that good writing characteristics may not be obtained.

Also, the inventor of the present invention has tested and evaluated the semiconductor device disclosed in Japanese Laid-Open Patent Publication No. 2004-31920 including the memory transistor without a control gate, the selection transistor, and the peripheral circuit transistor, and has found that sufficient charge retaining characteristics cannot be obtained in this semiconductor device primarily owing to high impurity concentration within the polysilicon of the floating gate.

DISCLOSURE OF THE INVENTION

The present invention has been conceived in response to one or more of the problems described above, and it provides a semiconductor device that includes a nonvolatile memory cell including a selection transistor and a memory transistor with a floating gate but no control gate, and a peripheral circuit transistor, in which semiconductor device writing on the memory transistor may be adequately performed while protecting the peripheral circuit gate oxide film from damage.

The present invention also provides a semiconductor device that includes a nonvolatile memory cell including a selection transistor and a memory transistor with a floating gate but no control gate, and a peripheral circuit transistor, in which semiconductor device charge retaining characteristics of the memory transistor may be improved.

According to one embodiment of the present invention, a semiconductor device is provided that includes:
a semiconductor substrate;
a nonvolatile memory cell that includes
a memory transistor realized by a MOS transistor including a memory gate oxide film that is arranged on the semiconductor substrate and a floating gate made of polysilicon that is arranged on the memory gate oxide film which floating gate is in an electrically floating state, and
a selection transistor realized by a MOS transistor that is serially connected to the memory transistor, the selection transistor including a selection gate oxide film that is arranged on the semiconductor substrate and a selection gate made of polysilicon that is arranged on the selection gate oxide film; and
a peripheral circuit transistor realized by a MOS transistor including a peripheral circuit gate oxide film that is arranged on the semiconductor substrate and a peripheral circuit gate made of polysilicon that is arranged on the peripheral circuit gate oxide film;
wherein the memory gate oxide film is arranged to be thinner than the peripheral circuit gate oxide film.

In one preferred embodiment of the present invention, the memory transistor and the selection transistor are PMOS transistors.

In another preferred embodiment of the present invention, the selection gate oxide film and the memory gate oxide film are arranged to have the same thickness.

In another preferred embodiment of the present invention, the selection gate oxide film and the peripheral circuit gate oxide film are arranged to have the same thickness.

In another preferred embodiment, the semiconductor device of the present invention further includes:
a capacitor including a lower electrode made of polysilicon that is arranged on the semiconductor substrate via an insulating film, and an upper electrode made of polysilicon that is arranged on the lower electrode via a capacitor insulating film;
wherein the floating gate and the lower electrode are created from the same polysilicon layer, and the capacitor insulating film is arranged on the upper surface and the side surface of the floating gate.

In another preferred embodiment of the present invention, the peripheral circuit gate and the upper electrode are created from the same polysilicon layer.

In another preferred embodiment of the present invention, the selection gate, the floating gate, and the lower electrode are created from the same polysilicon layer.

In another preferred embodiment of the present invention, the selection gate, the peripheral circuit gate, and the upper electrode are created from the same polysilicon layer.

According to another embodiment of the present invention, a semiconductor device is provided that includes a divider resistor circuit that is configured to obtain a voltage output through voltage division and adjust the voltage output through cuffing one or more fuse elements. The divider resistor circuit according to one embodiment includes plural resistance value adjusting resistor elements that are serially connected, plural fuse MOS transistors as the fuse elements that are connected in parallel to the resistance value adjusting resistor elements, the nonvolatile memory cell according to one embodiment of the present invention, and a read circuit for switching on/off the fuse MOS transistors according to the storage state of the nonvolatile memory cell, wherein at least one of the fuse MOS transistors and the read circuit is configured as the peripheral circuit transistor according to one embodiment of the present invention.

According to another embodiment of the present invention, a semiconductor device is provided that includes a voltage detecting circuit including the divider resistor circuit according to one embodiment of the present invention that divides an input voltage and outputs the divided voltage, a reference voltage generating circuit that generates a reference voltage, and a comparator circuit that compares the divided voltage from the divider resistor circuit with the reference voltage from the reference voltage generating circuit.

According to another embodiment of the present invention, a semiconductor device is provided that includes a constant voltage generating circuit including an output driver that controls output of an input voltage, the divider resistor circuit according to one embodiment of the present invention that divides an output voltage and outputs the divided voltage, a reference voltage generating circuit that generates a reference voltage, and a comparator circuit that compares the divided voltage from the divider resistor circuit with the reference voltage from the reference voltage generating circuit and controls an operation of the output driver according to the comparison result.

According to another embodiment of the present invention, a semiconductor device is provided that includes:
a semiconductor substrate;
a nonvolatile memory cell that includes
a memory transistor realized by a MOS transistor including a memory gate oxide film that is arranged on the semiconductor substrate and a floating gate made of polysilicon that is arranged on the memory gate oxide film which floating gate is in an electrically floating state, and
a selection transistor realized by a MOS transistor that is serially connected to the memory transistor, the selection transistor including a selection gate oxide film that is arranged on the semiconductor substrate and a selection gate made of polysilicon that is arranged on the selection gate oxide film; and
a peripheral circuit transistor realized by a MOS transistor including a peripheral circuit gate oxide film that is arranged on the semiconductor substrate and a peripheral circuit gate made of polysilicon that is arranged on the peripheral circuit gate oxide film;
wherein the impurity concentration within the polysilicon of the floating gate is arranged to be lower than the impurity concentration within the polysilicon of the peripheral circuit gate.

In one preferred embodiment of the present invention, the impurity concentration within the polysilicon of the selection gate is equal to the impurity concentration within the polysilicon of the floating gate.

In another preferred embodiment of the present invention, the impurity concentration within the polysilicon of the selection gate is equal to the impurity concentration within the polysilicon of the peripheral circuit gate.

In another preferred embodiment of the present invention, the memory gate oxide film, the selection gate oxide film, and the peripheral circuit gate oxide film are arranged to have the same thickness.

In another preferred embodiment of the present invention, the memory gate oxide film is arranged to be thinner than the peripheral circuit gate oxide film.

In another preferred embodiment of the present invention, the selection gate oxide film and the memory gate oxide film are arranged to have the same thickness.

In another preferred embodiment of the present invention, the selection gate oxide film and the peripheral circuit gate oxide film are arranged to have the same thickness.

In another preferred embodiment of the present invention, the memory transistor and the selection transistor are PMOS transistors.

According to another embodiment of the present invention, a semiconductor device is provided that includes a divider resistor circuit that is configured to obtain a voltage output through voltage division and adjust the voltage output through cuffing one or more fuse elements. The divider resistor circuit according to one embodiment includes plural resistance value adjusting resistor elements that are serially connected, plural fuse MOS transistors as the fuse elements that are connected in parallel to the resistance value adjusting resistor elements, the nonvolatile memory cell according to one embodiment of the present invention, and a read circuit for switching on/off the fuse MOS transistors according to the storage state of the nonvolatile memory cell, wherein at least one of the fuse MOS transistors and the read circuit is configured as the peripheral circuit transistor according to one embodiment of the present invention.

According to another embodiment of the present invention, a semiconductor device is provided that includes a voltage detecting circuit including the divider resistor circuit according to one embodiment of the present invention that divides an input voltage and outputs the divided voltage, a reference voltage generating circuit that generates a reference voltage, and a comparator circuit that compares the divided voltage from the divider resistor circuit with the reference voltage from the reference voltage generating circuit.

According to another embodiment of the present invention, a semiconductor device is provided that includes a constant voltage generating circuit including an output driver that controls output of an input voltage, the divider resistor circuit according to one embodiment of the present invention that divides an output voltage and outputs the divided voltage, a reference voltage generating circuit that generates a reference voltage, and a comparator circuit that compares the divided voltage from the divider resistor circuit with the reference voltage from the reference voltage generating circuit and controls an operation of the output driver according to the comparison result.

BRIEF DESCRIPTION OF THE DRAWINGS

Other objects, features and advantages of the present invention will become more apparent from the following detailed description when read in conjunction with the accompanying drawings.

FIGS. 10A-10C are cross-sectional views illustrating exemplary process steps for fabricating the memory cell, the peripheral circuit transistor, and the capacitor of the third embodiment;

FIGS. 13A-13F are diagrams illustrating a fifth embodiment of the present invention, FIG. 13A being a plan view of a memory cell, FIG. 13B being a plan view of a PMOS transistor as a peripheral circuit transistor, FIG. 13C being a cross-sectional view of the memory cell of FIG. 13A cut across line A-A', FIG. 13D being a cross-sectional view of the PMOS transistor of FIG. 13B cut across line B-B', FIG. 13E being a plan view of a NMOS transistor as another peripheral circuit transistor, and FIG. 13F being a cross-sectional view of the NMOS transistor of FIG. 13E cut across line D-D';

FIGS. 49A-49D are diagrams illustrating a twenty third embodiment of the present invention, FIG. 49A being a plan view of a memory cell, FIG. 49B being a plan view of a peripheral circuit transistor, FIG. 49C being a cross-sectional view of the memory cell of FIG. 49A cut across line A-A', and FIG. 49D being a cross-sectional view of the peripheral circuit transistor of FIG. 49B cut across line B-B';

BEST MODE FOR CARRYING OUT THE INVENTION

In the following, preferred embodiments of the present invention are described with reference to the accompanying drawings.

Figure 1:
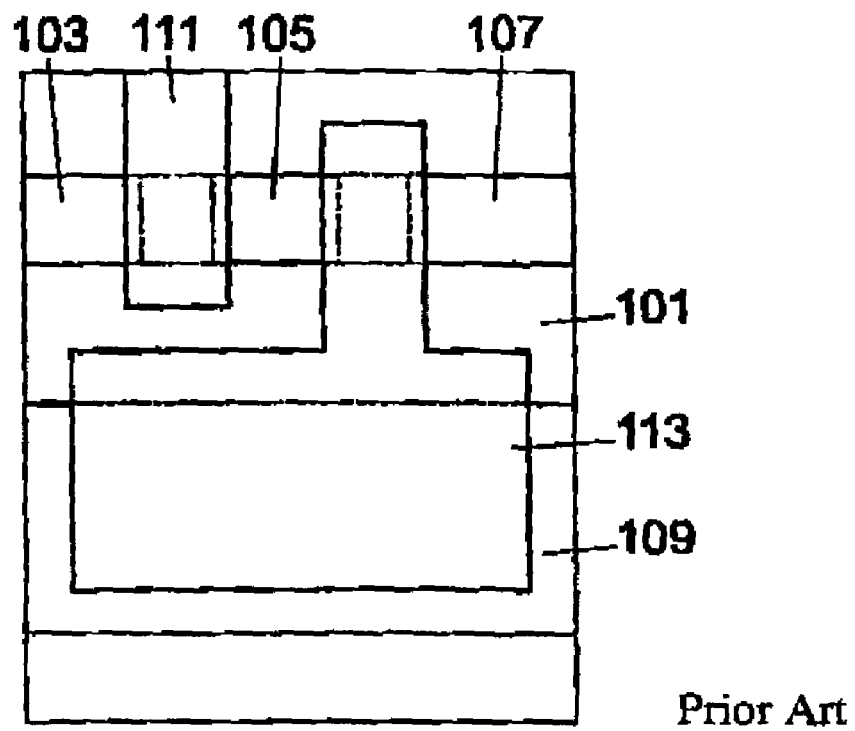
FIG. 1 is a plan view of a one-layer gate type nonvolatile memory.
Figure 2:
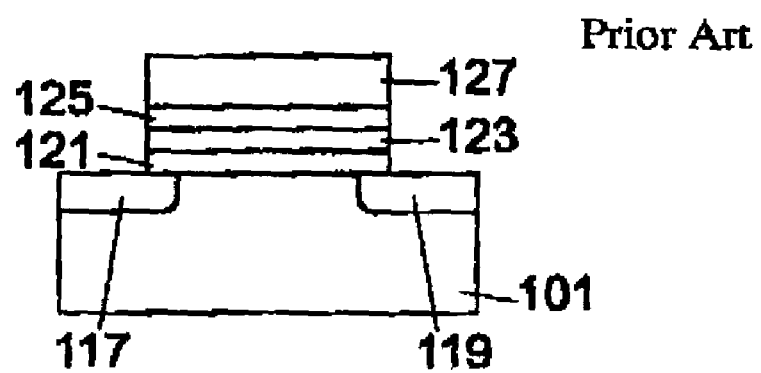
FIG. 2 is a cross-sectional view of a two-layer gate type nonvolatile memory.
Figure 3A:
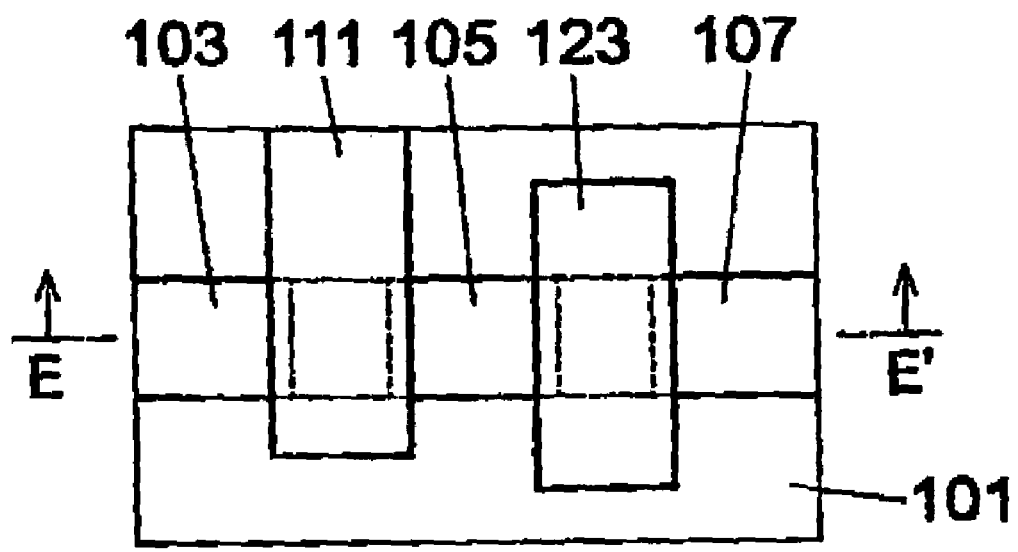
FIGS. 3A and 3B are diagrams illustrating a nonvolatile memory that does not include a control gate, FIG. 3A being a plan view of the nonvolatile memory and FIG. 3B being a cross-sectional view cut across line E-E' of FIG. 3A.
Figure 3B:
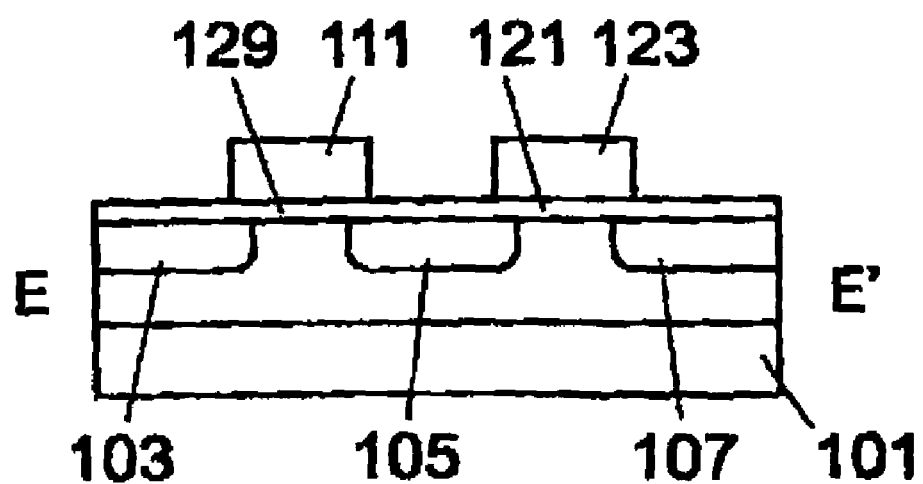
Figure 4A:
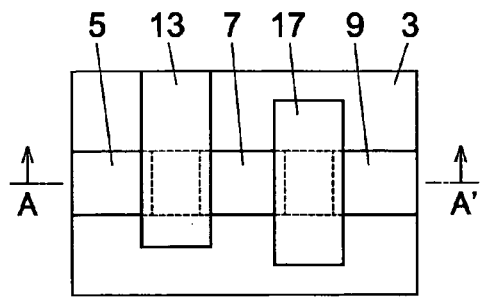
FIGS. 4A-4D are diagrams illustrating a first embodiment of the present invention, FIG. 4A being a plan view of a memory cell, FIG. 4B being a plan view of a peripheral circuit transistor, FIG. 4C being a cross-sectional view of the memory cell of FIG. 4A cut across line A-A', and FIG. 4D being a cross-sectional view of the peripheral transistor of FIG. 4B cut across line B-B'.
Figure 4B:
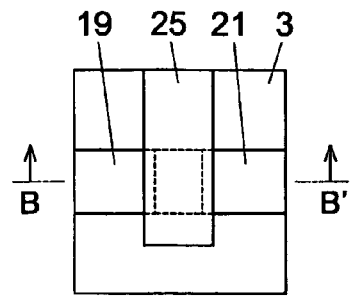
Figure 4C:
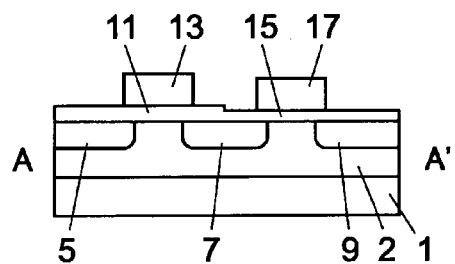
Figure 4D:
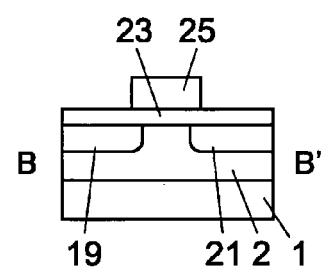

FIGS. 4A through 4D are diagrams illustrating a first embodiment of the present invention. FIG. 4A is a plan view of a memory cell, FIG. 4B is a plan view of a peripheral circuit transistor, FIG. 4C is a cross-sectional view of the memory cell of FIG. 4A cut across line A-A', and FIG. 4D is a cross-sectional view of the peripheral circuit of FIG. 4B cut across line B-B'.

As is shown in these drawings, an n-well 2 is arranged at a predetermined region of a p-substrate 1. A field oxide film 3 for realizing device isolation is arranged on the surface of the p-substrate 1, the field oxide film 3 having a thickness of 450-700 nm, for example (500 nm in the present example). P-type diffusion layers 5, 7, and 9 are arranged within the n-well 2 corresponding to a region surrounded by the field oxide film 3. It is noted that a space is arranged between the p-type diffusion layers 5 and 7, and a space is arranged between the p-type diffusion layers 7 and 9.

A selection gate oxide film 11 is arranged at a region of the p-substrate 1 including the region between the p-type diffusion layers 5 and 7, the selection gate oxide film 11 having a thickness of 10.0-15.0 nm, for example (13.5 nm in the present example). A selection gate 13 made of a polysilicon film having a thickness of 250-450 nm, for example (350 nm in the present example), is arranged on the selection gate oxide film 11 to partially overlap with portions of the p-type diffusion layers 5 and 7. It is noted that the p-type diffusion layers 5, 7, the selection oxide film 11, and the selection gate 13 realize a selection transistor.

A memory gate oxide film 15 is arranged on a surface of the p-substrate 1 including the region between the p-type diffusion layers 7 and 9, the memory gate oxide film 15 having a thickness of 6.0-10.0 nm, for example (7.5 nm in the present example). A floating gate 17 made of a polysilicon film having a thickness of 250-450 nm, for example (350 nm in the present example), is arranged on the memory gate oxide film 15 to partially overlap with the p-type diffusion layers 7 and 9. It is noted that the p-type diffusion layers 7, 9, the memory gate oxide film 15, and the floating gate 17 realize a memory transistor.

The selection transistor and the memory transistor realize a memory cell.

Also, p-type diffusion layers 19 and 21 are arranged within another n-well 2 corresponding to another region surrounded by the field oxide film 3 that is different from the region of the memory cell. It is noted that a space is arranged between the p-type diffusion layers 19 and 21.

A peripheral circuit gate oxide film 23 is arranged on a region of the p-substrate 1 including the region between the p-type diffusion layers 19 and 21, the peripheral circuit gate oxide film 23 having a thickness of 10.0-15.0 nm, for example (13.5 nm in the present example). A peripheral circuit gate 25 made of a polysilicon film having a thickness of 250-450 nm, for example (350 nm in the present example), is arranged on the peripheral circuit gate oxide film 23 to partially overlap with portions of the p-type diffusion layers 19 and 21. It is noted that the p-type diffusion layers 19, 21, the peripheral circuit gate oxide film 23, and the peripheral circuit gate 25 realize a peripheral circuit transistor.

Figure 5:
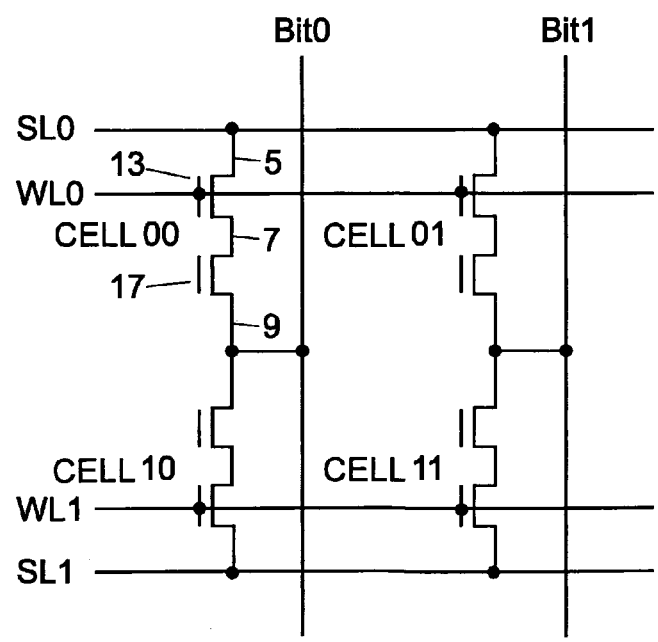
FIG. 5 is a circuit diagram showing an exemplary matrix arrangement of the memory cells of the first embodiment.

FIG. 5 is a circuit diagram illustrating an exemplary matrix arrangement of the memory cells of the first embodiment.

In the illustrated arrangement, the memory cells are arranged into a matrix. Specifically, cells i0, i1, and the selection gate 13 of point '•' that are aligned in a horizontal direction (word line WL direction) are electrically connected to a common word line WLi. Also, p-type diffusion layers 5 are electrically connected to a common source line SLi. The cells 0$i$, 1$i$, and the p-type diffusion layer 9 of point '•' that are aligned in a vertical direction (bit line Bit direction) are electrically connected to a common bit line Biti. It is noted that in the above descriptions, i denotes 0 or a natural number.

In the present embodiment, an erase operation is performed through ultraviolet ray irradiation so that all cells may be erased at once.

In a write operation, to perform writing only on cell 00, for example, the word line WL0 and the bit line Bit0 that are connected to the cell 00 subject to the writing operation are biased to a predetermined potential −Vpp, and the other word lines WLi, the other bit lines Biti, and the source lines SLi are biased to 0 V. In this way, electrons may be implanted into the floating gate 17 of the cell 00 via the memory gate oxide film so that writing may be performed on the cell 00.

Figure 6A:
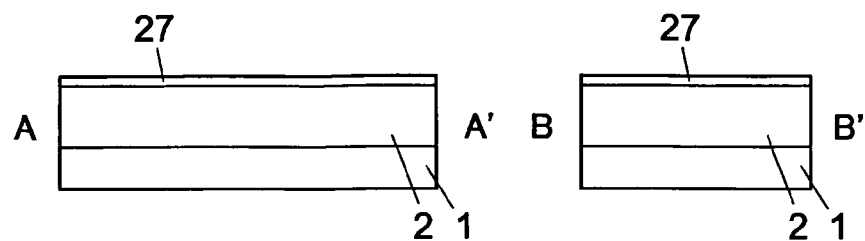
FIGS. 6A-6C are cross-sectional views illustrating exemplary process steps for fabricating the memory cell and the peripheral circuit transistor of the first embodiment.
Figure 6B:
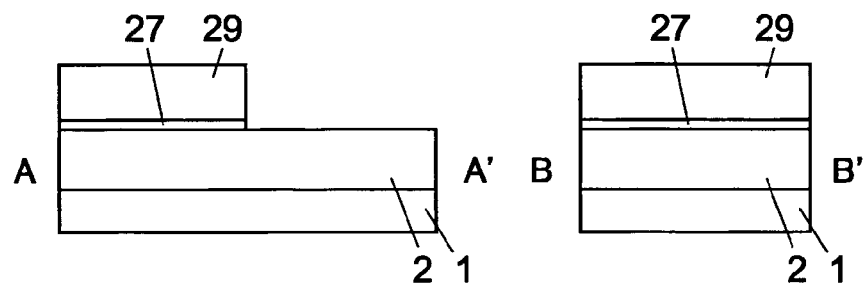
Figure 6C:
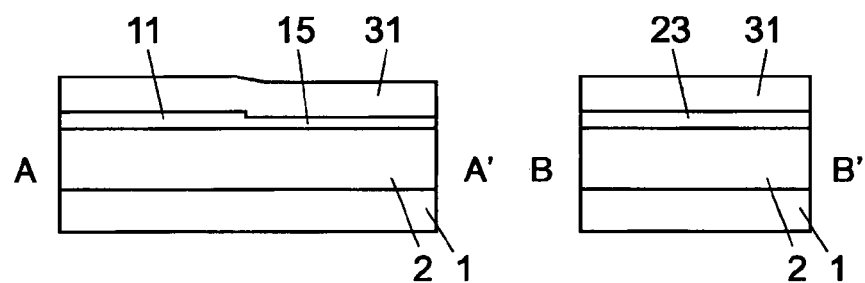

FIGS. 6A through 6C are cross sectional views illustrating exemplary process steps for fabricating the memory cell and the peripheral circuit transistor of the first embodiment. It is noted that the cross sectional views of FIGS. 6A through 6C, correspond to the cross-sectional views cut across lines A-A' and B-B' of FIGS. 4C and 4D. In the following, an exemplary method of fabricating the memory cell and the peripheral circuit transistor of the first embodiment is described with reference to FIGS. 4A-4D, and FIGS. 6A-6C.

(1) After creating the n-well 2 at the p-substrate 1, the field oxide film 3 is arranged on the p-substrate 1 through a conventional LOCOS (local oxidation of silicon) process to realize device isolation (see FIGS. 4A and 4B). A sacrificial oxide film 27 having a thickness of 6-16 nm, for example, is arranged on the surface of an active region defined by the field oxide film 3, and channel doping is performed (see FIG. 6A).

(2) A resist pattern 29 is arranged on the sacrificial oxide film 27 which resist pattern covers the selection transistor formation region and the peripheral circuit transistor formation region and has an opening portion at the memory transistor formation region. The resist pattern 29 is used as a mask to selectively remove the sacrificial oxide film 27 arranged on the memory transistor region (see FIG. 6B).

(3) After removing the resist pattern 29, a thermal oxidation process is performed to generate a memory gate oxide film 15 having a thickness of 6-10 nm, for example, on the surface of the n-well 2 at the memory transistor region. In this process, the sacrificial oxide film 27 at the selection transistor region and the peripheral circuit transistor region grows to have a thickness of 12-20 nm, for example, to thereby become the selection gate oxide film 11 and the peripheral circuit gate oxide film 23, respectively. Then, a polysilicon film 31 having a thickness of 250-450 nm, for example, is arranged on the gate oxide films 11, 15, and 23 (see FIG. 6C).

(4) By performing photomechanical processing and etching on the polysilicon film 31, the selection gate 13 is created on the selection gate oxide film 11 and the field oxide film 3 at the selection transistor region, the floating gate 17 is created on the memory gate oxide film 15 and the field oxide film 3 at the memory transistor region, and the peripheral circuit gate 25 is created on the peripheral circuit gate oxide film 23 and the field oxide film 3 at the peripheral circuit transistor region. Then, boron is implanted through an ion implantation process using the selection gate 13, the floating gate 17, and the peripheral circuit gate 25 as masks to thereby create the p-type diffusion layers 5, 7, 9, 19, and 21 (see FIGS. 4A-4D).

Figure 7A:
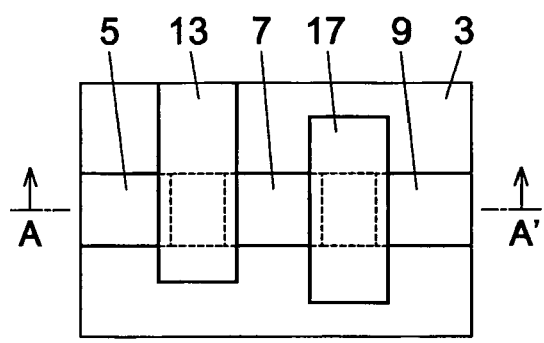
FIGS. 7A-7D are diagrams illustrating a second embodiment of the present invention, FIG. 7A being a plan view of a memory cell, FIG. 7B being a plan view of a peripheral circuit transistor, FIG. 7C being a cross-sectional view of the memory cell of FIG. 7A cut across line A-A', and FIG. 7D being a cross-sectional view of the peripheral circuit transistor of FIG. 7B cut across line B-B'.
Figure 7B:
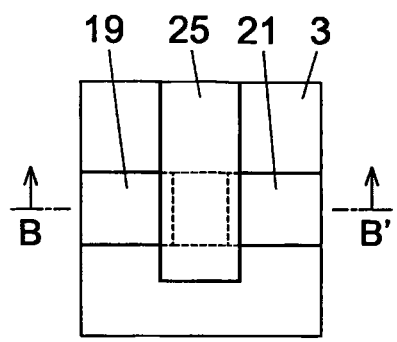
Figure 7C:
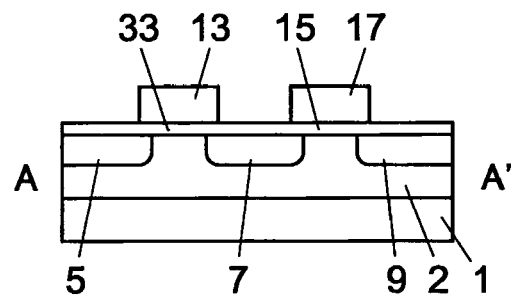
Figure 7D:
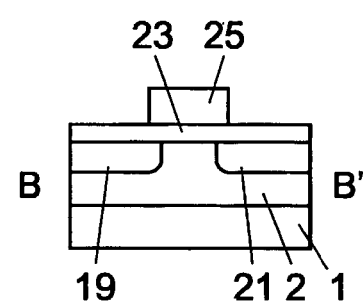

FIGS. 7A through 7D are diagrams illustrating a second embodiment of the present invention. FIG. 7A is a plan view of a memory cell according to the second embodiment, FIG. 7B is a plan view of a peripheral circuit transistor according to the second embodiment, FIG. 7C is a cross-sectional view of the memory cell of FIG. 7A cut across line A-A', and FIG. 7D is a cross-sectional view of the peripheral circuit transistor of FIG. 7B cut across line B-B'. It is noted that in these drawings, components that are identical to those shown in FIGS. 4A through 4D are given the same numerical references, and their descriptions are omitted.

The present embodiment differs from the first embodiment shown in FIGS. 4A through 4D in that a selection gate oxide film 33 of a selection transistor is arranged to have the same film thickness as that of a memory gate oxide film 15, the thickness being 6-10 nm, for example (7.5 nm in the present example). In the present embodiment, the selection gate oxide film 33 and the memory gate oxide film 15 are created simultaneously.

Figure 8A:
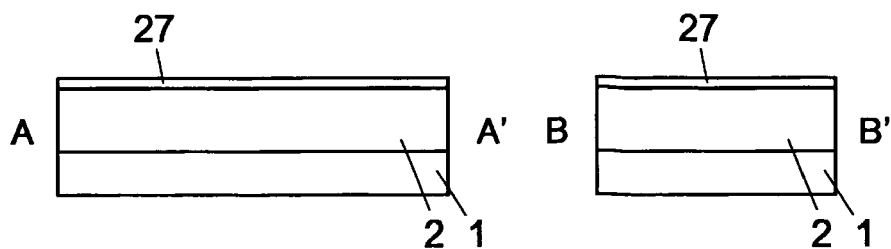
FIGS. 8A-8C are cross-sectional views illustrating exemplary process steps for fabricating the memory cell and the peripheral circuit transistor of the second embodiment.
Figure 8B:
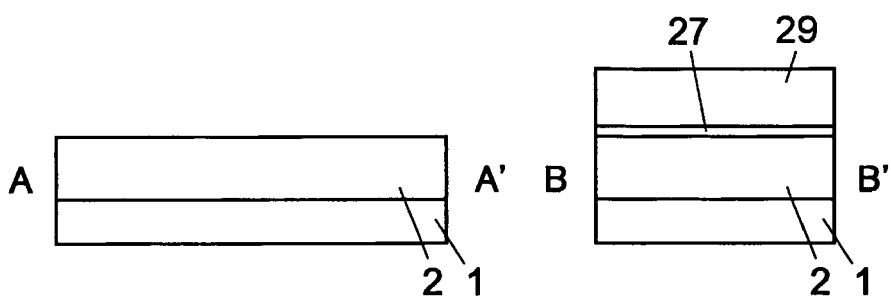
Figure 8C:
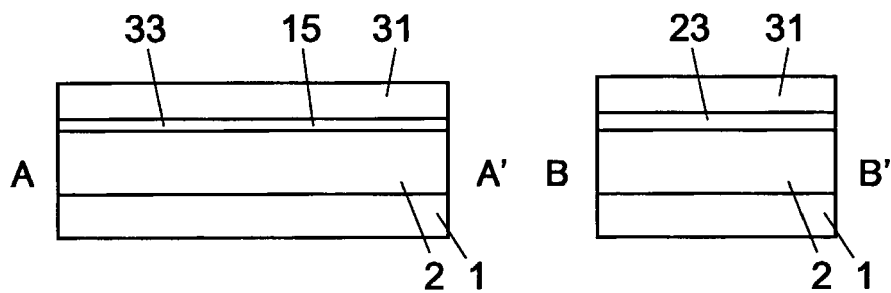

FIGS. 8A through 8C are cross-sectional views illustrating exemplary process steps for fabricating the memory cell and the peripheral circuit transistor according to the second embodiment. It is noted that the cross-sectional views shown in FIGS. 8A through 8C correspond to the cross-sectional views cut across lines A-A' and B-B' shown in FIGS. 7C and 7D. In the following, an exemplary method for fabricating the memory cell and the peripheral circuit transistor of the second embodiment is described with reference to FIGS. 7A-7D and FIGS. 8A-8C.

(1) An n-well 2, a field oxide film 3 (see FIGS. 7C and 7D), and a sacrificial oxide film 27 are arranged on a p-substrate 1 through a process similar to the process step (1) as is described above with reference to FIG. 6A, after which channel doping is performed (see FIG. 8A).

(2) A resist pattern 29 is arranged on the sacrificial oxide film 27 which resist pattern 29 covers a peripheral circuit transistor formation region and has opening portions at a selection transistor formation region and a memory transistor formation region. The resist pattern 29 is used as a mask to selectively remove the sacrificial oxide film 27 arranged at the selection transistor formation region and the memory transistor formation region (see FIG. 8B).

(3) After selectively removing the resist pattern 29, a thermal oxidation process is performed so that a selection gate oxide film 33 and a memory gate oxide film 15 having a thickness of 6-10 nm, for example, are created on the surface of the n-well 2 at the selection transistor formation region and the memory transistor formation region. In this process, the sacrificial oxide film 27 at the peripheral circuit transistor region grows in thickness to become a peripheral circuit gate oxide film 23. Then, a polysilicon film 31 is arranged on the gate oxide films 15, 23, and 33 (see FIG. 8C).

(4) A selection gate 13, a floating gate 17, and a peripheral circuit gate 25 are created from the polysilicon film 31 and p-type diffusion layers 5, 7, 9, 19, and 21 are created through ion implantation through a process similar to the process step (4) as is described above with reference to FIGS. 4A-4D (see FIGS. 7A-7D).

Figure 9A:
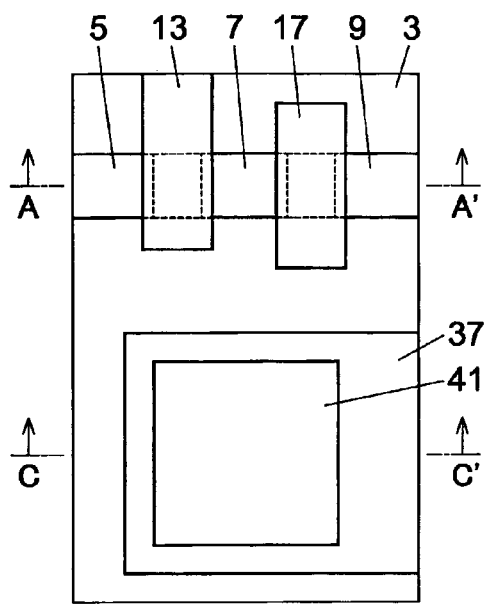
FIGS. 9A-9E are diagrams illustrating a third embodiment of the present invention, FIG. 9A being a plan view of a memory cell and a capacitor, FIG. 9B being a plan view of a peripheral circuit transistor, FIG. 9C being a cross-sectional view of the memory cell of FIG. 9A cut across line A-A', FIG. 9D being a cross-sectional view of the peripheral circuit transistor of FIG. 9B cut across line B-B', and FIG. 9E being a cross-sectional view of the capacitor of FIG. 9A cut across line C-C'.
Figure 9B:
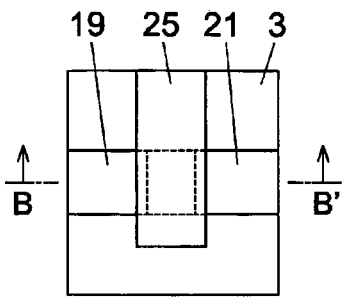
Figure 9C:
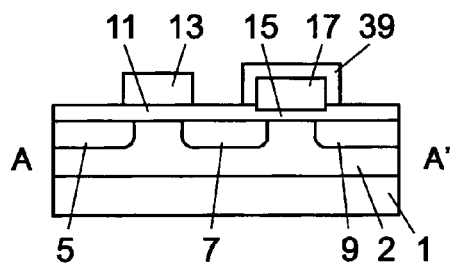
Figure 9D:
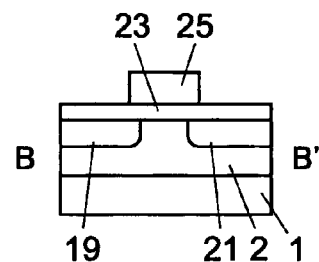
Figure 9E:
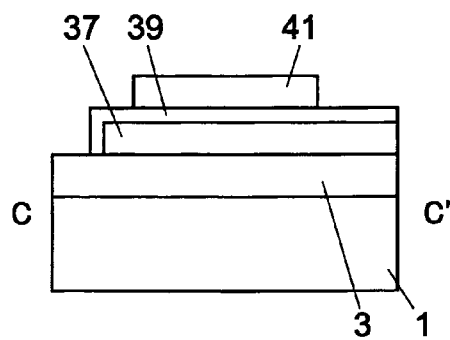

FIGS. 9A through 9E are diagrams illustrating a third embodiment of the present invention. FIG. 9A is a plan view of a memory cell and a capacitor, FIG. 9B is a plan view of a peripheral circuit transistor, FIG. 9C is a cross-sectional view of the memory cell of FIG. 9A cut across line A-A', FIG. 9D is a cross-sectional view of the peripheral circuit transistor of FIG. 9B cut across line B-B', and FIG. 9E is a cross-sectional view of the capacitor of FIG. 9A cut across line C-C'. It is noted that in these drawings, components that are identical to those shown in FIGS. 4A-4D are given the same numerical references, and their descriptions are omitted.

According to the present embodiment, an n-well 2 is arranged at a predetermined region of a p-substrate 1, and a field oxide film 3 is arranged on the surface of the p-substrate 1.

A selection transistor realized by p-type diffusion layers 5 and 7, a selection gate oxide film 11, and a selection gate 13 is arranged at a selection transistor region.

A memory transistor realized by p-type diffusion layers 7 and 9, a memory gate oxide film 15, and a floating gate 17 is arranged at a memory transistor region.

A peripheral circuit transistor realized by p-type diffusion layers 19 and 21, a peripheral circuit gate oxide film 23, and a peripheral circuit gate 25 is arranged at a peripheral circuit transistor region.

A lower electrode 37 having a thickness that is equal to the thickness of the floating gate 17 is arranged on the field oxide film 3. A capacitor insulating film 39 made of a silicon film having a thickness of 15-40 nm, for example (20 nm in the present example), is arranged on the surface of the lower electrode 37 (see FIGS. 6C and 6E). An upper electrode 41 made of a polysilicon film having a thickness equal to the thickness of the selection gate 13 and the peripheral circuit gate 25 is arranged on the capacitor insulating film 39. It is noted that the lower electrode 37, the capacitor insulating film 39, and the upper electrode 41 realize the capacitor of the present embodiment.

The capacitor insulating film 39 is also arranged on the surface of the floating gate 17.

FIGS. 10A through 10C are cross-sectional views illustrating exemplary process steps for fabricating the memory cell, the peripheral circuit transistor and the capacitor of the third embodiment. It is noted that the cross-sectional views shown in FIGS. 10A-10C correspond to the cross-sectional views cut across the lines A-A', B-B', and C-C' shown in FIGS. 9C-9E. In the following, an exemplary method of fabricating the memory cell, the peripheral circuit transistor, and the capacitor of the third embodiment is described with reference to FIGS. 9A-9E and FIGS. 10A-10C.

(1) After creating the n-well 2 at the p-substrate 1, the field oxide film 3 is arranged on the p-substrate 1 through a conventional LOCOS (local oxidation of silicon) process to realize device isolation (see FIGS. 9A and 9B). A sacrificial oxide film having a thickness of 10-20 nm, for example, is arranged on the surface of an active region defined by the field oxide film 3, and channel doping is performed. After removing the sacrificial oxide film, the memory gate oxide film 15 is arranged on the surface of the p-substrate 1. Then, a polysilicon film having a thickness of 250-450 nm, for example is arranged on the surface of the p-substrate 1, and patterning is performed on the polysilicon film to create the floating gate 17 on the memory gate oxide film 15 at the memory transistor formation region and the lower electrode 37 on the field oxide film 3 at the capacitor formation region (see FIG. 10A).

(2) A thermal oxidation process is performed to create the capacitor insulating film 39 made of a silicon oxide film having a thickness of 15-40 nm, for example, on the surfaces of the lower electrode 37 and the floating gate 17. In this process, the memory gate oxide film 15 at the selection transistor region and the peripheral circuit transistor region grows to have a thickness of 12-50 nm, for example, to become the selection gate oxide film 11 and the peripheral circuit gate oxide film 23 (see FIG. 10B).

(3) A polysilicon film 31 having a thickness of 250-450 nm, for example, is arranged on the surface of the p-substrate 1 (see FIG. 10C).

(4) By performing photomechanical processing and etching on the polysilicon film 31, the selection gate 13 is created on the selection gate oxide film 11, the peripheral circuit gate 25 is created on the peripheral circuit gate oxide film 23, and the upper electrode 41 is created on the capacitor insulating film 39 arranged on the lower electrode 37. Then, boron is implanted through an ion implantation process using the selection gate 13, the floating gate 17, and the peripheral circuit gate 25 as masks to thereby create the p-type diffusion layers 5, 7, 9, 19, and 21 (see FIGS. 9A-9E).

Figure 11A:
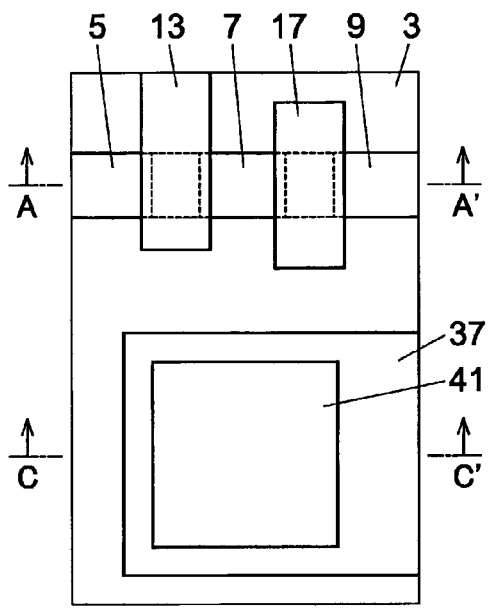
FIGS. 11A-11E are diagrams illustrating a fourth embodiment of the present invention, FIG. 11A being a plan view of a memory cell and a capacitor, FIG. 11B being a plan view of a peripheral circuit transistor, FIG. 11C being a cross-sectional view of the memory cell of FIG. 11A cut across line A-A', FIG. 11D being a cross-sectional view of the peripheral circuit transistor of FIG. 11B cut across line B-B', and FIG. 11E being a cross-sectional view of the capacitor of FIG. 11A cut across line C-C'.
Figure 11B:
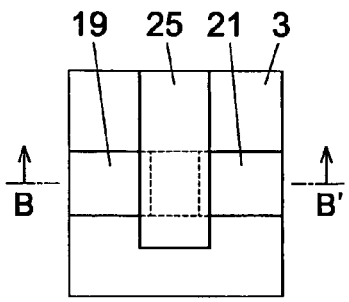
Figure 11C:
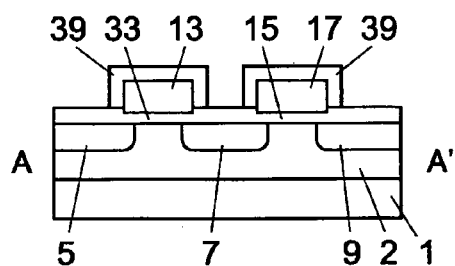
Figure 11D:
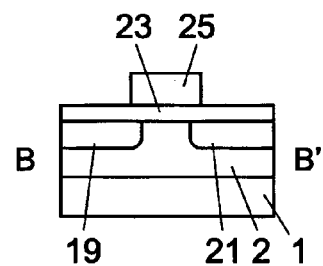
Figure 11E:
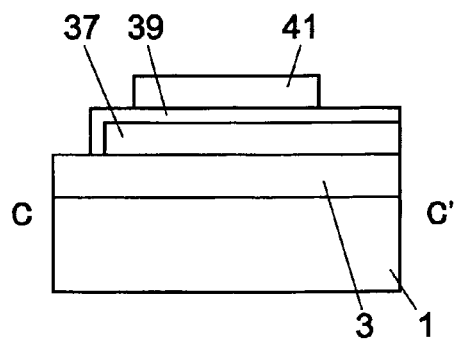

FIGS. 11A-11E are diagrams illustrating a fourth embodiment of the present invention. FIG. 11A is a plan view of a memory cell and a capacitor according to the fourth embodiment, FIG. 11B is a plan view of a peripheral circuit transistor according to the fourth embodiment, FIG. 11C is a cross-sectional view of the memory cell of FIG. 11A cut across line A-A', FIG. 11D is a cross-sectional view of the peripheral circuit transistor of FIG. 11B cut across line B-B', and FIG. 11E is a cross-sectional view of the capacitor of FIG. 11A cut across line C-C'. It is noted that in these drawings, components that are identical to those shown in FIGS. 4A-4D and FIGS. 9A-9E are given the same numerical references, and their descriptions are omitted.

The present embodiment differs from the third embodiment as is described above in that a selection gate oxide film 33 of a selection transistor is arranged to have the same thickness as that of a memory gate oxide film 15 which thickness may be 6-10 nm, for example (7.5 nm in the present example). Also, in the present embodiment, a capacitor insulating film 39 is arranged on the surface of a selection gate 13. Further, the selection gate oxide film 33 and the memory gate oxide film 15 are created simultaneously.

Figure 12A:
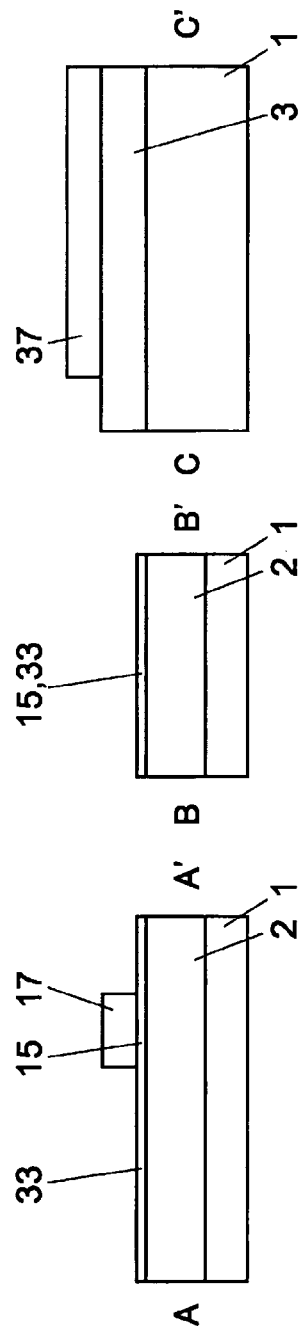
FIGS. 12A-12C are cross-sectional views illustrating exemplary process steps for fabricating the memory cell, the peripheral circuit transistor, and the capacitor of the fourth embodiment.
Figure 12B:
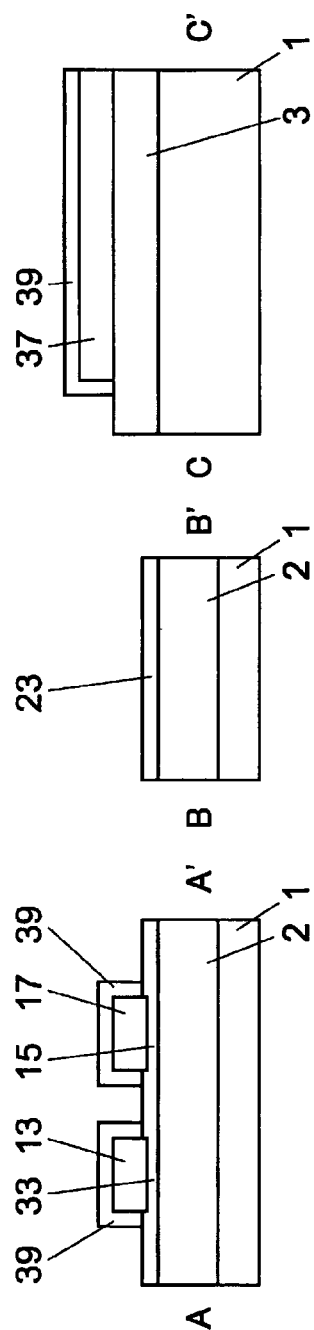
Figure 12C:
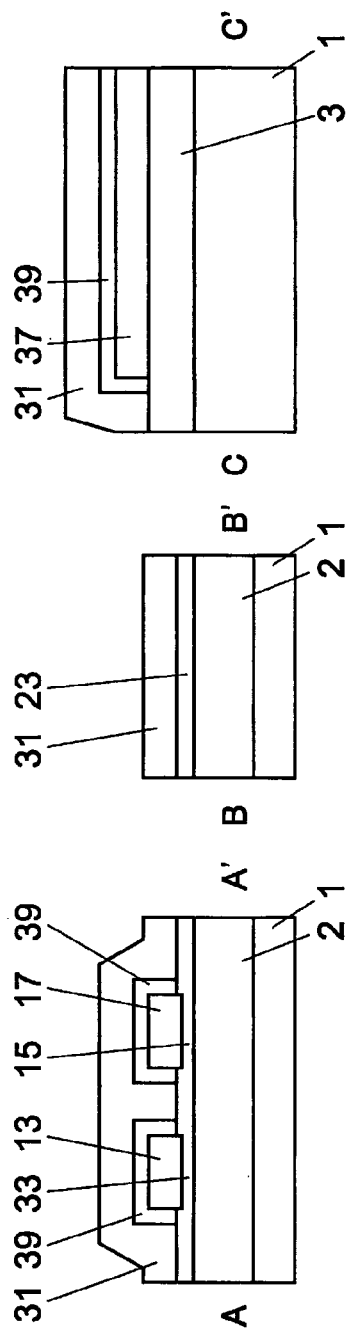

FIGS. 12A-12C are cross-sectional views illustrating exemplary process steps for fabricating the memory cell, the peripheral circuit transistor, and the capacitor of the fourth embodiment. It is noted that the cross-sectional views shown in FIGS. 12A-12C correspond to the cross-sectional views cut across the lines A-A', B-B', and C-C' shown in FIGS. 11C-11E. In the following, an exemplary method for fabricating the memory cell, the peripheral circuit transistor, and the capacitor of the fourth embodiment is described with reference to FIGS. 11A-11E and FIGS. 12A-12C.

(1) After creating an n-well 2 at a p-substrate 1, a field oxide film 3 is arranged on the p-substrate 1 through a conventional LOCOS (local oxidation of silicon) process to realize device isolation (see FIGS. 11A and 11B). A sacrificial oxide film having a thickness of 10-20 nm, for example, is arranged on the surface of an active region defined by the field oxide film 3, and channel doping is performed. After removing the sacrificial oxide film, the memory gate oxide film 15 and a silicon oxide film as the selection gate oxide film 33 are arranged on the surface of the p-substrate 1. Then, a polysilicon film having a thickness of 250-450 nm, for example, is arranged on the surface of the p-substrate 1, and patterning is performed on the polysilicon film to create a floating gate 17 on the memory gate oxide film 15 at a memory transistor formation region, a selection gate 13 on the selection gate oxide film 33 at a selection transistor formation region, and a lower electrode 37 on the field oxide film 3 at a capacitor formation region (see FIG. 12A).

(2) A thermal oxidation process is performed to create the capacitor insulating film 39 made of a silicon oxide film having a thickness of 15-40 nm, for example, on the surfaces of the lower electrode 37, the selection gate 13, and the floating gate 17. In this process, the silicon oxide film at a peripheral circuit transistor region grows to have a thickness of 12-50 nm, for example, to become a peripheral circuit gate oxide film 23 (see FIG. 12B).

(3) A polysilicon film 31 having a thickness of 250-450 nm, for example, is arranged on the surface of the p-substrate 1 (see FIG. 12C).

(4) By performing photomechanical processing and etching on the polysilicon film 31, a peripheral circuit gate 25 is created on the peripheral circuit gate oxide film 23, and an upper electrode 41 is created on the capacitor insulating film 39 arranged on the lower electrode 37. Then, boron is implanted through an ion implantation process using the selection gate 13, the floating gate 17, and the peripheral circuit gate 25 as masks to thereby create p-type diffusion layers 5, 7, 9, 19, and 21 (see FIGS. 11A-11E).

It is noted that in the above-illustrated embodiments, a PMOS transistor is used as the peripheral circuit transistor. However, the present invention is not limited to such an embodiment, and for example, an NMOS transistor may be used as a peripheral circuit transistor, or both an NMOS transistor and a PMOS transistor may be used as peripheral circuit transistors.

FIGS. 13A-13F illustrate a fifth embodiment of the present invention in which both a NMOS transistor and a PMOS transistor are used as peripheral circuit transistors. It is noted that in these drawings, components that are identical to those shown in FIGS. 4A-4D are given that same numerical references, and their descriptions are omitted.

In the present embodiment, an n-well 2 and a p-well 43 are arranged at predetermined regions of a p-substrate 1, and a field oxide film 3 is arranged on the surface of the p-substrate 1.

A selection transistor realized by p-type diffusion layers 5 and 7, a selection gate oxide film 11, and a selection gate 13 is arranged at a selection transistor region.

A memory transistor realized by p-type diffusion layers 7 and 9, a memory gate oxide film 15, and a floating gate 17 is arranged at a memory transistor region.

A PMOS peripheral circuit transistor realized by p-type diffusion layers 19 and 21, a peripheral circuit gate oxide film 23, and a peripheral circuit gate 25 is arranged at a PMOS peripheral circuit transistor region.

N-type diffusion layers 45 and 47 are arranged within the region of the p-well 43 surrounded by the field oxide film 3. It is noted that a space is arranged between the n-type diffusion layers 45 and 47.

A peripheral circuit gate oxide film 49 having a thickness of 10-50 nm, for example (13.5 nm in the present example), is arranged on a region of the p-well 43 including the region between the n-type diffusion layers 45 and 47. A peripheral circuit gate 50 made of a polysilicon film having a thickness of 250-450 nm, for example (350 nm in the present example), is arranged on the peripheral circuit gate oxide film 49 to partially overlap with portions of the n-type diffusion layers 45 and 47. The n-type diffusion layers 45, 47, the peripheral circuit gate oxide film 49, and the peripheral circuit gate 50 realize a NMOS peripheral circuit transistor.

It is noted that a structure in which both a PMOS transistor and a NMOS transistor are arranged on the same p-substrate 1 may be realized through a conventional CMOS (Complimentary MOS) process.

Figure 14:
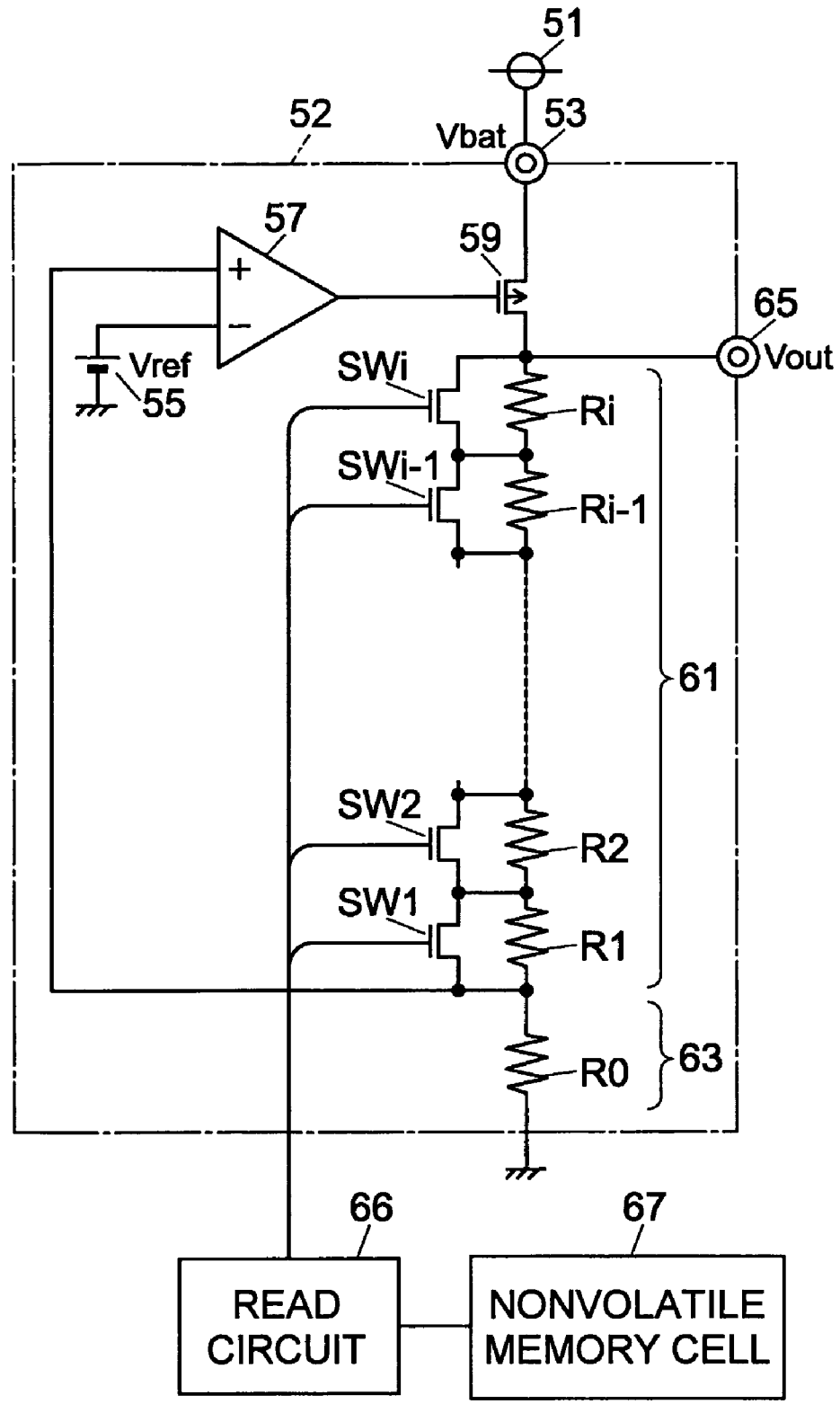
FIG. 14 is a circuit diagram illustrating a constant voltage generating circuit including a divider resistor circuit according to an embodiment of the present invention.

FIG. 14 is a circuit diagram illustrating a constant voltage generating circuit including a divider resistor circuit according to an embodiment of the present invention.

The constant voltage generating circuit 52 shown in FIG. 14 is configured to regulate power supplied from a direct current power source 51. The constant voltage generating circuit 52 includes an input terminal (Vbat) 53 that is connected to the direct current power source 51, a reference voltage generating circuit (Vref) 55, a computing amplifier 57, a p-channel type MOS transistor (referred to as 'PMOS' hereinafter) 59 as an output driver, divider resistors 61, 63, and an output terminal (Vout) 65.

The divider resistor 63 includes a resistor element R0. The divider resistor 61 includes plural resistance value adjusting resistor elements R1, R2, •Ri-1, and Ri that are serially connected. Fuse MOS transistors SW1, SW2, •SWi-1, and SWi are connected in parallel with the resistance value adjusting resistor elements R1, R2, •Ri-1, and Ri, respectively.

The constant voltage generating circuit 52 of the present embodiment also includes a read circuit 66 for switching on/off the fuse MOS transistors SW1, SW2, •SWi-1, and SWi, and a nonvolatile memory cell 67. The output of the read circuit 66 is connected to the corresponding gates of the fuse MOS transistors SW1, SW2, •SWi-1, and SWi. The nonvolatile memory cell 67 includes plural memory cells that store information pertaining to switching on/off the fuse MOS transistors SW1, SW2, •SWi-1, and SWi. The read circuit 66 switches on/off the fuse MOS transistors SW1, SW2, •SWi-1, and SWi according to the storage state of the nonvolatile memory cell 67.

In the computing amplifier 57 of the constant voltage generating circuit 52, an output terminal of the computing amplifier 57 is connected to a gate electrode of the PMOS 59. A reference voltage Vref from the reference voltage generating circuit 55 is applied to an inverting input terminal of the computing amplifier 57. A voltage resulting from dividing the output voltage by the resistors 61 and 63 is applied to the non-inverting input terminal of the computing amplifier 57. The divided voltage of the resistors 61 and 63 is controlled to be equal to the reference voltage Vref.

Figure 15:
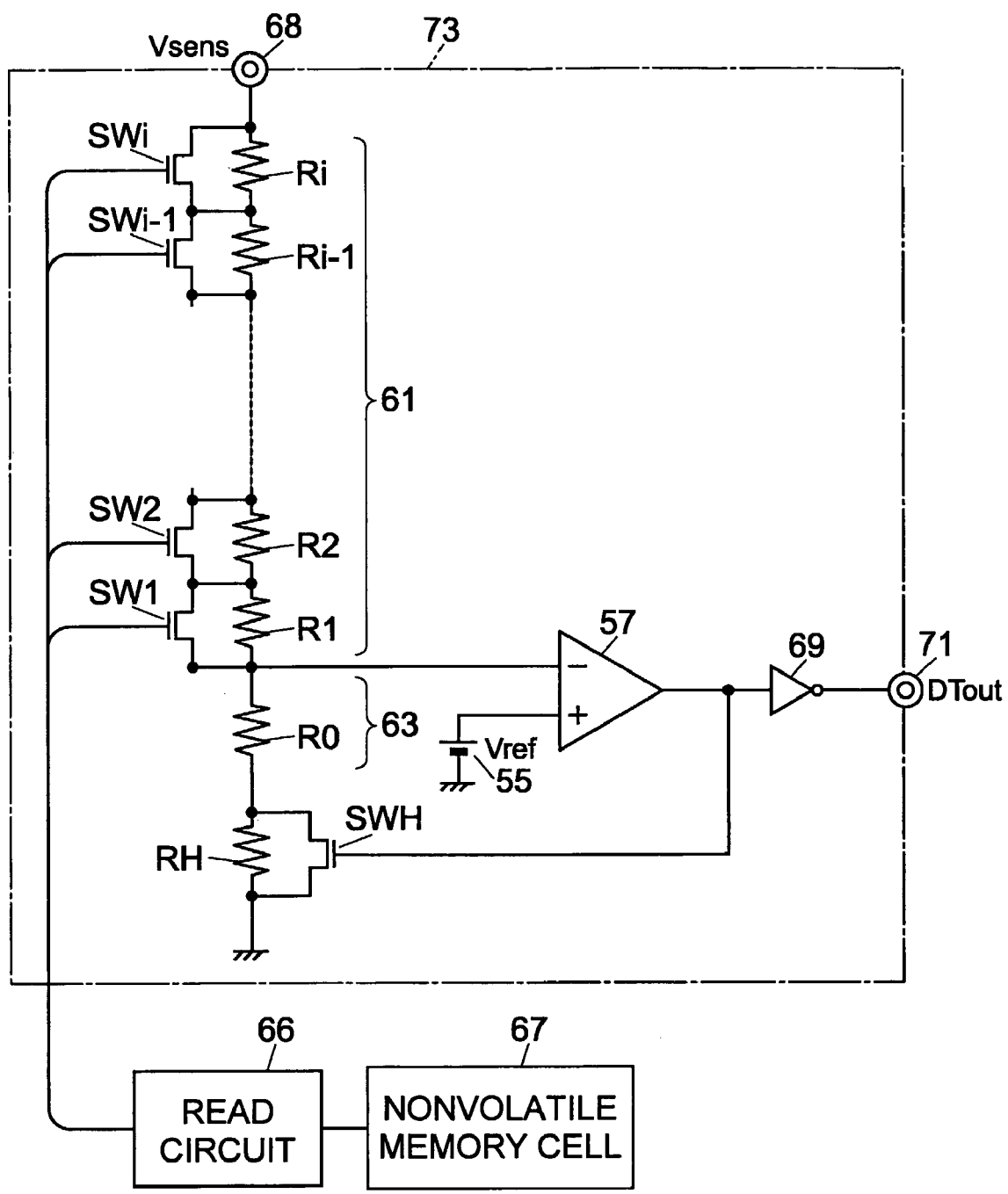
FIG. 15 is a circuit diagram illustrating a voltage detecting circuit including a divider resistor circuit according to an embodiment of the present invention.

FIG. 15 is a circuit diagram illustrating a voltage detecting circuit including a divider resistor circuit according to an embodiment of the present invention. It is noted that in this drawing, components that are identical to those shown in FIG. 14 are given the same numerical references.

In the voltage detecting circuit 73 shown in FIG. 15, divider resistors 61, 63, and an oscillation preventing resistor element RH are serially connected between ground potential and an input terminal 68 that inputs a voltage of a terminal to be measured (input voltage Vsens). It is noted that in the present embodiment, the configurations of the resistors 61 and 63 are arranged to be identical to those of the resistors 61 and 63 shown in FIG. 14.

According to the present embodiment, fuse MOS transistors SW1, SW2, •SWi-1, and SWi are connected in parallel with resistance value adjusting resistor elements R1, R2, •Ri-1, and Ri, respectively. A read circuit 66 is connected to the fuse MOS transistors SW1, SW2, •SWi-1, and SWi. A nonvolatile memory cell 67 is connected to the read circuit 66.

The oscillation preventing resistor element RH is arranged between the resistor 61 and ground. An n-channel type oscillation preventing fuse MOS transistor SWH is connected in parallel with the oscillation preventing resistor element RH. A gate of the oscillation preventing fuse MOS transistor SWH is connected to the output of a computing amplifier 57.

An inverting input terminal of the computing amplifier 57 is connected to a connection point between the divider resistors 61 and 63. A non-inverting input terminal of the computing amplifier 57 is connected to a reference voltage generating circuit 55 so that a reference voltage Vref may be applied thereto. The output of the computing amplifier 57 is output to the exterior via an inverter 69 and an output terminal (D Tout) 71.

When the voltage detecting circuit 73 is in a high voltage detecting state, the oscillation preventing resistor element RH is switched off, and when the voltage of the terminal to be measured that is input from the input terminal 68 is high, and the voltage divided by the divider resistors 61, 63, and the oscillation preventing resistor element RH is higher than the reference voltage Vref, the output of the computing amplifier 57 is maintained at logical value 0, and this output is inverted into logical value 1 by the inverter 69 and output from the output terminal 71. In this case, the divided voltage input to the inverting input terminal of the calculating amplifier 57 can be expressed as follows:

$$\{(R0)+(RH)\}/\{(R1)+\ldots+(Ri-1)+(Ri)+(R0)+(RH)\ldots\text{sens}\}$$

When the voltage of the terminal to be measured decreases and the voltage divided by the divider resistors 61, 63, and the oscillation preventing resistor element RH becomes lower than the reference voltage Vref, the output of the computing amplifier 57 is set to logical value 1, and this output is inverted into logical value 0 by the inverter 69 to be output from the output terminal 71.

When the output of the computing amplifier 57 is set to logical value 1, the oscillation preventing fuse MOS transistor SWH is switched on, the divider resistor 63 is connected to ground potential via the oscillation preventing fuse MOS transistor SWH, and the voltage between the divider resistors 61 and 63 decreases. In turn, the output of the computing amplifier 57 is maintained at logical value 1, and the voltage detecting circuit 73 falls into a low voltage detecting state. It is noted that the oscillation preventing resistor element RH and the oscillation preventing fuse MOS transistor SWH are configured to prevent oscillation of the output of the voltage detecting circuit 73 when the input voltage V sens decreases.

The divided voltage input to the inverting input terminal of the computing amplifier 57 when the voltage detecting circuit 73 is in a lower voltage detecting state can be expressed as follows:

$$(R0)/\{(R1)+\ldots+(Ri-1)+(Ri)+(R0)\ldots\text{sens}\}$$

The awake voltage for switching the voltage detecting circuit 73 to a high voltage detecting state may be an input voltage Vsens at a level such that the divided voltage input to the inverting input terminal of the computing amplifier 57 in the lower voltage detecting state may be greater than the reference voltage Vref.

It is noted that in FIGS. 14 and 15, the MOS transistor realized by the read circuit 66, the reference voltage generating circuit 55, and the computing amplifier 57; the fuse MOS transistors SW1, SW2, •SWi-1, and SWi; and the oscillation preventing fuse MOS transistor SWH are applied as peripheral circuit transistors of a semiconductor device according to an embodiment of the present invention. However, the present invention is not limited to the above embodiments and it does not require all of the MOS transistors to embody peripheral circuit transistors as is described above.

Also, in FIGS. 14 and 15, the fuse MOS transistors SW1, SW2, •SWi-1, and SWi may be switched on/off through control by the read circuit 66 and the nonvolatile memory cell 67 so that the resistance value of the divider resistor 61 may be adjusted. In this way, the setting voltage for the output voltage of the constant voltage generating circuit 53 and the output voltage of the voltage detecting circuit 73 may be adjusted.

It is noted that in a conventional constant voltage generating circuit and a conventional voltage detecting circuit, a fuse made of polysilicon or metal is connected in parallel with each resistance value adjusting resistor element R1, R2, •Ri-1, and Ri instead of using the fuse MOS transistors SW1, SW2, •SWi-1, SWi; the read circuit 66; and the nonvolatile memory cell 67 according to the present embodiment, and in such conventional circuits, resistance values of the divider resistors are adjusted by cutting the fuse.

In the embodiments illustrated in FIGS. 14 and 15, a switch (i.e., fuse MOS transistors SW1, SW2, •SWi-1, SWi) that is once turned off may be turned on again through control by the read circuit 66 and the nonvolatile memory cell 67, which on/off operation has been difficult to realize with a fuse. In this way, the setting voltages for the output voltage of the constant voltage generating circuit 53 and the output voltage of the voltage detecting circuit 73 may be freely changed.

According to a preferred embodiment of the present invention, the on/off states of the fuse MOS transistors SW1, SW2, •SWi-1, and SWi may be switched through writing on the nonvolatile memory cell 66, and thereby, the setting voltages for the output voltage of the constant voltage generating circuit 53 and the output voltage of the voltage detecting circuit 73 may be adjusted and changed even after the semiconductor device is accommodated within a package.

Also, it is noted that in FIGS. 14 and 15, the divider resistor circuit according to an embodiment of the present invention is applied to a constant voltage generating circuit and a voltage detecting circuit; however, the present invention is not limited to such applications and the divider resistor circuit may be applied to other types of circuits as well.

Figure 16A:
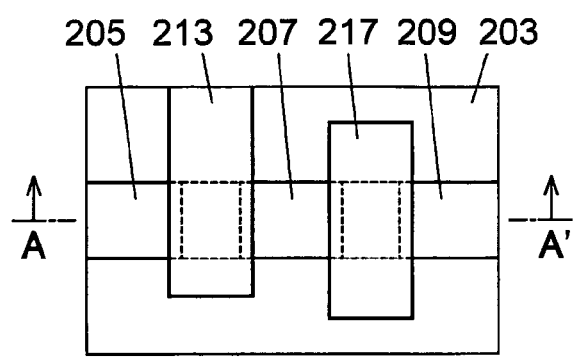
FIGS. 16A-16D are diagrams illustrating a sixth embodiment of the present invention, FIG. 16A being a plan view of a memory cell, FIG. 16B being a plan view of a peripheral circuit transistor, FIG. 16C being a cross-sectional view of the memory cell of FIG. 16A cut across line A-A', and FIG. 16D being a cross-sectional view of the peripheral transistor of FIG. 16B cut across line B-B'.
Figure 16B:
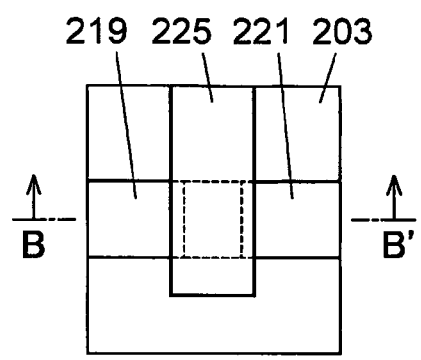
Figure 16C:
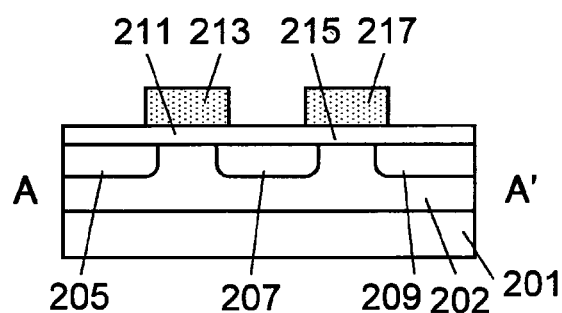
Figure 16D:
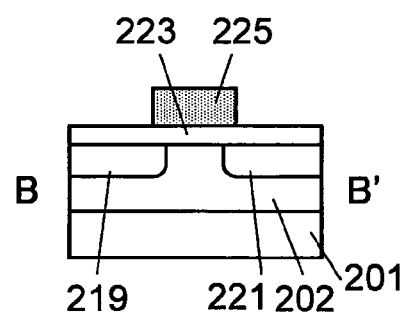

FIGS. 16A-16D are diagrams illustrating a sixth embodiment of the present invention. FIG. 16A is a plan view of a memory cell, FIG. 16B is a plan view of a peripheral circuit transistor, FIG. 16C is a cross-sectional view of the memory cell of FIG. 16A cut across line A-A', and FIG. 16D is a cross-sectional view of the peripheral circuit transistor of FIG. 16B cut across line B-B'.

As is shown in these drawings, an n-well 202 is arranged at a predetermined region of a p-substrate 201. A field oxide film 203 for realizing device isolation is arranged on the surface of the p-substrate 201, the field oxide film 203 having a thickness of 450-700 nm, for example (500 nm in the present example). P-type diffusion layers 205, 207, and 209 are arranged within the n-well 202 corresponding to a region surrounded by the field oxide film 203. It is noted that a space is arranged between the p-type diffusion layers 205 and 207, and a space is arranged between the p-type diffusion layers 207 and 209.

A selection gate oxide film 211 is arranged at a region of the p-substrate 201 including the region between the p-type diffusion layers 205 and 207, the selection gate oxide film 211 having a thickness of 10.0-15.0 nm, for example (13.5 nm in the present example). A selection gate 213 made of a polysilicon film having a thickness of 250-450 nm, for example (350 nm in the present example), is arranged on the selection gate oxide film 211 to partially overlap with portions of the p-type diffusion layers 205 and 207. It is noted that an n-type impurity such as phosphorous is introduced into the selection gate 213, and the substantial phosphorous concentration within the selection gate 213 may be approximately $7.0 \times 10^{18}$ to $5.0 \times 10^{19}$ atoms/cm$^3$, for example. The p-type diffusion layers 205, 207, the selection oxide film 211, and the selection gate 213 realize a selection transistor.

A memory gate oxide film 215 is arranged on a surface of the p-substrate 201 including the region between the p-type diffusion layers 207 and 209, the memory gate oxide film 215 having a thickness of 10.0-15.0 nm, for example (13.5 nm in the present example). A floating gate 217 made of a polysilicon film having a thickness of 250-450 nm, for example (350 nm in the present example), is arranged on the memory gate oxide film 215 to partially overlap with the p-type diffusion layers 207 and 209. It is noted that an n-type impurity such as phosphorous is introduced into the floating gate 217, and the substantial phosphorous concentration within the floating gate 217 may be $7.0 \times 10^{18}$ to $5.0 \times 10^{19}$ atoms/cm$^3$, for example. The p-type diffusion layers 207, 209, the memory gate oxide film 215, and the floating gate 217 realize a memory transistor.

The selection transistor and the memory transistor realize a memory cell.

Also, p-type diffusion layers 219 and 221 are arranged within another n-well 202 corresponding to another region surrounded by the field oxide film 203 that is different from the region of the memory cell. It is noted that a space is arranged between the p-type diffusion layers 219 and 221.

A peripheral circuit gate oxide film 223 is arranged on a region of the p-substrate 201 including the region between the p-type diffusion layers 219 and 221, the peripheral circuit gate oxide film 223 having a thickness of 10.0-15.0 nm, for example (13.5 nm in the present example). A peripheral circuit gate 225 made of a polysilicon film having a thickness of 250-450 nm, for example (350 nm in the present example), is arranged on the peripheral circuit gate oxide film 223 to partially overlap with portions of the p-type diffusion layers 219 and 221. It is noted that an n-type impurity such as phosphorous may be introduced into the peripheral circuit gate 225 at a higher concentration than the phosphorous concentration within the selection gate 213 and the floating gate 217, and the substantial phosphorous concentration within the peripheral circuit gate 225 may be at least $1.0 \times 10^{20}$ atoms/cm$^3$, for example. The p-type diffusion layers 219, 221, the peripheral circuit gate oxide film 223, and the peripheral circuit gate 225 realize a peripheral circuit transistor.

In the present embodiment, the impurity concentration within the floating gate 217 is arranged to be lower than the impurity concentration within the peripheral circuit gate 225 so that the charge retaining characteristics of the memory transistor may be improved.

Also, in the present embodiment, the impurity concentration within the peripheral circuit gate 225 is arranged to be higher than the impurity concentration within the floating gate 217 so that the resistance of the peripheral circuit gate 225 may be adequately lowered to prevent a decrease in the processing speed of the peripheral circuit transistor.

Figure 17:
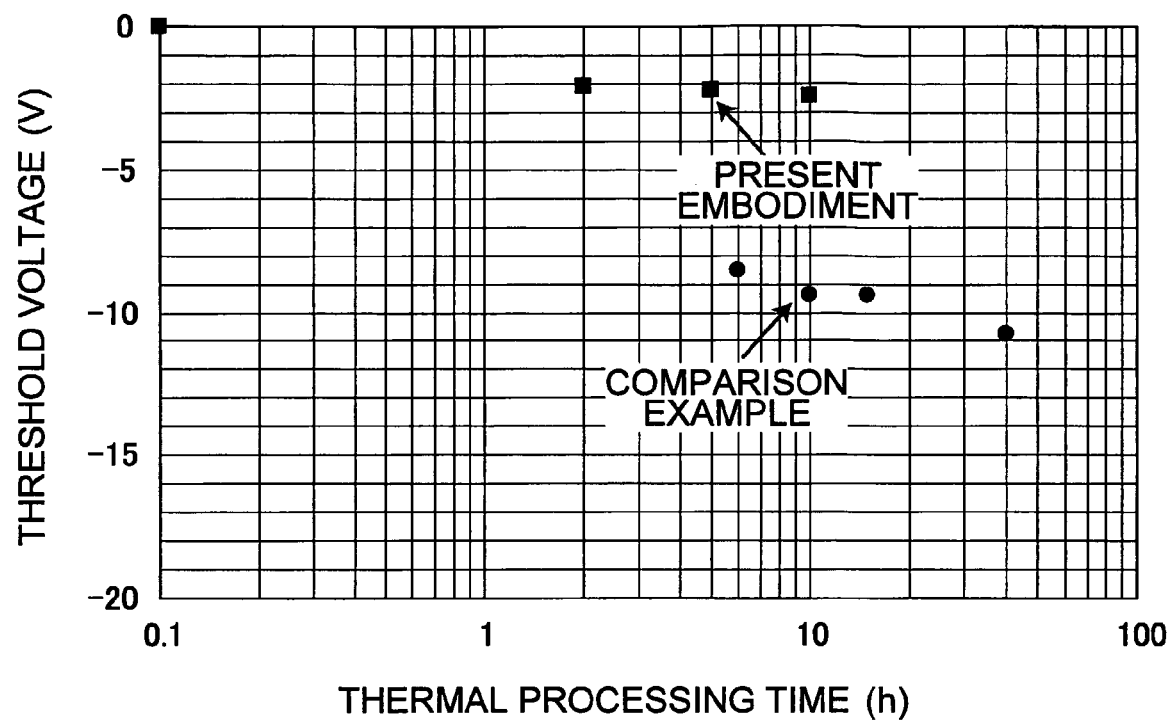
FIG. 17 is a graph indicating charge retaining characteristics of a memory transistor according to an embodiment of the present invention.

FIG. 17 is a graph showing charge retaining characteristics of a memory transistor according to an embodiment of the present embodiment. It is noted that in this graph, the vertical axis represents the threshold voltage (V) of the memory transistor, and the horizontal axis represents the elapsed time (h). In the illustrated example, thermal processing at 250° C. is performed, and a memory transistor having a floating gate with a substantial phosphorous concentration of $3.0 \times 10^{19}$ atoms/cm$^3$ as a memory transistor according to an embodiment of the present invention, and a memory transistor having a floating gate with a substantial phosphorous concentration of at least $1.0 \times 10^{20}$ atoms/cm$^3$ as a comparison example are used as samples. It is noted that in the comparison example, phosphorous is introduced into the floating gate through phosphorous deposition and thermal dispersion.

As can be appreciated from FIG. 17, the charge retaining characteristics may be improved in the memory transistor according to the present embodiment in which phosphorous is introduced into the floating gate at a lower concentration than the comparison example.

Figure 18:
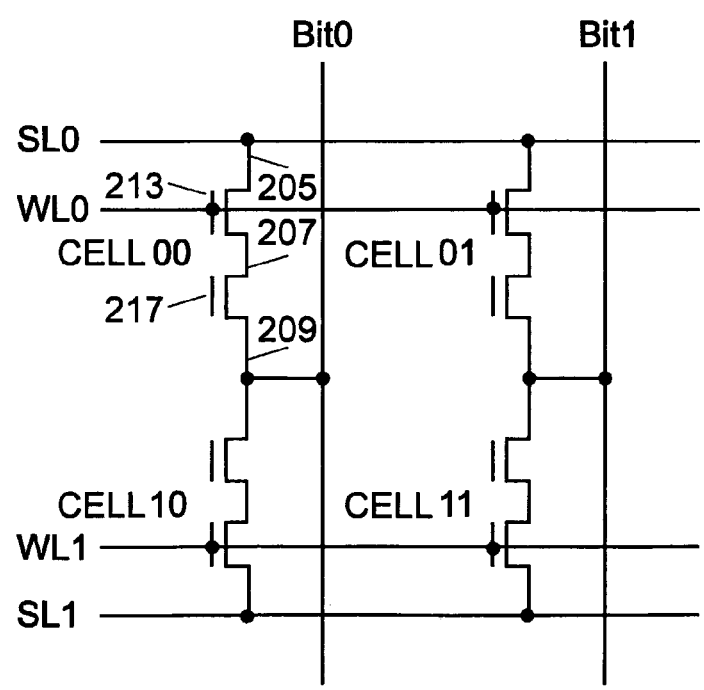
FIG. 18 is a circuit diagram showing an exemplary matrix arrangement of the memory cells of the sixth embodiment.

FIG. 18 is a circuit diagram illustrating an exemplary matrix arrangement of the memory cells of the sixth embodiment.

In the illustrated arrangement, the memory cells are arranged into a matrix. Specifically, cells i0, i1, and the selection gate 213 of point '•' that are aligned in a horizontal direction (word line WL direction) are electrically connected to a common word line WLi. Also, p-type diffusion layers 205 are electrically connected to a common source line SLi. The cells 0i, 1i, and the p-type diffusion layer 209 of point '•' that are aligned in a vertical direction (bit line Bit direction) are electrically connected to a common bit line Biti. It is noted that in the above descriptions, i denotes 0 or a natural number.

In the present embodiment, an erase operation is performed through ultraviolet ray irradiation so that all cells may be erased at once.

In a write operation, to perform writing only on cell 00, for example, the word line WL0 and the bit line Bit0 that are connected to the cell 00 subject to the writing operation are biased to a predetermined potential −Vpp, and the other word lines WLi, the other bit lines Biti, and the source lines SLi are biased to 0 V. In this way, electrons may be implanted into the floating gate 217 of the cell 00 via the memory gate oxide film so that writing may be performed on the cell 00.

Figure 19A:
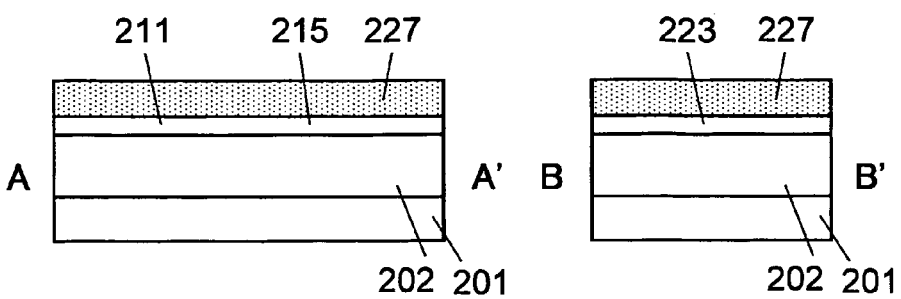
FIGS. 19A-19C are cross-sectional views illustrating exemplary process steps for fabricating the memory cell and the peripheral circuit transistor of the sixth embodiment.
Figure 19B:
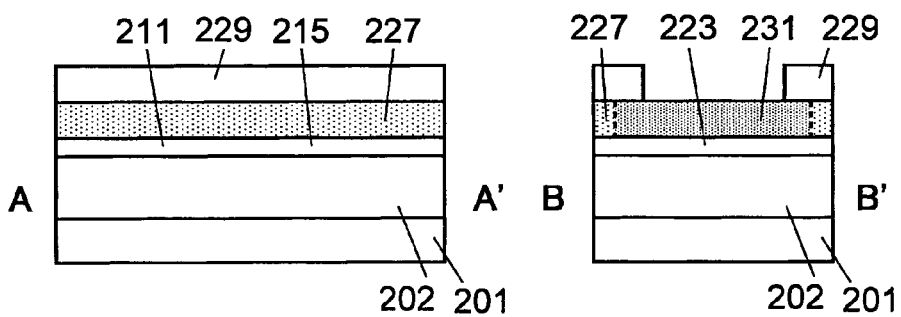
Figure 19C:
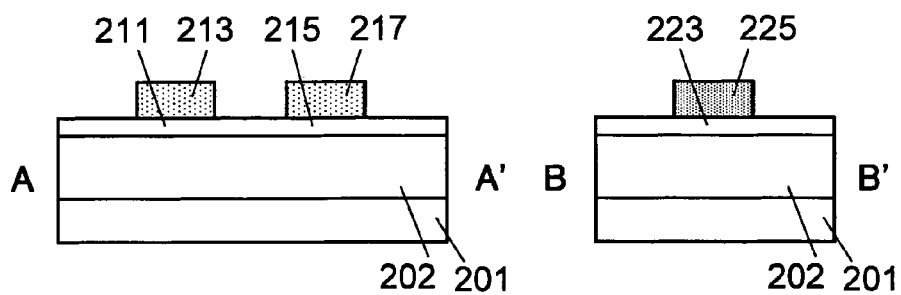

FIGS. 19A through 19C are cross sectional views illustrating exemplary process steps for fabricating the memory cell and the peripheral circuit transistor of the sixth embodiment. It is noted that the cross sectional views of FIGS. 19A through 19C, correspond to the cross-sectional views cut across lines A-A' and B-B' of FIGS. 16C and 16D. In the following, an exemplary method of fabricating the memory cell and the peripheral circuit transistor of the sixth embodiment is described with reference to FIGS. 16A-16D, and FIGS. 19A-19C.

(1) After creating the n-well 202 at the p-substrate 201, the field oxide film 203 is arranged on the p-substrate 201 through a conventional LOCOS (local oxidation of silicon) process to realize device isolation (see FIGS. 4A and 4B). The gate oxide films 211, 215, 223 having a thickness of 13.5 nm, for example, are arranged on the surface of active regions defined by the field oxide film 203, and channel doping is performed. Then, a non-doped polysilicon film is arranged on the p-substrate 201, and phosphorous is implanted into the non-doped polysilicon film at $5.0 \times 10^{15}$ atoms/cm$^2$ through ion implantation to create a polysilicon film 227 (see FIG. 19A).

(2) A HTO (high temperature oxide) film 229 covering the memory transistor formation region and the selection transistor formation region and having an opening portion at the peripheral circuit transistor formation region is arranged on the polysilicon film 227. Then, PSG (phospho silicate glass; not shown) is deposited on the polysilicon film 227 and the HTO film 229, and phophorous is thermally dispersed onto the polysilicon film 227 at the peripheral circuit transistor formation region to create a polysilicon film 231 (see FIG. 19B).

(3) After removing the PSG and the HTO film 229, photo mechanical processing and etching are performed to create the selection gate 213 on the field oxide film 203 and the selection gate oxide film 211 at the selection transistor region from the polysilicon film 227, the floating gate 217 on the field oxide film 203 and the memory gate oxide film 215 at the memory transistor region from the polysilicon film 227, and the peripheral circuit gate 225 on the field oxide film 203 and the peripheral circuit gate oxide film 223 at the peripheral circuit transistor region from the polysilicon film 231 (see FIG. 19C).

It is noted that according to one embodiment, after removing the PSG and HTO film 229, an HTO film may be arranged on the polysilicon films 227 and 231, and patterning may be performed on the HTO film and the polysilicon films 227 and 231 through photomechanical processing and etching to create a HTO film pattern on the selection gate 213, the floating gate 217, and the peripheral circuit gate 225. In this way, BF$_2$ may be prevented from being implanted into the selection gate 213, the floating gate 217, and the peripheral circuit gate 225 in a BF$_2$ implantation process to be performed subsequently. An impurity implantation prevention film such as the HTO film as is described above may be arranged on a polysilicon film before performing a patterning process in a case where an impurity is preferably not implanted into polysilicon gates created by the patterning process. In this case, patterning is performed on the impurity implantation prevention film and the polysilicon film to form a layered pattern so that impurities may be prevented from being implanted into the polysilicon gates in subsequent processes.

(4) Then, BF$_2$ is implanted through ion implantation using the selection gate 213, the floating gate 217, and the peripheral circuit gate 225 as masks to create the p-type diffusion layers 205, 207, 209, 219, and 221 (see FIGS. 16A-16D).

According to the present embodiment, the impurity concentration within the selection gate 213 is arranged to be equal to that of the floating gate 217, and thereby, the two gates 213 and 217 may be created simultaneously. In this way, the number of processes required for creating these gates may be reduced compared to a case of creating the selection gate 213, the floating gate 217, and the peripheral circuit gate 225 separately.

Figure 20A:
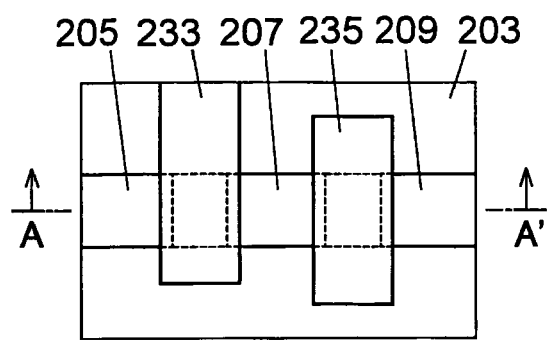
FIGS. 20A-20D are diagrams illustrating a seventh embodiment of the present invention, FIG. 20A being a plan view of a memory cell, FIG. 20B being a plan view of a peripheral circuit transistor, FIG. 20C being a cross-sectional view of the memory cell of FIG. 20A cut across line A-A', and FIG. 20D being a cross-sectional view of the peripheral circuit transistor of FIG. 20B cut across line B-B'.
Figure 20B:
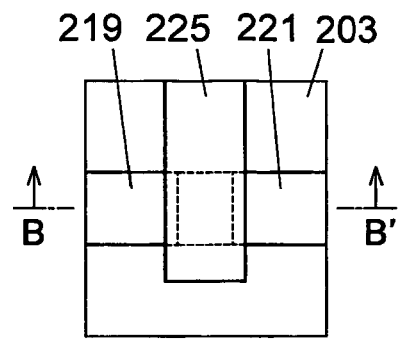
Figure 20C:
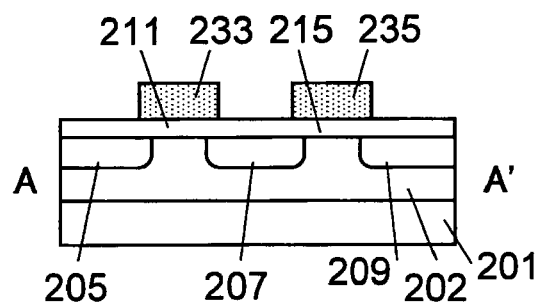
Figure 20D:
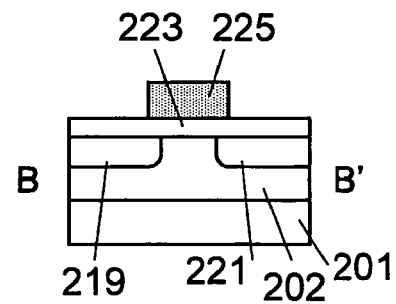

FIGS. 20A through 20D are diagrams illustrating a seventh embodiment of the present invention. FIG. 20A is a plan view of a memory cell, FIG. 20B is a plan view of a peripheral circuit transistor, FIG. 20C is a cross-sectional view of the memory cell of FIG. 20A cut across line A-A', and FIG. 20D is a cross-sectional view of the peripheral circuit transistor of FIG. 20B cut across line B-B'. It is noted that components that are identical to those shown in FIGS. 16A-16D are given the same numerical references and their descriptions are omitted.

The present invention differs from the sixth embodiment in that a p-type impurity such as boron is introduced into the polysilicon of a selection gate 233 and a floating gate 235 whereas phosphorous is not introduced into these gates as in the sixth embodiment. The boron concentration within the selection gate 233 and the floating gate 235 may be $7.0 \times 10^{18}$ to $5.0 \times 10^{19}$ atoms/cm$^3$, for example.

According to the present embodiment, the impurity concentration within the floating gate 235 is arranged to be lower than the impurity concentration within a peripheral circuit gate 225, and thereby, the charge retaining characteristics of the memory transistor may be improved.

Also, according to the present embodiment, since the impurity concentration of the peripheral circuit gate 225 is arranged to be higher than the impurity concentration of the floating gate 235, the resistance of the peripheral circuit gate 225 may be adequately lowered so that the processing speed of the peripheral circuit transistor may be prevented from decreasing.

Figure 21A:
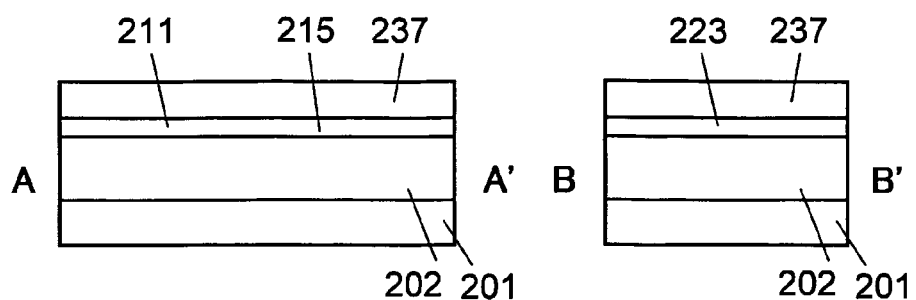
FIGS. 21A-21C are cross-sectional views illustrating exemplary process steps for fabricating the memory cell and the peripheral circuit transistor of the seventh embodiment.
Figure 21B:
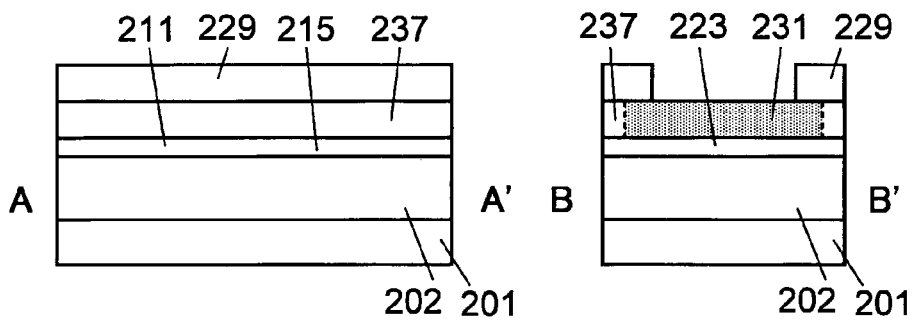
Figure 21C:
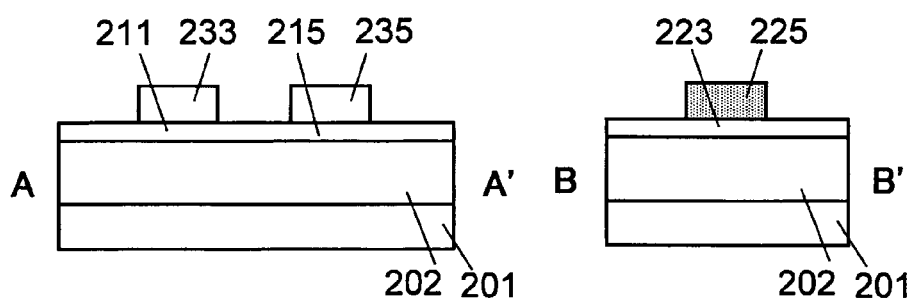

FIGS. 21A through 21C are cross-sectional views illustrating exemplary process steps for fabricating the memory cell and the peripheral circuit transistor of the seventh embodiment. It is noted that the cross-sectional views of FIGS. 21A-21C correspond to the cross-sectional views of FIGS. 20C and 20D cut across lines A-A' and B-B'. In the following, an exemplary method for fabricating the memory cell and the peripheral circuit transistor of the seventh embodiment is described with reference to FIGS. 20A-20D and FIGS. 21A-21C.

(1) An n-well 202, a field oxide film 203 (see FIGS. 20C and 20D), and gate oxide films 211, 215, and 223 are arranged on the p-substrate 201 and channel doping is performed through a process similar to the process step (1) as is described above with reference to FIG. 21A. Then, a non-doped polysilicon film 237 is created on the p-substrate 201 (see FIG. 21A).

(2) A HTO film 229 is arranged on the non-doped polysilicon film 237 which HTO film 229 covers a memory transistor formation region and a selection transistor formation region and has an opening portion at a peripheral circuit transistor formation region. Then, PSG (not shown) is deposited on a polysilicon film 227 and the HTO film 229, and phosphorous is thermally dispersed onto the non-doped polysilicon film 237 at a peripheral circuit transistor formation region to create a polysilicon film 231 (see FIG. 21B).

(3) After selectively removing the PSG and the HTO film 229, photomechanical processing and etching are performed on the non-doped polysilicon film 237 and the polysilicon film 231 to create the selection gate 233 on the field oxide film 203 and the selection gate oxide film 211 at the selection transistor region from the non-doped polysilicon film 237, the floating gate 235 on the field oxide film 203 and the memory gate oxide film 215 at the memory transistor region from the non-doped polysilicon film 237, and a peripheral circuit gate 225 on the field oxide film 203 and the peripheral circuit gate oxide film 223 at the peripheral circuit transistor region from the polysilicon film 231 (FIG. 21C).

(4) $BF_2$ is implanted through ion implantation at a concentration of $3.0 \times 10^{15}$ to $5.0 \times 10^{15}$ atoms/cm$^3$, for example, using the selection gate 233, the floating gate 235, and the peripheral circuit gate 225 as masks to create p-type diffusion layers 205, 207, 209, 219, and 221. Also, boron implantation is performed on the selection gate 233 and the floating gate 235 (see FIGS. 20A-20D).

According to the present embodiment, the impurity concentration of the selection gate 233 is arranged to be equal to the impurity concentration of the floating gate 235, and thereby the two gates 233 and 235 may be created simultaneously. In this way, the number of processes required for fabricating the gates may be reduced compared to a case of fabricating the selection gate 233, the floating gate 235, and the peripheral circuit gate 225 separately.

Figure 22A:
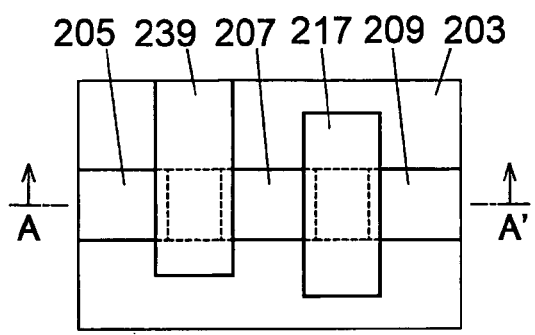
FIGS. 22A-22D are diagrams illustrating an eighth embodiment of the present invention, FIG. 22A being a plan view of a memory cell, FIG. 22B being a plan view of a peripheral circuit transistor, FIG. 22C being a cross-sectional view of the memory cell of FIG. 22A cut across line A-A', and FIG. 22D being a cross-sectional view of the peripheral circuit transistor of FIG. 22B cut across line B-B'.
Figure 22B:
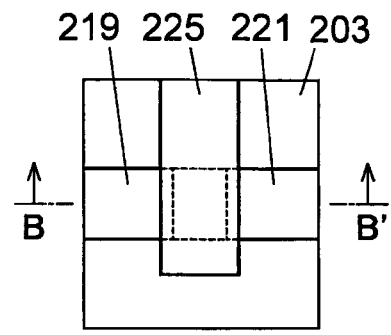
Figure 22C:
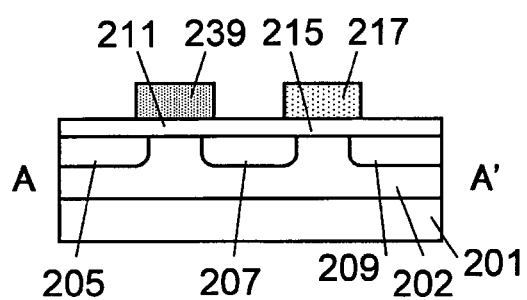
Figure 22D:
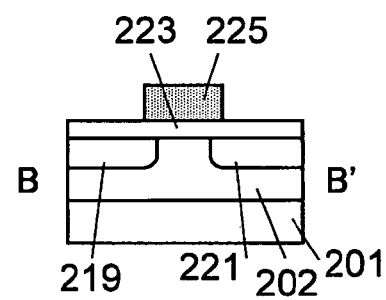

FIGS. 22A-22D are diagrams illustrating an eighth embodiment of the present invention. FIG. 22A is a plan view of a memory cell, FIG. 22B is a plan view of a peripheral circuit transistor, FIG. 22C is a cross-sectional view of the memory cell of FIG. 22A cut across line A-A', and FIG. 22D is a cross-sectional view of the peripheral circuit transistor of FIG. 22B cut across line B-B'. It is noted that in these drawings, components that are identical to those shown in FIGS. 16A-16D are given the same numerical references and their descriptions are omitted.

The present embodiment differs from the sixth embodiment in that a selection gate 239 and a peripheral circuit gate 225 are simultaneously created. An n-type impurity such as phosphorous is introduced into the selection gate 239 at a higher concentration than that for a floating gate 217, and the substantial phosphorous concentration within the selection gate 239 is arranged to be at least $1.0 \times 10^{20}$ atoms/cm$^3$.

According to the present embodiment, since the impurity concentration within the floating gate 217 is arranged to be lower than the impurity concentration within the peripheral circuit gate 225 as in the sixth embodiment, the charge retaining characteristics of the memory transistor may be improved.

Also, according to the present embodiment, since the impurity concentration within the peripheral circuit gate 225 and the selection gate 239 is arranged to be higher than the impurity concentration of the floating gate 217, the resistance of the peripheral circuit gate 225 and the selection gate 239 may be adequately lowered so that the processing speed of the peripheral circuit transistor and the selection transistor may be prevented from decreasing.

Figure 23A:
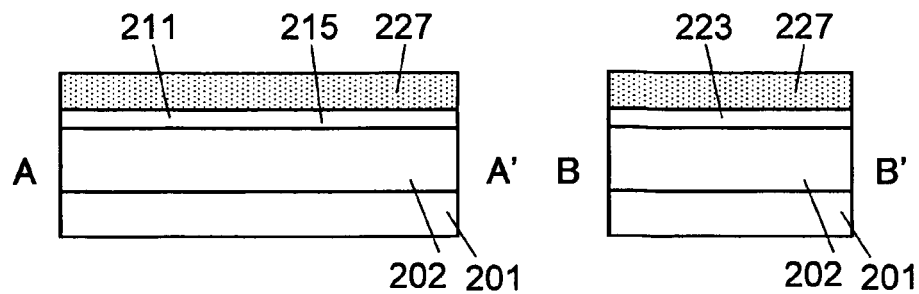
FIGS. 23A-23C are cross-sectional views illustrating exemplary process steps for fabricating the memory cell and the peripheral circuit transistor of the eighth embodiment.
Figure 23B:
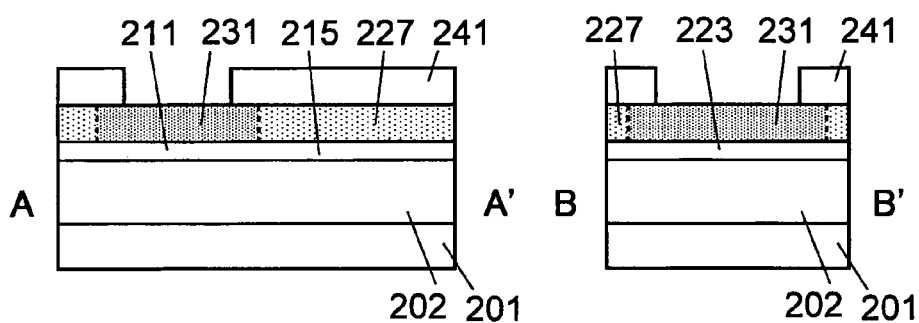
Figure 23C:
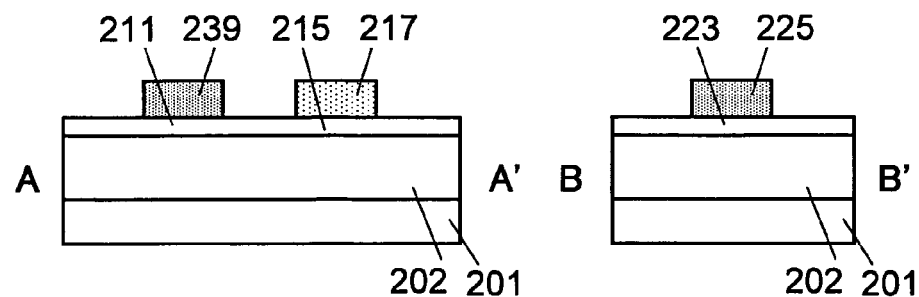

FIGS. 23A through 23C are cross sectional views illustrating exemplary process steps for fabricating the memory cell and the peripheral circuit transistor of the eighth embodiment. It is noted that the cross sectional views of FIGS. 23A through 23C, correspond to the cross-sectional views cut across lines A-A' and B-B' of FIGS. 22C and 22D. In the following, an exemplary method for fabricating the memory cell and the peripheral circuit transistor of the eighth embodiment is described with reference to FIGS. 22A-22D, and FIGS. 23A-23C.

(1) An n-well 202, a field oxide film 203 (see FIGS. 22C and 22D), gate oxide films 211, 215, 223, and a polysilicon film 227 are arranged on a p-substrate 201 through a process similar to the process step (1) described in relation to FIG. 19A (see FIG. 23A).

(2) A HTO film 241 is arranged on the polysilicon film 227 which HTO film 241 covers a memory transistor formation region and has opening portions at a selection transistor formation region and a peripheral circuit transistor formation region. Then, PSG (not shown) is deposited on the polysilicon film 227 and the HTO film 241, and phophorous is thermally dispersed onto the polysilicon film 227 at the peripheral circuit transistor formation region and the selection transistor formation region to create a polysilicon film 231 (see FIG. 23B).

(3) After removing the PSG and the HTO film 241, photo mechanical processing and etching are performed on the polysilicon film 227 and the polysilicon film 231 to create a floating gate 217 on the field oxide film 203 and the memory gate oxide film 215 at the memory transistor region from the polysilicon film 227, a selection gate 239 on the field oxide film 203 and the selection gate oxide film 231 at the selection transistor region from the polysilicon film 231, and a peripheral circuit gate 225 on the field oxide film 203 and the peripheral circuit gate oxide film 223 at the peripheral circuit transistor region from the polysilicon film 231 (see FIG. 23C).

It is noted that according to one embodiment, after removing the PSG and the HTO film 241, a HTO film may be arranged on the polysilicon films 227 and 231, and a patterning process may be performed on the HTO film and the polysilicon films 227 and 231 through photomechanical processing and etching to create a HTO film pattern on the selection gate 239, the floating gate 217, and the peripheral circuit gate 225. In this way, $BF_2$ may be prevented from being implanted into the selection gate 239, the floating gate 217, and the peripheral circuit gate 225 in a $BF_2$ implantation process to be subsequently performed.

(4) Then, $BF_2$ is implanted through an ion implantation process using the selection gate 213, the floating gate 217, and the peripheral circuit gate 225 as masks to create p-type diffusion layers 205, 207, 209, 219, and 221 (see FIGS. 22A-22D).

According to the present embodiment, the impurity concentration of the selection gate 239 is arranged to be equal to the impurity concentration of the floating gate 225, and thereby, the two gates 225 and 239 may be created simultaneously. In this way, the number of processes required for creating the gates may be reduced compared to a case of creating the selection gate 239, the floating gate 217, and the peripheral circuit gate 225 separately.

Figure 24A:
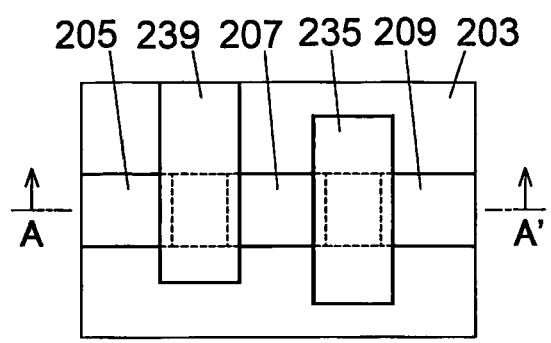
FIGS. 24A-24D are diagrams illustrating a ninth embodiment of the present invention, FIG. 24A being a plan view of a memory cell, FIG. 24B being a plan view of a peripheral circuit transistor, FIG. 24C being a cross-sectional view of the memory cell of FIG. 24A cut across line A-A', and FIG. 24D being a cross-sectional view of the peripheral circuit transistor of FIG. 24B cut across line B-B'.
Figure 24B:
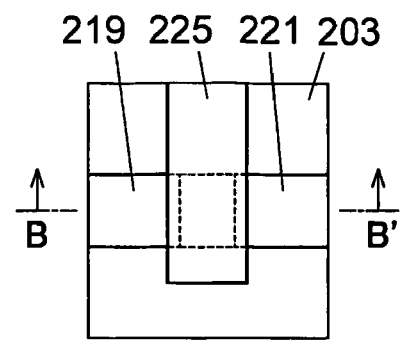
Figure 24C:
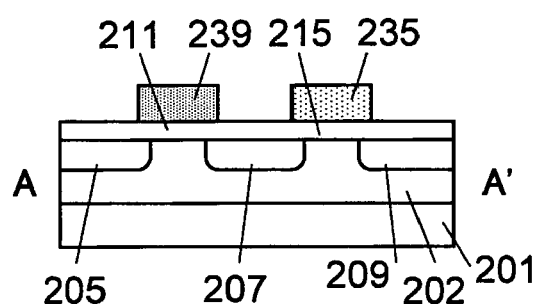
Figure 24D:
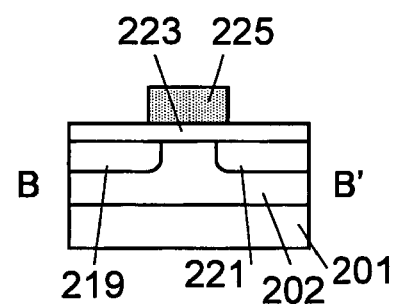

FIGS. 24A through 24D are diagrams illustrating a ninth embodiment of the present invention. FIG. 24A is a plan view of a memory cell, FIG. 24B is a plan view of a peripheral circuit transistor, FIG. 24C is a cross-sectional view of the memory cell of FIG. 24A cut across line A-A', and FIG. 24D is a cross-sectional view of the peripheral circuit transistor of FIG. 24B cut across line B-B'. It is noted that components that are identical to those shown in FIGS. 16A-16D, FIGS. 20A-20D, and FIGS. 22A-22D are given the same numerical references and their descriptions are omitted.

The present invention differs from the seventh embodiment in that a selection gate 239 and a peripheral circuit gate 225 are simultaneously created, and an n-type impurity such as phosphorous is introduced into the selection gate 239 at a higher concentration than the impurity concentration within a floating gate 235. The substantial phosphorous concentration within the selection gate 239 may be arranged to be at least $1.0 \times 10^{20}$ atoms/cm$^3$, for example.

According to the present embodiment, the impurity concentration within the floating gate 235 is arranged to be lower than the impurity concentration within the peripheral circuit gate 225 as in the seventh embodiment, and thereby, the charge retaining characteristics of the memory transistor may be improved.

Also, according to the present embodiment, since the impurity concentration within the peripheral circuit gate 225 and the selection gate 239 is arranged to be higher than the impurity concentration within the floating gate 235, the resistance of the peripheral circuit gate 225 and the selection gate 239 may be adequately lowered so that the processing speed of the peripheral circuit transistor and the selection transistor may be prevented from decreasing.

Figure 25A:
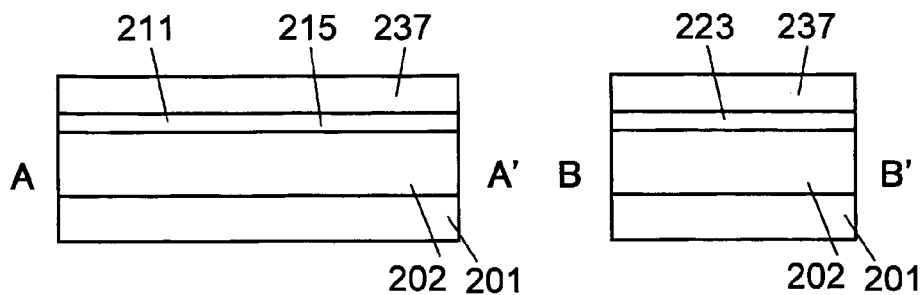
FIGS. 25A-25C are cross-sectional views illustrating exemplary process steps for fabricating the memory cell and the peripheral circuit transistor of the ninth embodiment.
Figure 25B:
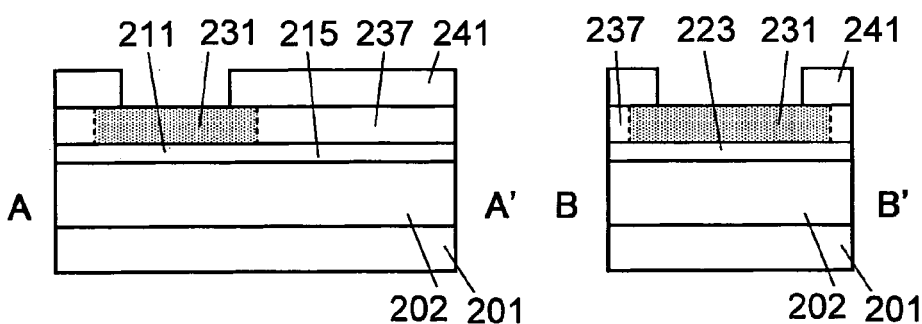
Figure 25C:
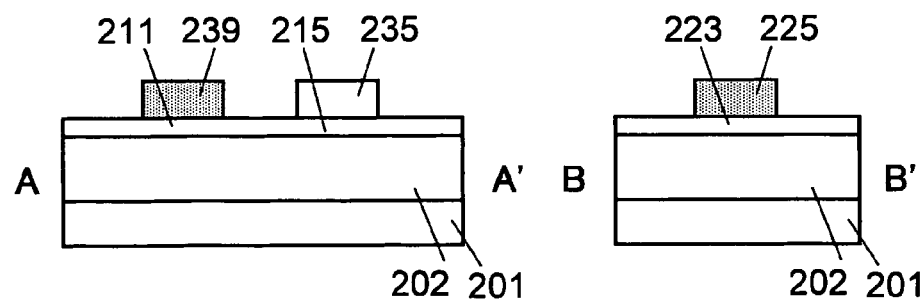

FIGS. 25A through 25C are cross-sectional views illustrating exemplary process steps for fabricating the memory cell and the peripheral circuit transistor of the ninth embodiment. It is noted that the cross-sectional views of FIGS. 25A-25C correspond to the cross-sectional views of FIGS. 24C and 24D cut across lines A-A' and B-B'. In the following, an exemplary method for fabricating the memory cell and the peripheral circuit transistor of the ninth embodiment is described with reference to FIGS. 24A-24D and FIGS. 25A-25C.

(1) An n-well 202, a field oxide film 203 (see FIGS. 24C and 24D), gate oxide films 211, 215, 223, and a non-doped polysilicon film 237 are arranged on a p-substrate 201 through a process similar to the process step (1) as is described above with reference to FIG. 23A (see FIG. 25A).

(2) A HTO film 241 is arranged on the non-doped polysilicon film 237 which HTO film 237 covers a memory transistor formation region and has opening portions at a peripheral circuit transistor formation region and a selection transistor formation region. Then, PSG (not shown) is deposited on the non-doped polysilicon film 237 and the HTO film 241, and phosphorous is thermally dispersed onto the non-doped polysilicon film 237 at the peripheral circuit transistor region and the selection transistor region to create a polysilicon film 231 (see FIG. 25B).

(3) After removing the PSG and the HTO film 241, photomechanical processing and etching are performed on the non-doped polysilicon film 237 and the polysilicon film 231 to create the floating gate 235 on the field oxide film 203 and the memory gate oxide film 215 at the memory transistor region from the non-doped polysilicon film 237, the selection gate 239 on the field oxide film 203 and the selection gate oxide film 211 at the selection transistor region from the polysilicon film 231, and the peripheral circuit gate 225 on the field oxide film 203 and the peripheral circuit gate oxide film 223 at the peripheral circuit transistor region from the polysilicon film 231 (see FIG. 25C).

(4) $BF_2$ is implanted through ion implantation at a concentration of $3.0 \times 10^{15}$ to $5.0 \times 10^{15}$ atoms/cm$^3$, for example, using the selection gate 239, the floating gate 235, and the peripheral circuit gate 225 as masks to create p-type diffusion layers 205, 207, 209, 219, and 221. Also, boron is implanted into the floating gate 235 (see FIGS. 24A-24D).

According to the present embodiment, the impurity concentration within the selection gate 239 is arranged to be equal to the impurity concentration within the peripheral circuit gate 225, and thereby, the two gates 239 and 225 may be created simultaneously. In this way, the number of processes required for fabricating the gates may be reduced compared to a case of fabricating the selection gate 239, the floating gate 235, and the peripheral circuit gate 225 separately.

Figure 26A:
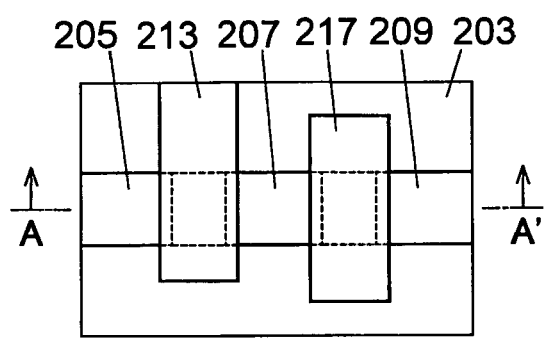
FIGS. 26A-26D are diagrams illustrating a tenth embodiment of the present invention, FIG. 26A being a plan view of a memory cell, FIG. 26B being a plan view of a peripheral circuit transistor, FIG. 26C being a cross-sectional view of the memory cell of FIG. 26A cut across line A-A', and FIG. 26D being a cross-sectional view of the peripheral circuit transistor of FIG. 26B cut across line B-B'.
Figure 26B:
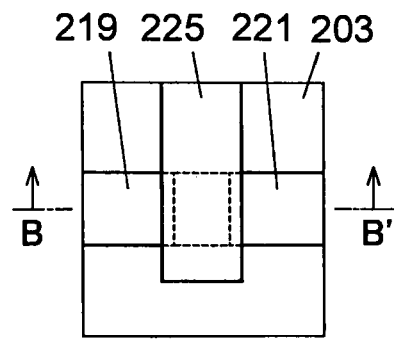
Figure 26C:
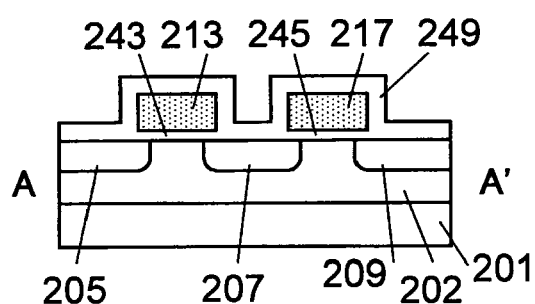
Figure 26D:
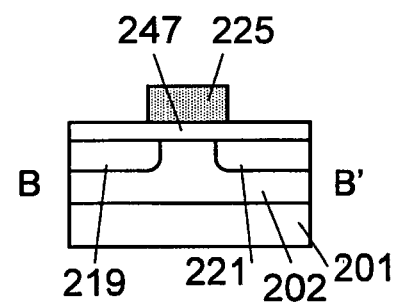

FIGS. 26A through 26D are diagrams illustrating a tenth embodiment of the present invention. FIG. 26A is a plan view of a memory cell, FIG. 26B is a plan view of a peripheral circuit transistor, FIG. 26C is a cross-sectional view of the memory cell of FIG. 26A cut across line A-A', and FIG. 26D is a cross-sectional view of the peripheral circuit transistor of FIG. 26B cut across line B-B'. It is noted that components that are identical to those shown in FIGS. 16A-16D are given the same numerical references and their descriptions are omitted.

According to the present embodiment, an n-well 202 is created at a predetermined region of a p-substrate 201, and a field oxide film 203 is arranged on the surface of the p-substrate 201.

A selection transistor realized by p-type diffusion layers 205, 207, a selection gate oxide film 243, and a selection gate 213 is arranged at a selection transistor region.

A memory transistor realized by p-type diffusion layers 207, 209, a memory gate oxide film 245, and a floating gate 217 is arranged at a memory transistor region.

A peripheral circuit transistor realized by p-type diffusion layers 219 and 221, a peripheral circuit gate oxide film 247, and a peripheral circuit gate 225 is arranged at a peripheral circuit transistor region.

In the present embodiment, the selection gate oxide film 243 and the memory gate oxide film 245 are created in the same process. A peripheral circuit gate oxide film 247 is created in a separate process from the process for creating the selection gate oxide film 243 and the memory gate oxide film 245. The selection gate oxide film 243 and the memory gate oxide film 245 may be arranged to have a thickness of 6.0-10.0 nm, for example (7.5 nm in the present example). The peripheral circuit gate oxide film 247 may be arranged to have a thickness of 10.0-15.0 nm, for example (13.5 nm in the present example).

A silicon oxide film 249 is arranged on the surfaces of the selection gate 213 and the floating gate 217.

In the present embodiment, the impurity concentration within the floating gate 217 is arranged to be lower than the impurity concentration within the peripheral circuit gate 225 as in the sixth embodiment, and thereby, the charge retaining characteristics of the memory transistor may be improved.

Also, in the present embodiment, the impurity concentration within the peripheral circuit gate 225 is arranged to be higher than the impurity concentration within the floating gate 217, and thereby, the resistance of the peripheral circuit gate 225 may be adequately reduced so that the processing speed of the peripheral circuit transistor and the selection transistor may be prevented from decreasing.

Also, in the present embodiment, the memory gate oxide film 245 is arranged to be thinner than the peripheral circuit gate oxide film 247. Accordingly, the peripheral circuit gate oxide film 247 may be arranged to be adequately thick so that it may be protected from damage when a writing operation is performed on the memory transistor, and the memory gate oxide film may be arranged to be adequately thin so that good writing characteristics may be obtained in the memory transistor. In this way, writing may be suitably performed on the memory transistor while protecting the peripheral circuit gate oxide film 247 from damage and preventing the occurrence of snapback breakdown.

Figure 27A:
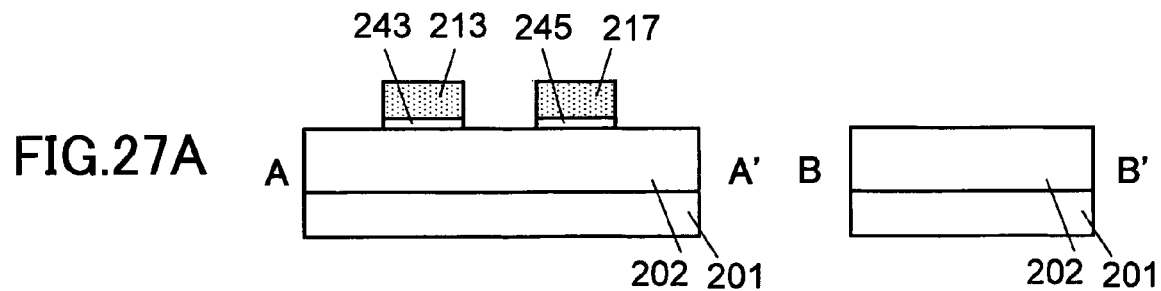
FIGS. 27A-27C are cross-sectional views illustrating exemplary process steps for fabricating the memory cell and the peripheral circuit transistor of the tenth embodiment.
Figure 27B:
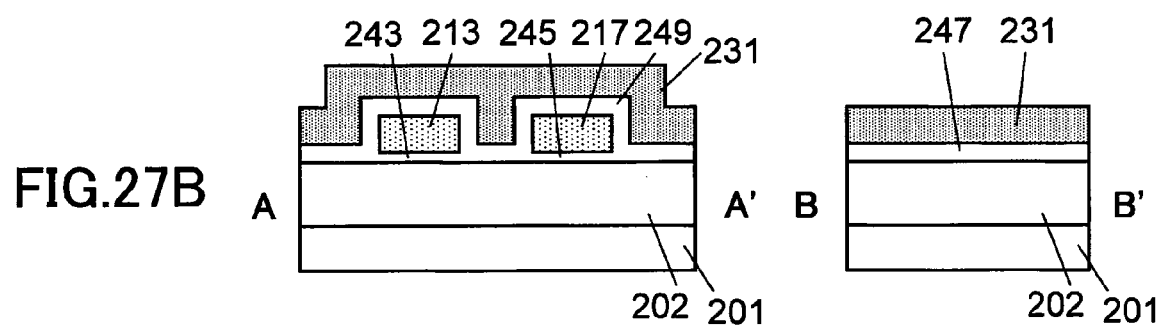
Figure 27C:
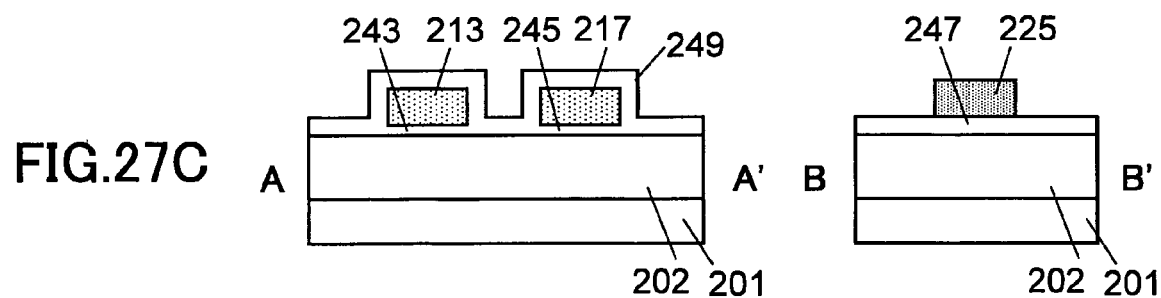

FIGS. 27A through 27C are cross-sectional views illustrating exemplary process steps for fabricating the memory cell and the peripheral circuit transistor of the tenth embodiment. It is noted that the cross-sectional views of FIGS. 27A-27C correspond to the cross-sectional views of FIGS. 26C and 26D cut across lines A-A' and B-B'. In the following, an exemplary method for fabricating the memory cell and the peripheral circuit transistor of the tenth embodiment is described with reference to FIGS. 26A-26D and FIGS. 27A-27C.

(1) After creating the n-well 202 at the p-substrate 201, the field oxide film 203 is arranged on the p-substrate 201 through a conventional LOCOS (local oxidation of silicon) process to realize device isolation (see FIGS. 26A and 26B). The gate oxide films 243 and 245 having a thickness of 7.5 nm, for example, are arranged on the surface of active regions defined by the field oxide film 203, and channel doping is performed. Then, a non-doped polysilicon film is arranged on the p-substrate 201, and phosphorous is implanted into the non-doped polysilicon film through ion implantation at a concentration of $5.0 \times 10^{15}$ atoms/cm$^2$ to create a polysilicon film. Then a patterning process is performed on the polysilicon film through photomechanical processing and etching to create the selection gate 213 on the field oxide film 203 and the selection gate oxide film 243 at the selection transistor region, and the floating gate 217 on the field oxide film 203 and the memory gate oxide film 245 at the memory transistor region. Then, the field oxide film 203, the selection gate 213, and the floating gate 217 are used as masks to remove the oxide film on the surface of the p-substrate 201. Upon removing the oxide film, photomechanical processing may be used to cover the selection transistor region and the memory transistor region (see FIG. 27A).

(2) The gate oxide film 247 having a thickness of 13.5 nm, for example, is created by performing a thermal oxidation process. In this case, the silicon oxide film 249 is created on the surfaces of the selection gate 213 and the floating gate 217. Then, a non-doped polysilicon film is arranged on the p-substrate 201, and PSG (not shown) is deposited thereon, after which phosphorous is thermally dispersed onto the non-doped polysilicon film to create the polysilicon film 231 (see FIG. 27B).

(3) After removing the PSG, the peripheral circuit gate 225 is created on the field oxide film 203 and the peripheral circuit gate oxide film 247 at the peripheral circuit transistor region from the polysilicon film 231 through photo mechanical processing and etching (see FIG. 27C).

(4) Then, BF$_2$ is implanted through ion implantation using the selection gate 213, the floating gate 217, and the peripheral circuit gate 225 as masks to create the p-type diffusion layers 205, 207, 209, 219, and 221 (see FIGS. 26A-26D).

According to the present embodiment, the impurity concentration within the selection gate 213 is arranged to be equal to the impurity concentration within the floating gate 217, and thereby, the two gates 213 and 217 may be created simultaneously. In this way, the number of processes required for creating these gates may be reduced compared to a case of creating the selection gate 213, the floating gate 217, and the peripheral circuit gate 225 separately.

Also, in the present embodiment, the selection gate oxide film 243 is arranged to have the same thickness as that of the memory gate oxide film 245, and thereby, the two gate oxide films 243 and 245 may be created simultaneously, and the number of processes required for creating the gate oxide films may be reduced compared to a case of creating the selection gate oxide film 243, the memory gate oxide film 245, and the peripheral circuit gate oxide film 247 separately.

Figure 28A:
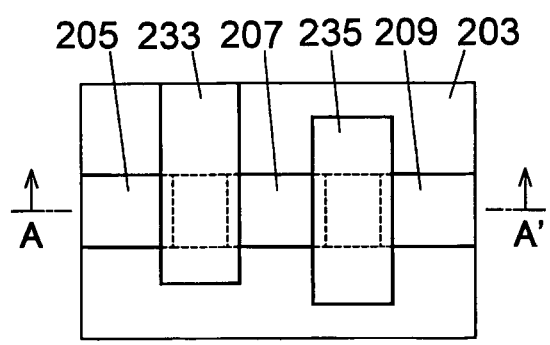
FIGS. 28A-28D are diagrams illustrating an eleventh embodiment of the present invention, FIG. 28A being a plan view of a memory cell, FIG. 28B being a plan view of a peripheral circuit transistor, FIG. 28C being a cross-sectional view of the memory cell of FIG. 28A cut across line A-A', and FIG. 28D being a cross-sectional view of the peripheral circuit transistor of FIG. 28B cut across line B-B'.
Figure 28B:
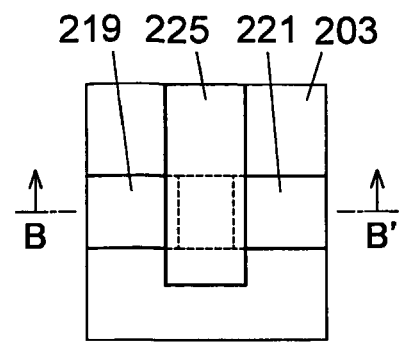
Figure 28C:
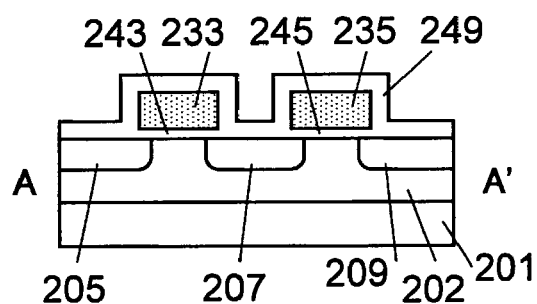
Figure 28D:
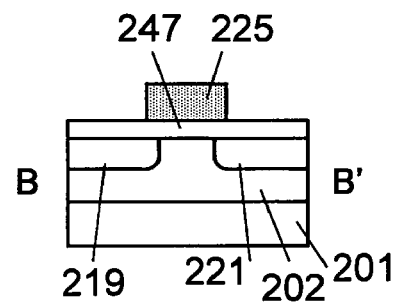

FIGS. 28A through 28D are diagrams illustrating an eleventh embodiment of the present invention. FIG. 28A is a plan view of a memory cell, FIG. 28B is a plan view of a peripheral circuit transistor, FIG. 28C is a cross-sectional view of the memory cell of FIG. 28A cut across line A-A', and FIG. 28D is a cross-sectional view of the peripheral circuit transistor of FIG. 28B cut across line B-B'. It is noted that components that are identical to those shown in FIGS. 16A-16D, FIGS. 20A-20D, and FIGS. 26A-26D are given the same numerical references and their descriptions are omitted.

The present invention differs from the sixth embodiment in that a p-type impurity such as boron is introduced into the polysilicon of a selection gate 233 and a floating gate 235 whereas phosphorous is not introduced into these gates as in the tenth embodiment. The boron concentration within the selection gate 233 and the floating gate 235 may be $7.0 \times 10^{18}$ to $5.0 \times 10^{19}$ atoms/cm$^3$, for example.

A silicon oxide film 249 is arranged on the surfaces of the selection gate 233 and the floating gate 235.

According to the present embodiment, the impurity concentration within the floating gate 235 is arranged to be lower than the impurity concentration within the peripheral circuit gate 225 as in the seventh embodiment, and thereby, the charge retaining characteristics of the memory transistor may be improved. Also, since the impurity concentration of the peripheral circuit gate 225 is arranged to be higher than the impurity concentration of the floating gate 235, the resistance of the peripheral circuit gate 225 may be adequately lowered so that the processing speed of the peripheral circuit transistor may be prevented from decreasing.

Also, in the present embodiment, a memory gate oxide film 245 is arranged to be thinner than a peripheral circuit gate oxide film 247, and thereby, writing may be suitably performed on the memory transistor while protecting the peripheral circuit gate oxide film 247 from damage and preventing the occurrence of snapback breakdown.

Figure 29A:
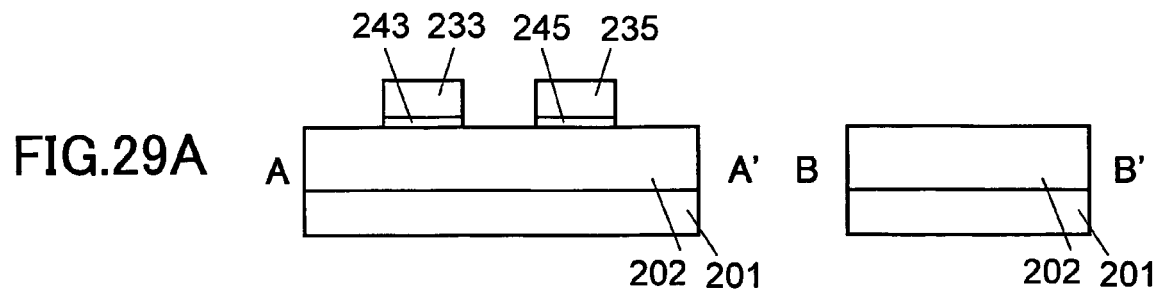
FIGS. 29A-29C are cross-sectional views illustrating exemplary process steps for fabricating the memory cell and the peripheral circuit transistor of the eleventh embodiment.
Figure 29B:
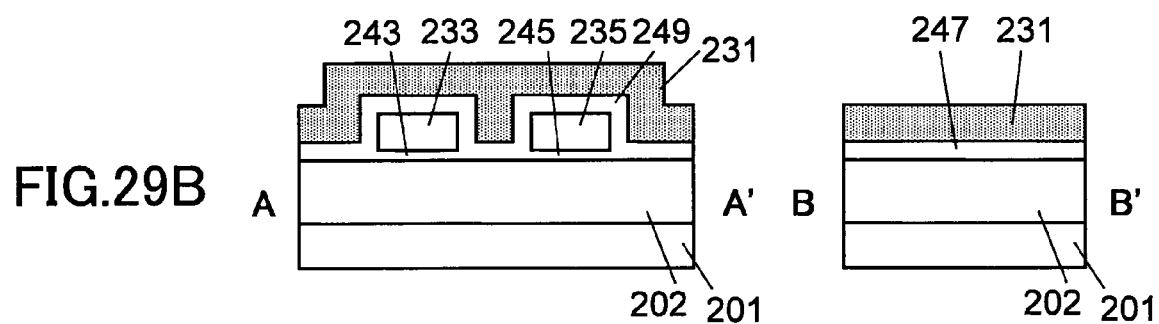
Figure 29C:
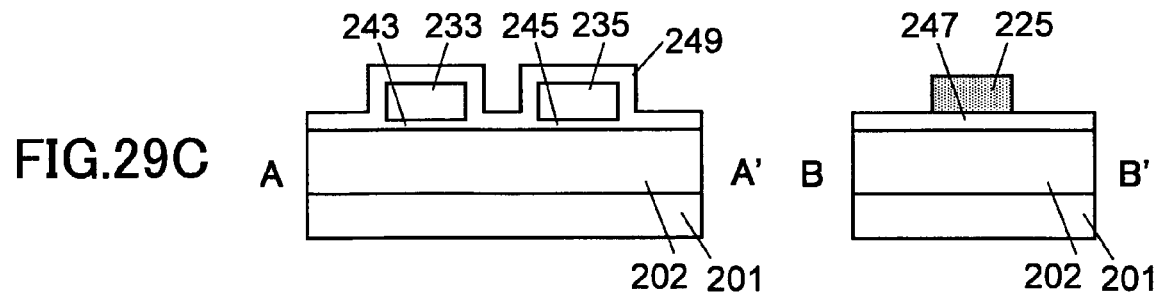

FIGS. 29A through 29C are cross-sectional views illustrating exemplary process steps for fabricating the memory cell and the peripheral circuit transistor of the eleventh embodiment. It is noted that the cross-sectional views of FIGS. 29A-29C correspond to the cross-sectional views of FIGS. 28C and 28D cut across lines A-A' and B-B'. In the following, an exemplary method for fabricating the memory cell and the peripheral circuit transistor of the eleventh embodiment is described with reference to FIGS. 28A-28D and FIGS. 29A-29C.

(1) After creating an n-well 202 at a p-substrate 201, a field oxide film 203 is arranged on the p-substrate 201 through a conventional LOCOS (local oxidation of silicon) process to realize device isolation (see FIGS. 28A and 28B). Gate oxide films 243 and 245 having a thickness of 7.5 nm, for example, are arranged on the surfaces of active regions defined by the field oxide film 203, and channel doping is performed. Then, a non-doped polysilicon film is arranged on the p-substrate 201. Then, a patterning process is performed on the non-doped polysilicon film through photo mechanical processing and etching to create the selection gate 233 on the field oxide film 203 and the selection gate oxide film 243 at a selection transistor region, and the floating gate 235 on the field oxide film 203 and the memory gate oxide film 245 at a memory transistor region. Then, the field oxide film 203, the selection gate 233, and the floating gate 235 are used as masks to remove the oxide film arranged on the surface of the p-substrate 201. Upon removing the oxide film, photomechanical processing may be used to cover the selection transistor region and the memory transistor region (see FIG. 29A).

(2) The gate oxide film 247, the silicon oxide film 249, and a polysilicon film 231 are created through a process similar to the process step (2) described with reference to FIG. 27B (see FIG. 29B).

(3) The peripheral circuit transistor 225 is created on the field oxide film 203 and the peripheral circuit gate oxide film 247 at the peripheral circuit transistor region through a process similar to the process step (3) described above with reference to FIG. 27C (see FIG. 29C).

(4) Then, $BF_2$ is implanted to realize a concentration of $3.0 \times 10^{15}$ to $5.0 \times 10^{15}$ atoms/cm$^3$ through an ion implantation process using the selection gate 233, the floating gate 235, and the peripheral circuit gate 225 as masks to create p-type diffusion layers 205, 207, 209, 219, and 221. Also, boron implantation is performed on the selection gate 233 and the floating gate 235 (see FIGS. 28A-28D).

According to the present embodiment, the impurity concentration of the selection gate 233 is arranged to be equal to the impurity concentration of the floating gate 235, and thereby, the two gates 233 and 235 may be created simultaneously. In this way, the number of processes required for creating these gates may be reduced compared to a case of creating the selection gate 233, the floating gate 235, and the peripheral circuit gate 225 separately.

Also, according to the present embodiment, the selection gate oxide film 243 and the memory gate oxide film 245 are arranged to have the same thickness, and thereby, the two gate oxide films 243 and 245 may be created simultaneously. In this way, the number of processes required for creating these gate oxide films may be reduced compared to a case of creating the selection gate oxide film 243, the memory gate oxide film 245, and the peripheral circuit gate oxide film 247 separately.

Figure 30A:
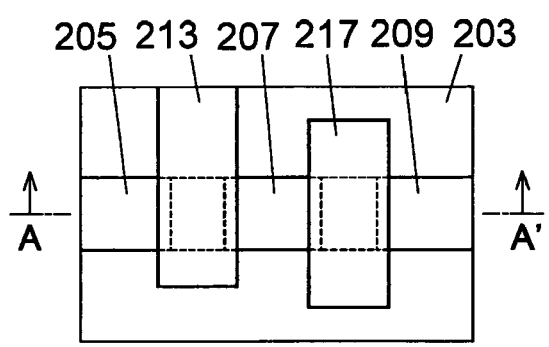
FIGS. 30A-30D are diagrams illustrating a twelfth embodiment of the present invention, FIG. 30A being a plan view of a memory cell, FIG. 30B being a plan view of a peripheral circuit transistor, FIG. 30C being a cross-sectional view of the memory cell of FIG. 30A cut across line A-A', and FIG. 30D being a cross-sectional view of the peripheral circuit transistor of FIG. 30B cut across line B-B'.
Figure 30B:
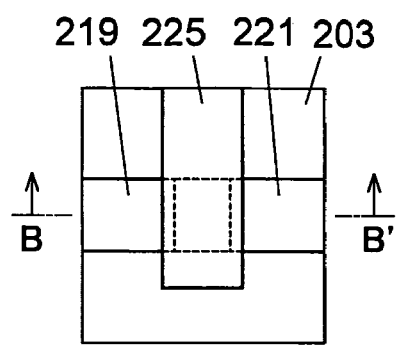
Figure 30C:
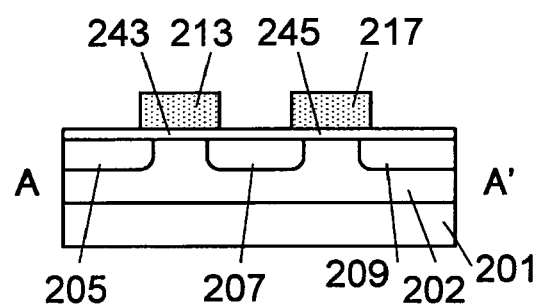
Figure 30D:
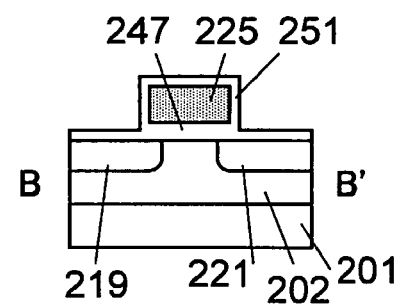

FIGS. 30A through 30D are diagrams illustrating a twelfth embodiment of the present invention. FIG. 30A is a plan view of a memory cell, FIG. 30B is a plan view of a peripheral circuit transistor, FIG. 30C is a cross-sectional view of the memory cell of FIG. 30A cut across line A-A', and FIG. 30D is a cross-sectional view of the peripheral circuit transistor of FIG. 30B cut across line B-B'. It is noted that components that are identical to those shown in FIGS. 16A-16D, and FIGS. 26A-26D are given the same numerical references and their descriptions are omitted.

The present embodiment differs from the tenth embodiment described above with reference to FIGS. 26A-26D in that a silicon oxide film 251 is arranged on the surface of a peripheral circuit gate 225 as opposed to arranging the silicon oxide film 249 on the surfaces of the selection gate 213 and the floating gate 217 as in the tenth embodiment.

In the present embodiment, the impurity concentration within a floating gate 217 is arranged to be lower than the impurity concentration within the peripheral circuit gate 225, and thereby, charge retaining characteristics of the memory transistor may be improved.

Also, in the present embodiment, since the impurity concentration within the peripheral circuit gate 225 is arranged to be higher than the impurity concentration within the floating gate 217, the resistance of the peripheral circuit gate 225 may be adequately lowered so that the processing speed of the peripheral circuit transistor and the selection transistor may be prevented from decreasing.

Also, in the present embodiment, a memory gate oxide film 245 is arranged to be thinner than a peripheral circuit gate oxide film 247, and thereby, writing may be suitably performed on the memory transistor while protecting the peripheral circuit gate oxide film 247 from damage and preventing the occurrence of snapback breakdown.

Figure 31A:
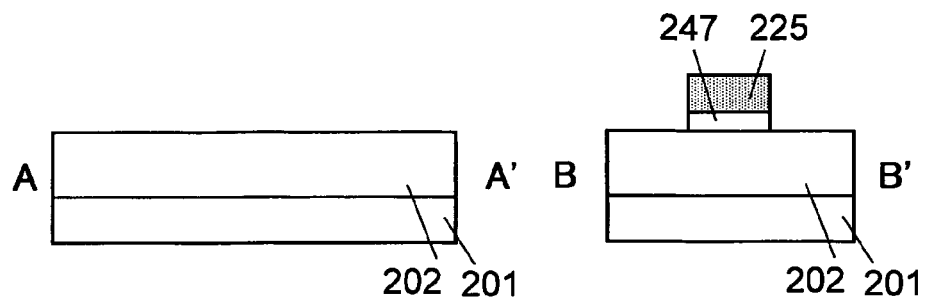
FIGS. 31A-31C are cross-sectional views illustrating exemplary process steps for fabricating the memory cell and the peripheral circuit transistor of the twelfth embodiment.
Figure 31B:
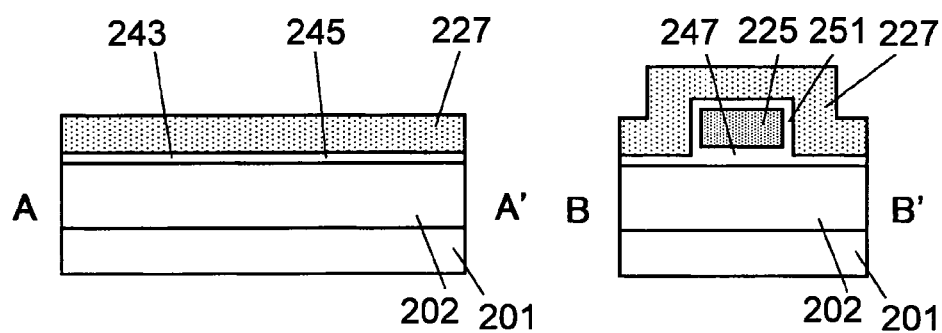
Figure 31C:
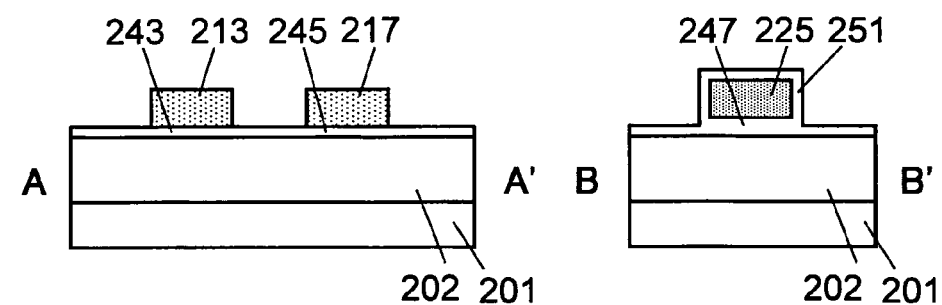

FIGS. 31A through 31C are cross-sectional views illustrating exemplary process steps for fabricating the memory cell and the peripheral circuit transistor of the twelfth embodiment. It is noted that the cross-sectional views of FIGS. 31A-31C correspond to the cross-sectional views of FIGS. 30C and 30D cut across lines A-A' and B-B'. In the following, an exemplary method for fabricating the memory cell and the peripheral circuit transistor of the twelfth embodiment is described with reference to FIGS. 30A-30D and FIGS. 31A-31C.

(1) After creating an n-well 202 at a p-substrate 201, a field oxide film 203 is arranged on the p-substrate 201 through a conventional LOCOS (local oxidation of silicon) process to realize device isolation (see FIGS. 30A and 30B). The peripheral circuit gate oxide film 247 having a thickness of 13.5 nm, for example, is arranged on the surface of an active region defined by the field oxide film 203, and channel doping is performed. Then, a non-doped polysilicon film is arranged on the p-substrate 201, and PSG is deposited thereon. Then, phosphorous is dispersed onto the non-doped polysilicon film through a thermal dispersion process to create a polysilicon film. After removing the PSG, a patterning process is performed on the polysilicon film through photomechanical processing and etching to create the peripheral circuit gate 225 on the field oxide film 203 and the peripheral circuit gate oxide film 247 at a peripheral circuit transistor region. Then, the field oxide film 203 and the peripheral circuit gate 225 are used as masks to remove the oxide film arranged on the p-substrate 201. In one embodiment, the peripheral circuit transistor region may be covered using the photomechanical processing upon removing the oxide film (see FIG. 31A).

(2) The gate oxide films 243 and 245 having a thickness of 7.5 nm, for example, are created by performing a thermal oxidation process. In this case, the silicon oxide film 251 is created on the surface of the peripheral circuit gate 225. Then, a non-doped polysilicon film is arranged on the p-substrate 201, after which phosphorous is implanted into the non-doped polysilicon film to realize a concentration of $5.0 \times 10^{15}$ atoms/cm$^2$ to create the polysilicon film 227 (see FIG. 31B).

(3) Through photomechanical processing and etching, the selection gate 213 is created on the field oxide film 203 and the selection gate oxide film 243 at a selection transistor region from the polysilicon film 227, and the floating gate 217 is created on the field oxide film 203 and the memory gate oxide film 245 at a memory transistor region from the polysilicon film 227 (see FIG. 31C).

In one embodiment, a HTO film may be arranged on the polysilicon film 227 before performing a patterning process thereon, and the patterning process may be performed on the HTO film and the polysilicon film 227 through photomechanical processing and etching to create a HTO film pattern on the selection gate 213 and the floating gate 217. In this way, $BF_2$ may be prevented from being implanted into the selection gate 213 and the floating gate 217 in a $BF_2$ (4) Then, $BF_2$ is implanted through ion implantation using the selection gate 213, the floating gate 217, and the peripheral circuit gate 225 as masks to create p-type diffusion layers 205, 207, 209, 219, and 221 (see FIGS. 30A-30D).

According to the present embodiment, the impurity concentration within the selection gate 213 is arranged to be equal to the impurity concentration within the floating gate 217, and thereby, the two gates 213 and 217 may be created simultaneously. In this way, the number of processes required for creating these gates may be reduced compared to a case of creating the selection gate 213, the floating gate 217, and the peripheral circuit gate 225 separately.

Also, in the present embodiment, the selection gate oxide film 243 is arranged to have the same thickness as that of the memory gate oxide film 245, and thereby, the two gate oxide films 243 and 245 may be created simultaneously, and the number of processes required for creating the gate oxide films may be reduced compared to a case of creating the selection gate oxide film 243, the memory gate oxide film 245, and the peripheral circuit gate oxide film 247 separately.

Figure 32A:
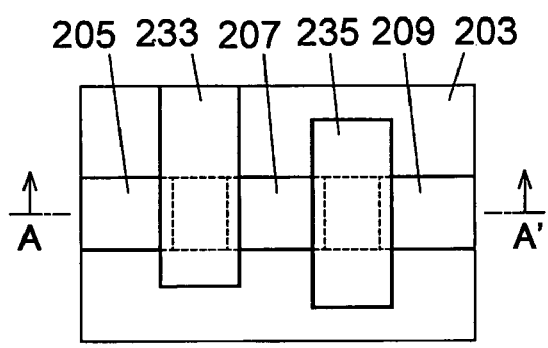
FIGS. 32A-32D are diagrams illustrating a thirteenth embodiment of the present invention, FIG. 32A being a plan view of a memory cell, FIG. 32B being a plan view of a peripheral circuit transistor, FIG. 32C being a cross-sectional view of the memory cell of FIG. 32A cut across line A-A', and FIG. 32D being a cross-sectional view of the peripheral circuit transistor of FIG. 32B cut across line B-B'.
Figure 32B:
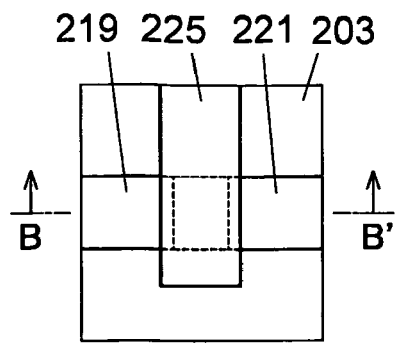
Figure 32C:
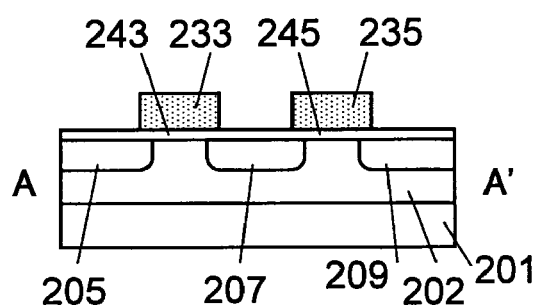
Figure 32D:
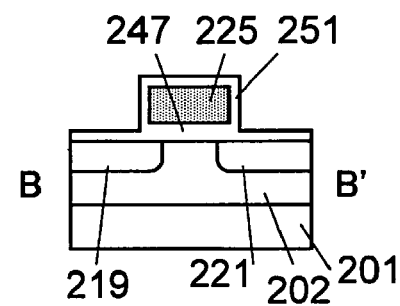

FIGS. 32A through 32D are diagrams illustrating a thirteenth embodiment of the present invention. FIG. 32A is a plan view of a memory cell, FIG. 32B is a plan view of a peripheral circuit transistor, FIG. 32C is a cross-sectional view of the memory cell of FIG. 32A cut across line A-A', and FIG. 32D is a cross-sectional view of the peripheral circuit transistor of FIG. 32B cut across line B-B'. It is noted that components that are identical to those shown in FIGS. 16A-16D, FIGS. 20A-20D, FIGS. 26A-26D, and FIGS. 30A-30D are given the same numerical references and their descriptions are omitted.

The present embodiment differs from the twelfth embodiment as is described above with reference to FIGS. 30A-30D in that a p-type impurity such as boron is introduced into the polysilicon of a selection gate 233 and a floating gate 235 instead of introducing phosphorous therein as in the twelfth embodiment. The boron concentration within the selection gate 233 and the floating gate 235 may be $7.0 \times 10^{18}$ to $5.0 \times 10^{19}$ atoms/cm$^3$, for example.

In the present embodiment, the impurity concentration within the floating gate 235 is arranged to be lower than the impurity concentration within the peripheral circuit gate 225 as in the seventh embodiment described above with reference to FIGS. 20A-20D, and thereby, charge retaining characteristics of the memory transistor may be improved. Also, since the impurity concentration within the peripheral circuit gate 225 is arranged to be higher than the impurity concentration within the floating gate 235, the resistance of the peripheral circuit gate 225 may be adequately lowered, and the processing speed of the peripheral circuit transistor may be prevented from decreasing.

Also, in the present embodiment, the memory gate oxide film 245 is arranged to be thinner than the peripheral circuit gate oxide film 247 as in the tenth embodiment described above with reference to FIGS. 26A-26D, and thereby, writing may be suitably performed on the memory transistor while protecting the peripheral circuit gate oxide film 247 from damage and preventing the occurrence of snapback breakdown.

Figure 33A:
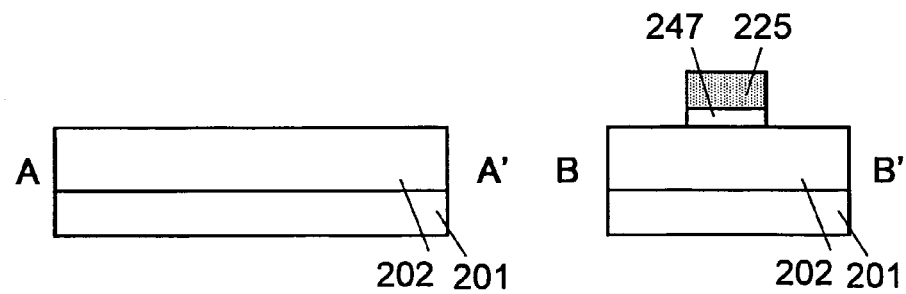
FIGS. 33A-33C are cross-sectional views illustrating exemplary process steps for fabricating the memory cell and the peripheral circuit transistor of the thirteenth embodiment.
Figure 33B:
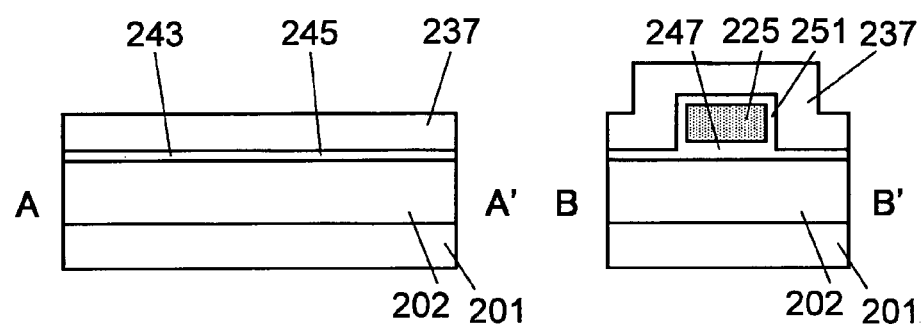
Figure 33C:
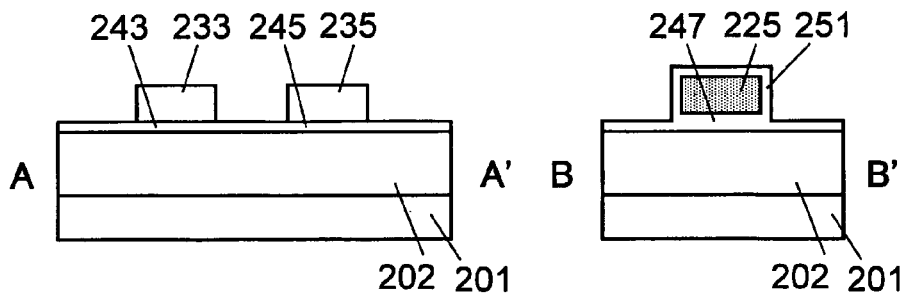

FIGS. 33A through 33C are cross-sectional views illustrating exemplary process steps for fabricating the memory cell and the peripheral circuit transistor of the thirteenth embodiment. It is noted that the cross-sectional views of FIGS. 33A-33C correspond to the cross-sectional views of FIGS. 32C and 32D cut across lines A-A' and B-B'. In the following, an exemplary method for fabricating the memory cell and the peripheral circuit transistor of the thirteenth embodiment is described with reference to FIGS. 32A-32D and FIGS. 33A-33C.

(1) An n-well 202, a field oxide film 203 (see FIGS. 32A and 32B), a peripheral circuit gate oxide film 247, and a peripheral circuit gate 225 are created through a process similar to the process step (1) described above with reference to FIG. 31A (see FIG. 33A).

(2) The gate oxide films 243 and 245 having a thickness of 7.5 nm, for example, are created through a thermal oxidation process. In this case a silicon oxide film 51 is arranged on the surface of the peripheral circuit gate 225. Then, a non-doped polysilicon film 237 is arranged on the p-substrate 201 (see FIG. 33B).

(3) Through photomechanical processing and etching, the selection gate 233 is created on the field oxide film 203 and the selection gate oxide film 243 at the selection transistor region from the non-doped polysilicon film 237, and the floating gate 235 is created on the field oxide film 203 and the memory gate oxide film 245 at the memory transistor region from the non-doped polysilicon film 237 (see FIG. 33C).

(4) Through an ion implantation process, $BF_2$ is implanted at a concentration of $3.0 \times 10^{15}$ to $5.0 \times 10^{15}$ atoms/cm$^3$ using the selection gate 233, the floating gate 235, and the peripheral circuit gate 225 as masks to create p-type diffusion layers 205, 207, 209, 219, and 221. Also, boron is implanted into the selection gate 233 and the floating gate 235 (see FIGS. 32A-32D).

According to the present embodiment, the impurity concentration within the selection gate 233 is arranged to be equal to the impurity concentration within the floating gate 235, and thereby, the two gates 233 and 235 may be created simultaneously. In this way, the number of processes required for creating these gates may be reduced compared to a case of creating the selection gate 233, the floating gate 235, and the peripheral circuit gate 225 separately.

Also, in the present embodiment, the selection gate oxide film 243 is arranged to have the same thickness as that of the memory gate oxide film 245, and thereby, the two gate oxide films 243 and 245 may be created simultaneously, and the number of processes required for creating the gate oxide films may be reduced compared to a case of creating the selection gate oxide film 243, the memory gate oxide film 245, and the peripheral circuit gate oxide film 247 separately.

It is noted that in the embodiments described with reference to FIGS. 26A-26D, FIGS. 28A-28D, FIGS. 30A-30D, and FIGS. 32A-32D, the selection gate oxide film 243 and the memory gate oxide film 245 are arranged to have the same thickness, and the peripheral circuit gate oxide film 247 is arranged to differ in thickness with respect to the selection gate oxide film 243 and the memory gate oxide film 245; however the present invention is not limited to such an embodiment, and the gate oxide films 243, 245, and 247 may be arranged to have the same thickness, for example.

Figure 34A:
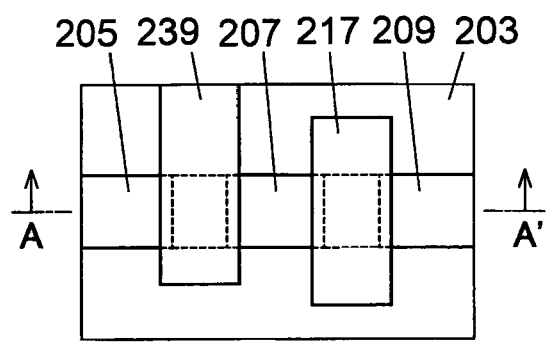
FIGS. 34A-34D are diagrams illustrating a fourteenth embodiment of the present invention, FIG. 34A being a plan view of a memory cell, FIG. 34B being a plan view of a peripheral circuit transistor, FIG. 34C being a cross-sectional view of the memory cell of FIG. 34A cut across line A-A', and FIG. 34D being a cross-sectional view of the peripheral circuit transistor of FIG. 34B cut across line B-B'.
Figure 34B:
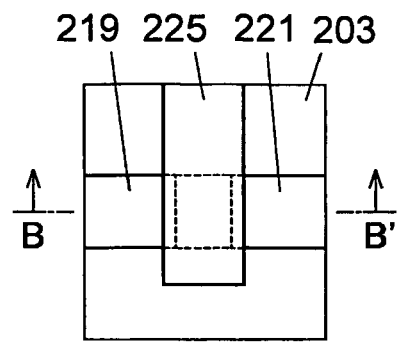
Figure 34C:
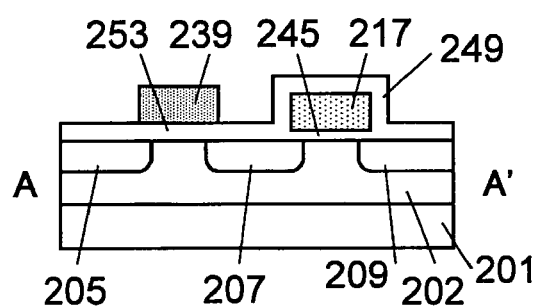
Figure 34D:
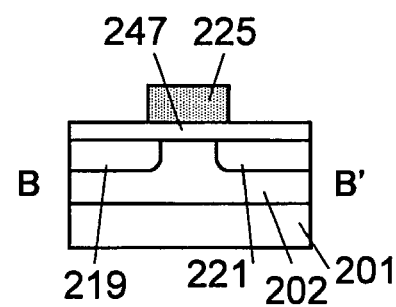

FIGS. 34A through 34D are diagrams illustrating a fourteenth embodiment of the present invention. FIG. 34A is a plan view of a memory cell, FIG. 34B is a plan view of a peripheral circuit transistor, FIG. 34C is a cross-sectional view of the memory cell of FIG. 34A cut across line A-A', and FIG. 34D is a cross-sectional view of the peripheral circuit transistor of FIG. 34B cut across line B-B'. It is noted that components that are identical to those shown in FIGS. 16A-16D, FIGS. 22A-22D, and FIGS. 26A-26D are given the same numerical references and their descriptions are omitted.

The present embodiment differs from the tenth embodiment as is described above with reference to FIGS. 26A-26D in that a selection gate oxide film 253 and a peripheral circuit gate oxide film 247 are created simultaneously, and the selection gate oxide film 253 is arranged to have a thickness of 10.0-15.0 nm, for example (13.5 nm in the present example).

Also, in the present embodiment, a selection gate 239 and a peripheral circuit gate 225 are created simultaneously, and an n-type impurity such as phosphorous is introduced into the selection gate 239 at a higher concentration than that for a floating gate 217. For example, the substantial phosphorous concentration within the selection gate 239 may be arranged to be at least $1.0 \times 10^{20}$ atoms/cm$^3$.

In the present embodiment, the impurity concentration within the floating gate 217 is arranged to be lower than the impurity concentration within the peripheral circuit gate 225 as in the sixth embodiment, and thereby, the charge retaining characteristics of the memory transistor may be improved.

Also, in the present embodiment, the impurity concentration within the peripheral circuit gate 225 and the selection gate 239 is arranged to be higher than the impurity concentration within the floating gate 217 as in the eighth embodiment as is described above with reference to FIGS. 22A-22D, and thereby, the resistance of the peripheral circuit gate 225 and the selection gate 239 may be adequately reduced so that the processing speed of the peripheral circuit transistor and the selection transistor may be prevented from decreasing.

Also, in the present embodiment, the memory gate oxide film 245 is arranged to be thinner than the peripheral circuit gate oxide film 247 as in the tenth embodiment as is described above with reference to FIGS. 26A-26D, and thereby, writing may be suitably performed on the memory transistor while protecting the peripheral circuit gate oxide film 247 from damage and preventing the occurrence of snapback breakdown.

Figure 35A:
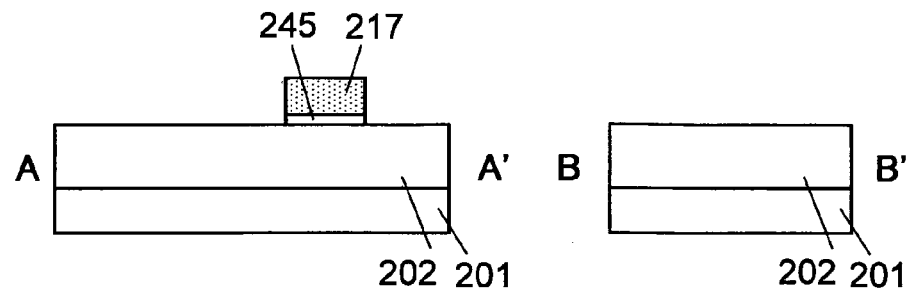
FIGS. 35A-35C are cross-sectional views illustrating exemplary process steps for fabricating the memory cell and the peripheral circuit transistor of the fourteenth embodiment.
Figure 35B:
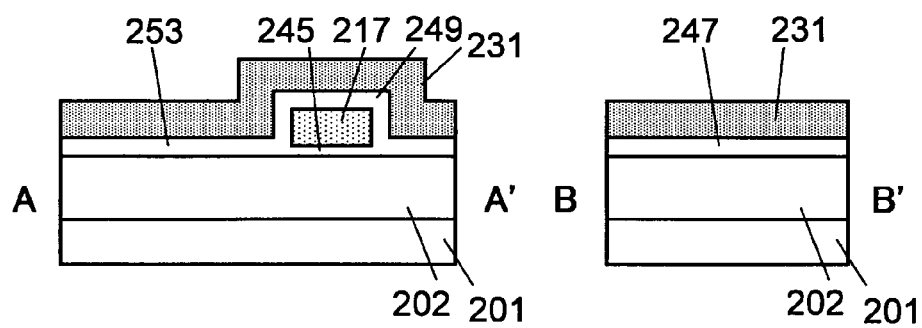
Figure 35C:
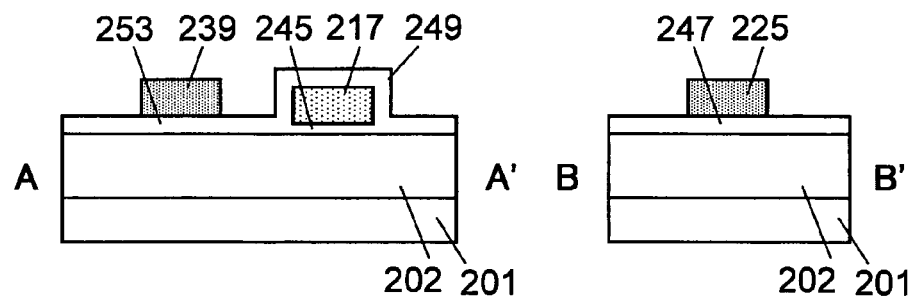

FIGS. 35A through 35C are cross-sectional views illustrating exemplary process steps for fabricating the memory cell and the peripheral circuit transistor of the fourteenth embodiment. It is noted that the cross-sectional views of FIGS. 35A-35C correspond to the cross-sectional views of FIGS. 34C and 34D cut across lines A-A' and B-B'. In the following, an exemplary method for fabricating the memory cell and the peripheral circuit transistor of the fourteenth embodiment is described with reference to FIGS. 34A-34D and FIGS. 35A-35C.

(1) An n-well 202, a field oxide film 203, the memory gate oxide film 245, and the floating gate 217 are created on a p-substrate 201 through a process similar to process step (1) as is described above with reference to FIG. 27A (see FIG. 35A).

(2) The gate oxide films 247 and 253 having a thickness of 13.5 nm, for example, are created by performing a thermal oxidation process. In this case, a silicon oxide film 249 is created on the surface of the floating gate 217. Then, a non-doped polysilicon film is arranged on the p-substrate 201, and PSG (not shown) is deposited thereon, after which phosphorous is thermally dispersed onto the non-doped polysilicon film to create a polysilicon film 231 (see FIG. 35B).

(3) After removing the PSG, photo mechanical processing and etching are performed to create the selection gate 239 on the field oxide film 203 and the selection gate oxide film 53 at the selection transistor region from the polysilicon film 231, and the peripheral circuit gate 225 created on the field oxide film 203 and the peripheral circuit gate oxide film 247 at the peripheral circuit transistor region from the polysilicon film 231 (see FIG. 35C).

(4) Then, BF$_2$ is implanted through ion implantation using the selection gate 239, the floating gate 217, and the peripheral circuit gate 225 as masks to create p-type diffusion layers 205, 207, 209, 219, and 221 (see FIGS. 34A-34D).

According to the present embodiment, the impurity concentration within the selection gate 239 is arranged to be equal to the impurity concentration within the peripheral circuit gate 225, and thereby, the two gates 225 and 239 may be created simultaneously. In this way, the number of processes required for creating these gates may be reduced compared to a case of creating the selection gate 239, the floating gate 217, and the peripheral circuit gate 225 separately.

Also, in the present embodiment, the selection gate oxide film 253 is arranged to have the same thickness as that of the peripheral circuit gate oxide film 247, and thereby, the two gate oxide films 247 and 253 may be created simultaneously, and the number of processes required for creating the gate oxide films may be reduced compared to a case of creating the selection gate oxide film 253, the memory gate oxide film 245, and the peripheral circuit gate oxide film 247 separately.

Figure 36A:
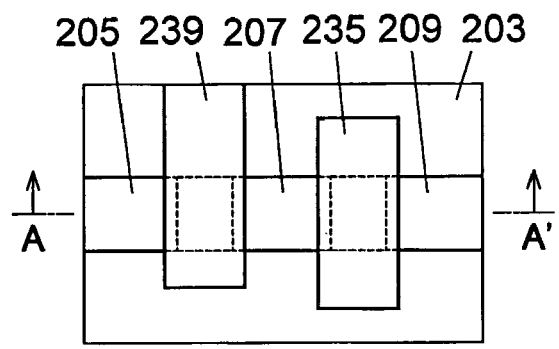
FIGS. 36A-36D are diagrams illustrating a fifteenth embodiment of the present invention, FIG. 36A being a plan view of a memory cell, FIG. 36B being a plan view of a peripheral circuit transistor, FIG. 36C being a cross-sectional view of the memory cell of FIG. 36A cut across line A-A', and FIG. 36D being a cross-sectional view of the peripheral circuit transistor of FIG. 36B cut across line B-B'.
Figure 36B:
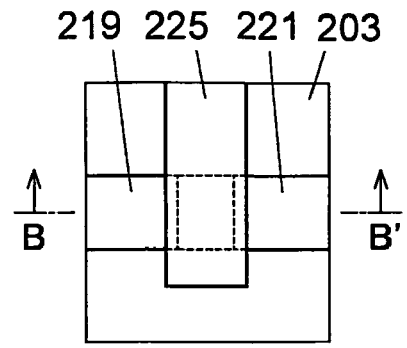
Figure 36C:
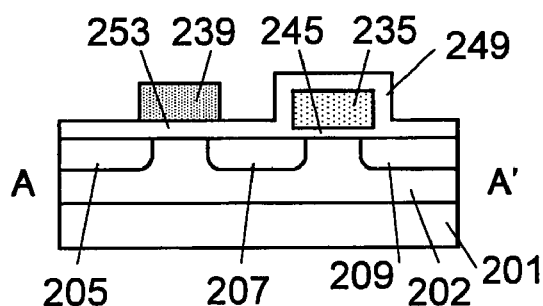
Figure 36D:
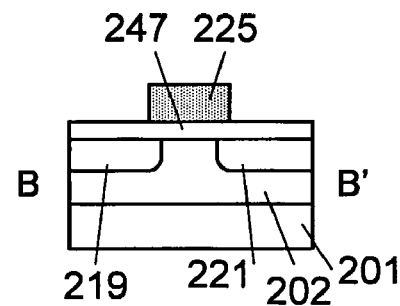

FIGS. 36A through 36D are diagrams illustrating a fifteenth embodiment of the present invention. FIG. 36A is a plan view of a memory cell, FIG. 36B is a plan view of a peripheral circuit transistor, FIG. 36C is a cross-sectional view of the memory cell of FIG. 36A cut across line A-A', and FIG. 36D is a cross-sectional view of the peripheral circuit transistor of FIG. 36B cut across line B-B'. It is noted that components that are identical to those shown in FIGS. 16A-16D, FIGS. 20A-20D, FIGS. 22A-22D, FIGS. 26A-26D, and FIGS. 34A-34D are given the same numerical references and their descriptions are omitted.

The present invention differs from the fourteenth embodiment as is described above with reference to FIGS. 34A-34D in that a p-type impurity such as boron is introduced into the polysilicon of a floating gate 235 instead of introducing phosphorous therein as in the fourteenth embodiment. The boron concentration within the floating gate 235 may be $7.0 \times 10^{18}$ to $5.0 \times 10^{19}$ atoms/cm$^3$, for example.

A silicon oxide film 249 is arranged on the surface of the floating gate 235.

According to the present embodiment, the impurity concentration within the floating gate 235 is arranged to be lower than the impurity concentration within the peripheral circuit gate 225 as in the seventh embodiment described in relation to FIGS. 20A-20D, and thereby, the charge retaining characteristics of the memory transistor may be improved.

Also, in the present embodiment, a memory gate oxide film 245 is arranged to be thinner than the peripheral circuit gate oxide film 247 as in the tenth embodiment described in relation to FIGS. 26A-26D, and thereby, and thereby, writing may be suitably performed on the memory transistor while protecting the peripheral circuit gate oxide film 247 from damage and preventing the occurrence of snapback breakdown.

Figure 37A:
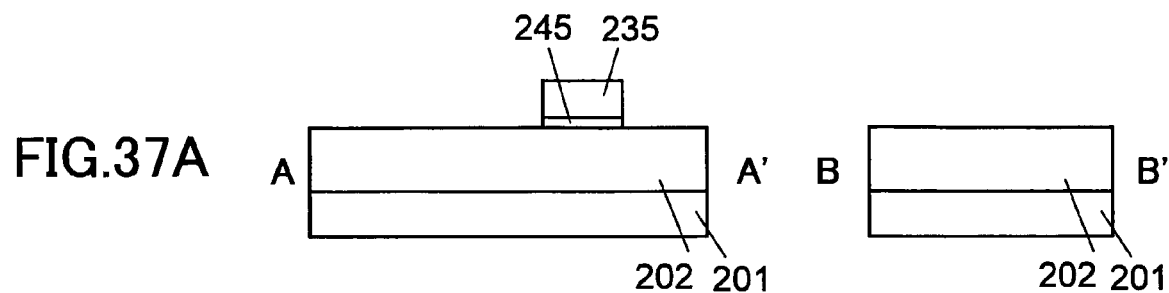
FIGS. 37A-37C are cross-sectional views illustrating exemplary process steps for fabricating the memory cell and the peripheral circuit transistor of the fifteenth embodiment.
Figure 37B:
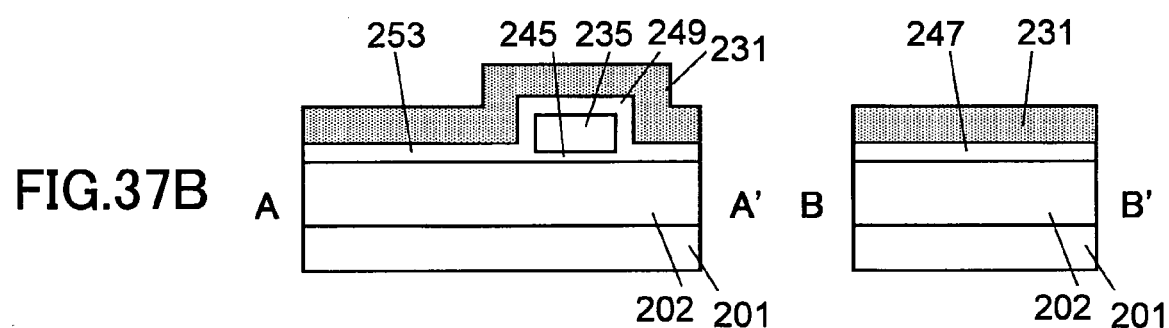
Figure 37C:
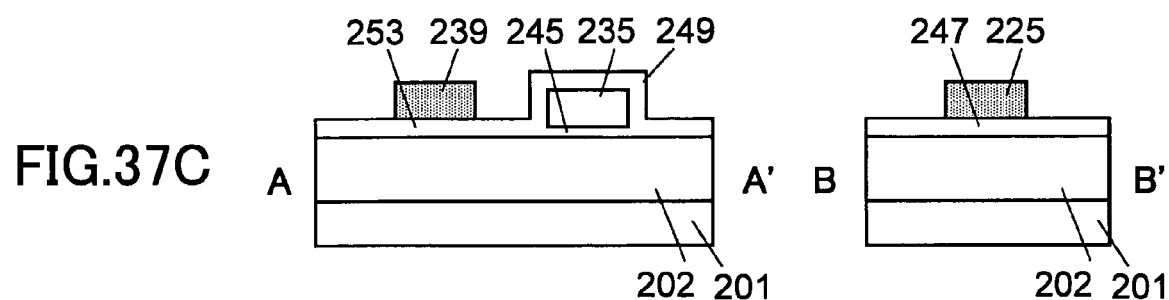

FIGS. 37A through 37C are cross-sectional views illustrating exemplary process steps for fabricating the memory cell and the peripheral circuit transistor of the fifteenth embodiment. It is noted that the cross-sectional views of FIGS. 37A-37C correspond to the cross-sectional views of FIGS. 36C and 36D cut across lines A-A' and B-B'. In the following, an exemplary method for fabricating the memory cell and the peripheral circuit transistor of the fifteenth embodiment is described with reference to FIGS. 36A-36D and FIGS. 37A-37C.

(1) An n-well 202, a field oxide film 203 (see FIGS. 36A and 36B), a gate oxide film 245, and a floating gate 235 are created on a p-substrate 201 through a process similar to the process step (1) as is described above with reference to FIG. 29A (see FIG. 37A).

(2) The gate oxide films 247, 253, and the silicon oxide film 249 are created, after which a polysilicon film 231 is created through a process similar to the process step (2) as is described above with reference to FIG. 35B (see FIG. 37B).

(3) The selection gate 239 is created on the field oxide film 203 and the selection gate oxide film 253 at the selection transistor region, and a peripheral circuit gate 225 is created on the field oxide film 203 and the peripheral circuit gate oxide film 247 at the peripheral circuit transistor region through a process similar to the process step (3) described above with reference to FIG. 35C (see FIG. 37C).

(4) Then, $BF_2$ is implanted to realize a concentration around $3.0 \times 10^{15}$ to $5.0 \times 10^{15}$ atoms/cm³ through an ion implantation process using the selection gate 239, the floating gate 235, and the peripheral circuit gate 225 as masks to create p-type diffusion layers 205, 207, 209, 219, and 221. Also, boron implantation is performed on the floating gate 235 (see FIGS. 36A-36D).

According to the present embodiment, the impurity concentration within the selection gate 239 is arranged to be equal to the impurity concentration of the peripheral circuit gate 225, and thereby, the two gates 225 and 239 may be created simultaneously. In this way, the number of processes required for creating these gates may be reduced compared to a case of creating the selection gate 239, the floating gate 235, and the peripheral circuit gate 225 separately.

Also, according to the present embodiment, the selection gate oxide film 253 and the peripheral circuit gate oxide film 247 are arranged to have the same thickness, and thereby, the two gate oxide films 247 and 253 may be created simultaneously. In this way, the number of processes required for creating these gate oxide films may be reduced compared to a case of creating the selection gate oxide film 253, the memory gate oxide film 245, and the peripheral circuit gate oxide film 247 separately.

Figure 38A:
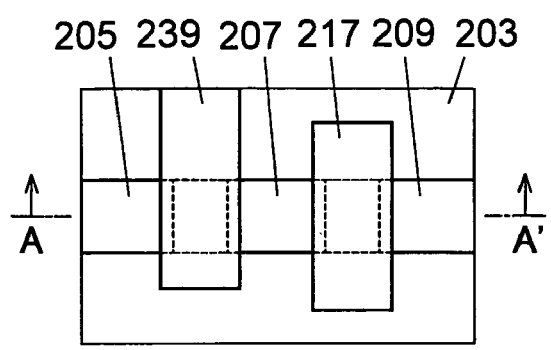
FIGS. 38A-38D are diagrams illustrating a sixteenth embodiment of the present invention, FIG. 38A being a plan view of a memory cell, FIG. 38B being a plan view of a peripheral circuit transistor, FIG. 38C being a cross-sectional view of the memory cell of FIG. 38A cut across line A-A', and FIG. 38D being a cross-sectional view of the peripheral circuit transistor of FIG. 38B cut across line B-B'.
Figure 38B:
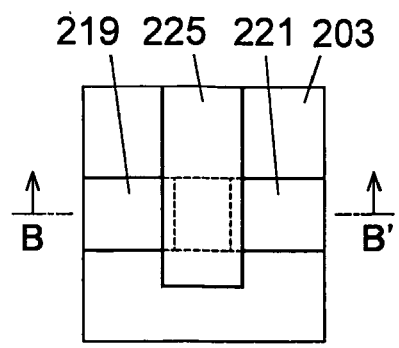
Figure 38C:
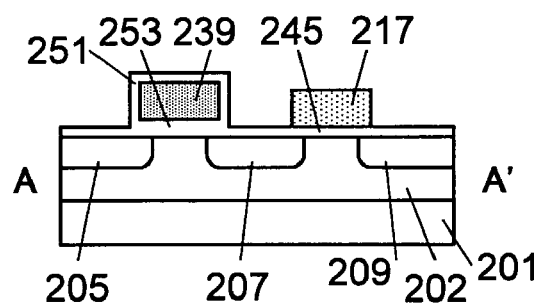
Figure 38D:
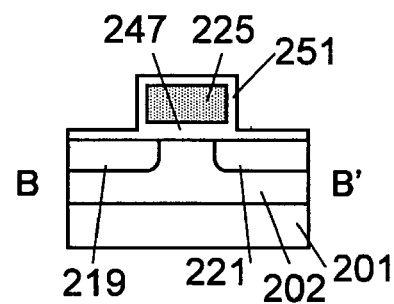

FIGS. 38A through 38D are diagrams illustrating a sixteenth embodiment of the present invention. FIG. 38A is a plan view of a memory cell, FIG. 38B is a plan view of a peripheral circuit transistor, FIG. 38C is a cross-sectional view of the memory cell of FIG. 38A cut across line A-A', and FIG. 38D is a cross-sectional view of the peripheral circuit transistor of FIG. 38B cut across line B-B'. It is noted that components that are identical to those shown in FIGS. 16A-16D, FIGS. 22A-22D, FIGS. 26A-26D, FIGS. 30A-30D, and FIGS. 34A-34D are given the same numerical references and their descriptions are omitted.

The present embodiment differs from the tenth embodiment described above with reference to FIGS. 26A-26D in that the silicon oxide film 249 is not arranged on the surface of the floating gate 217, and instead, a silicon oxide film 251 is arranged on the surfaces of a peripheral circuit gate 225 and the selection gate 239.

In the present embodiment, the impurity concentration within a floating gate 217 is arranged to be lower than the impurity concentration within the peripheral circuit gate 225 as in the sixth embodiment described with reference to FIGS. 16A-16D, and thereby, charge retaining characteristics of the memory transistor may be improved.

Also, in the present embodiment, since the impurity concentration within the peripheral circuit gate 225 and the selection gate 239 is arranged to be higher than the impurity concentration within the floating gate 217 as in the eighth embodiment described with reference to FIGS. 22A-22D, the resistance of the peripheral circuit gate 225 may be adequately lowered so that the processing speed of the peripheral circuit transistor and the selection transistor may be prevented from decreasing.

Also, in the present embodiment, a memory gate oxide film 245 is arranged to be thinner than a peripheral circuit gate oxide film 247, and thereby, writing may be suitably performed on the memory transistor while protecting the peripheral circuit gate oxide film 247 from damage and preventing the occurrence of snapback breakdown.

Figure 39A:
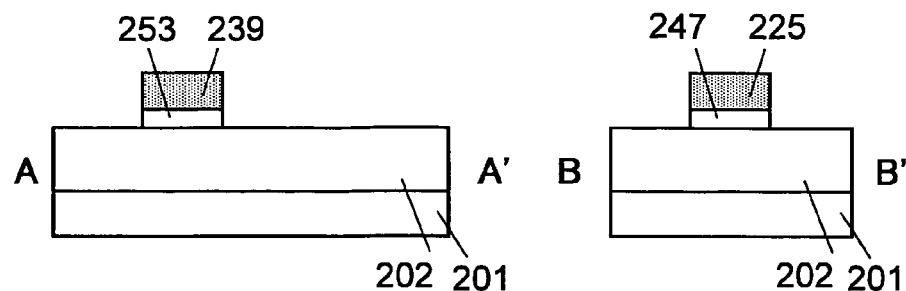
FIGS. 39A-39C are cross-sectional views illustrating exemplary process steps for fabricating the memory cell and the peripheral circuit transistor of the sixteenth embodiment.
Figure 39B:
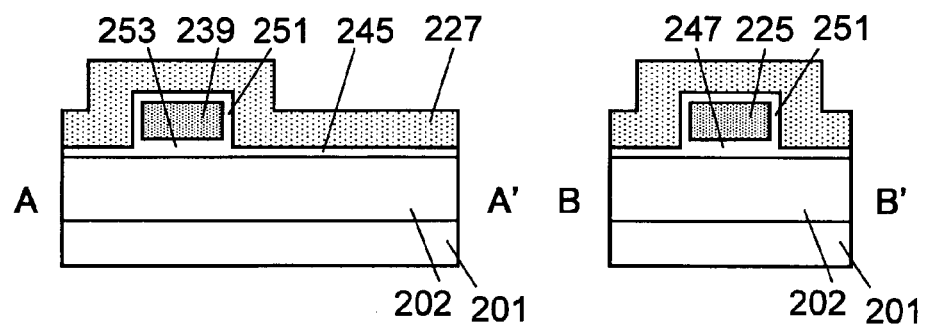
Figure 39C:
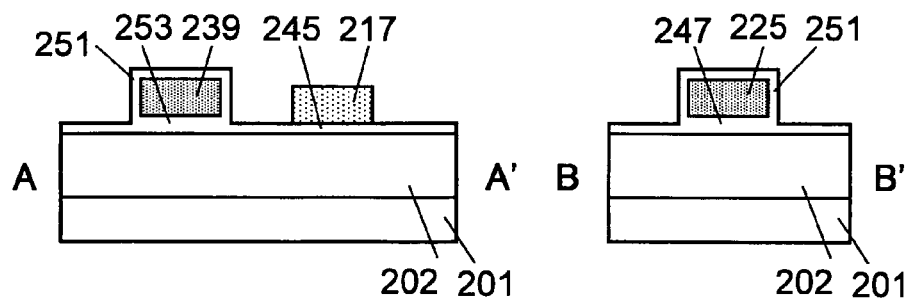

FIGS. 39A through 39C are cross-sectional views illustrating exemplary process steps for fabricating the memory cell and the peripheral circuit transistor of the sixteenth embodiment. It is noted that the cross-sectional views of FIGS. 39A-39C correspond to the cross-sectional views of FIGS. 38C and 38D cut across lines A-A' and B-B'. In the following, an exemplary method for fabricating the memory cell and the peripheral circuit transistor of the sixteenth embodiment is described with reference to FIGS. 38A-38D and FIGS. 39A-39C.

(1) An n-well 202, a field oxide film 203 (see FIGS. 38A and 38B), a peripheral circuit gate oxide film 247, a selection gate oxide film 253, a peripheral circuit gate 225, and a selection gate 239 are created on a p-substrate 201 through a process similar to the process step (1) as is described above with reference to FIG. 31A (see FIG. 39A).

(2) The memory gate oxide film 245 and the silicon oxide film 251 are created, after which a polysilicon film 227 is created through a process similar to the process step (2) as is described above with reference to FIG. 31B (see FIG. 39B).

(3) The floating gate 217 is created on the field oxide film 203 and the memory gate oxide film 245 at a memory transistor region through a process similar to the process step (3) described above with reference to FIG. 31C (see FIG. 39C).

(4) Then, $BF_2$ is implanted through an ion implantation process using the selection gate 239, the floating gate 217, and the peripheral circuit gate 225 as masks to create p-type diffusion layers 205, 207, 209, 219, and 221 (see FIGS. 38A-38D).

According to the present embodiment, the impurity concentration within the selection gate 239 is arranged to be equal to the impurity concentration within the peripheral circuit gate 225, and thereby, the two gates 225 and 239 may be created simultaneously. In this way, the number of processes required for creating these gates may be reduced compared to a case of creating the selection gate 239, the floating gate 217, and the peripheral circuit gate 225 separately.

Also, in the present embodiment, the selection gate oxide film 253 is arranged to have the same thickness as that of the peripheral circuit gate oxide film 247, and thereby, the two gate oxide films 247 and 253 may be created simultaneously, and the number of processes required for creating the gate oxide films may be reduced compared to a case of creating the selection gate oxide film 253, the memory gate oxide film 245, and the peripheral circuit gate oxide film 247 separately.

Figure 40A:
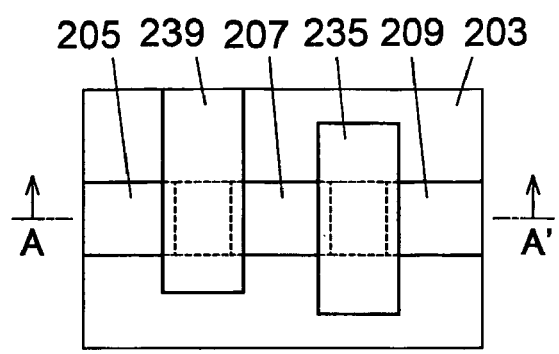
FIGS. 40A-40D are diagrams illustrating a seventeenth embodiment of the present invention, FIG. 40A being a plan view of a memory cell, FIG. 40B being a plan view of a peripheral circuit transistor, FIG. 40C being a cross-sectional view of the memory cell of FIG. 40A cut across line A-A', and FIG. 40D being a cross-sectional view of the peripheral circuit transistor of FIG. 40B cut across line B-B'.
Figure 40B:
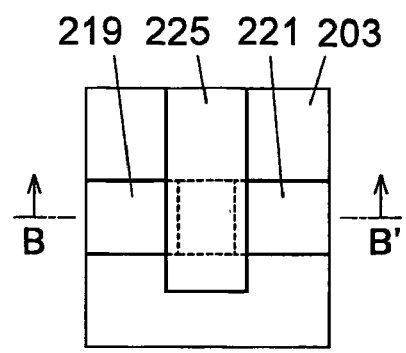
Figure 40C:
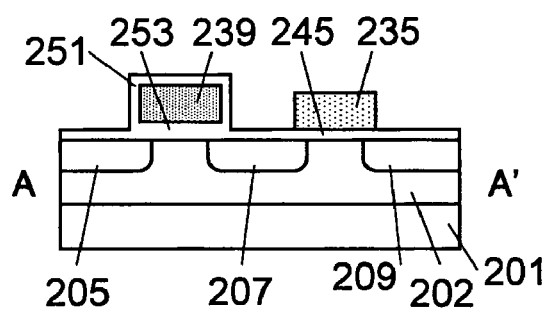
Figure 40D:
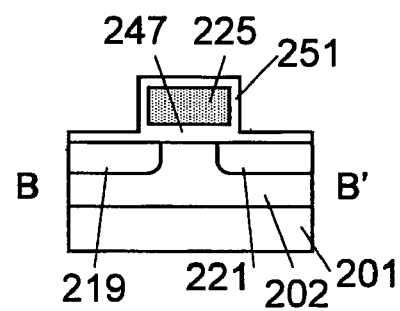

FIGS. 40A through 40D are diagrams illustrating a seventeenth embodiment of the present invention. FIG. 40A is a plan view of a memory cell, FIG. 40B is a plan view of a peripheral circuit transistor, FIG. 40C is a cross-sectional view of the memory cell of FIG. 40A cut across line A-A', and FIG. 40D is a cross-sectional view of the peripheral circuit transistor of FIG. 40B cut across line B-B'. It is noted that components that are identical to those shown in FIGS. 16A-16D, FIGS. 20A-20D, FIGS. 22A-22D, FIGS. 26A-26D, FIGS. 30A-30D, and FIGS. 34A-34D are given the same numerical references and their descriptions are omitted.

The present embodiment differs from the sixteenth embodiment as is described above with reference to FIGS. 38A-38D in that a p-type impurity such as boron is introduced into the polysilicon of a floating gate 235 instead of phosphorous. The boron concentration within the floating gate 235 may be around $7.0 \times 10^{18}$ to $5.0 \times 10^{19}$ atoms/cm$^3$, for example.

In the present embodiment, the impurity concentration within the floating gate 235 is arranged to be lower than the impurity concentration within a peripheral circuit gate 225 as in the seventh embodiment described above with reference to FIGS. 20A-20D, and thereby, charge retaining characteristics of the memory transistor may be improved.

Also, since the impurity concentration within the peripheral circuit gate 225 and a selection gate 239 is arranged to be higher than the impurity concentration within the floating gate 235, the resistance of the peripheral circuit gate 225 and the selection gate 239 may be adequately lowered, and the processing speed of the peripheral circuit transistor and the selection gate may be prevented from decreasing.

Also, in the present embodiment, the memory gate oxide film 245 is arranged to be thinner than the peripheral circuit gate oxide film 247 as in the tenth embodiment described above with reference to FIGS. 26A-26D, and thereby, writing may be suitably performed on the memory transistor while protecting the peripheral circuit gate oxide film 247 from damage and preventing the occurrence of snapback breakdown.

Figure 41A:
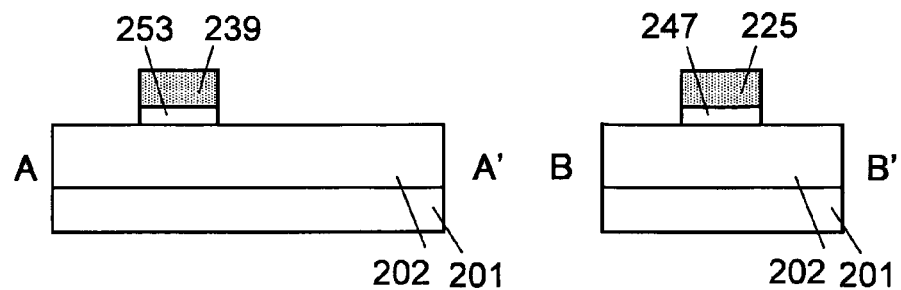
FIGS. 41A-41C are cross-sectional views illustrating exemplary process steps for fabricating the memory cell and the peripheral circuit transistor of the seventeenth embodiment.
Figure 41B:
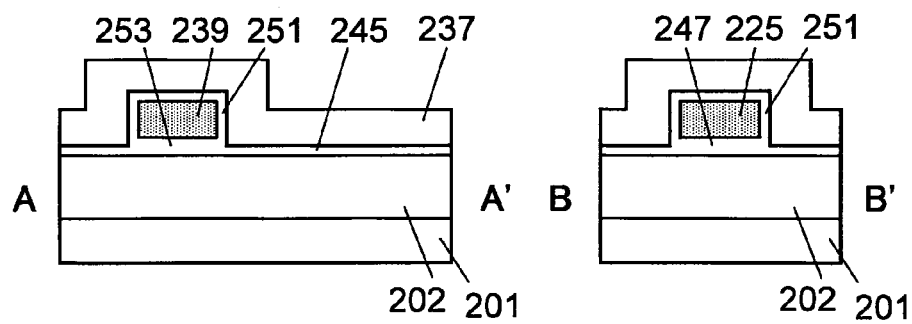
Figure 41C:
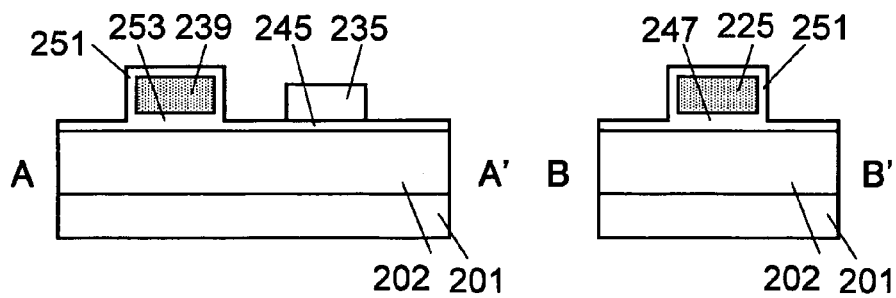

FIGS. 41A through 41C are cross-sectional views illustrating exemplary process steps for fabricating the memory cell and the peripheral circuit transistor of the seventeenth embodiment. It is noted that the cross-sectional views of FIGS. 41A-41C correspond to the cross-sectional views of FIGS. 40C and 40D cut across lines A-A' and B-B'. In the following, an exemplary method for fabricating the memory cell and the peripheral circuit transistor of the seventeenth embodiment is described with reference to FIGS. 40A-40D and FIGS. 41A-41C.

(1) An n-well 202, a field oxide film 203 (see FIGS. 40A and 40B), a peripheral circuit gate oxide film 247, a selection gate oxide film 253, a peripheral circuit gate 225, and a selection gate 239 are created through a process similar to the process step (1) described above with reference to FIG. 31A (see FIG. 41A).

(2) The memory gate oxide film 245 having a thickness of 7.5 nm, for example, is created through a thermal oxidation process. In this case a silicon oxide film 51 is arranged on the surfaces of the peripheral circuit gate 225 and the selection gate 239. Then, a non-doped polysilicon film 237 is arranged on the p-substrate 201 (see FIG. 41B).

(3) Through photomechanical processing and etching, the floating gate 235 is created on the field oxide film 203 and the memory gate oxide film 245 at a memory transistor region from the non-doped polysilicon film 237 (see FIG. 41C).

(4) Through an ion implantation process, BF$_2$ is implanted at a concentration of around $3.0 \times 10^{15}$ to $5.0 \times 10^{15}$ atoms/cm$^3$, for example, using the selection gate 239, the floating gate 235, and the peripheral circuit gate 225 as masks to create p-type diffusion layers 205, 207, 209, 219, and 221. Also, boron is implanted into the floating gate 235 (see FIGS. 40A-40D).

According to the present embodiment, the impurity concentration within the selection gate 239 is arranged to be equal to the impurity concentration within the floating gate 235, and thereby, the two gates 239 and 235 may be created simultaneously. In this way, the number of processes required for creating these gates may be reduced compared to a case of creating the selection gate 239, the floating gate 235, and the peripheral circuit gate 225 separately.

Also, in the present embodiment, the selection gate oxide film 253 is arranged to have the same thickness as that of the peripheral circuit gate oxide film 247, and thereby, the two gate oxide films 253 and 247 may be created simultaneously, and the number of processes required for creating the gate oxide films may be reduced compared to a case of creating the selection gate oxide film 253, the memory gate oxide film 245, and the peripheral circuit gate oxide film 247 separately.

Figure 42A:
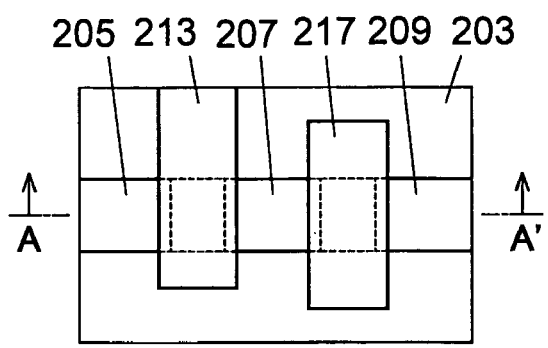
FIGS. 42A-42D are diagrams illustrating an eighteenth embodiment of the present invention, FIG. 42A being a plan view of a memory cell, FIG. 42B being a plan view of a peripheral circuit transistor, FIG. 42C being a cross-sectional view of the memory cell of FIG. 42A cut across line A-A', and FIG. 42D being a cross-sectional view of the peripheral circuit transistor of FIG. 42B cut across line B-B'.
Figure 42B:
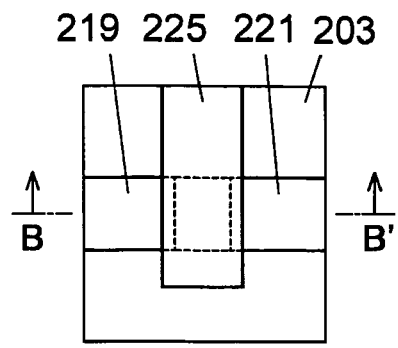
Figure 42C:
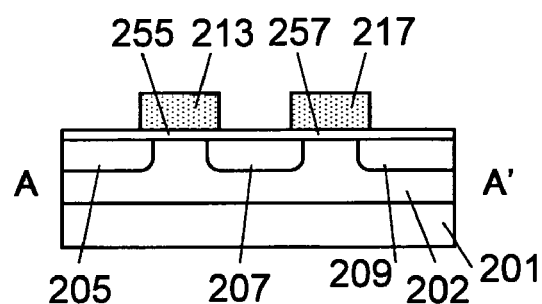
Figure 42D:
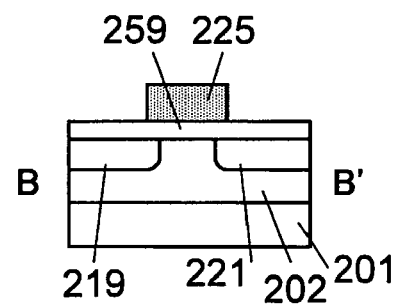

FIGS. 42A through 42D are diagrams illustrating an eighteenth embodiment of the present invention. FIG. 42A is a plan view of a memory cell, FIG. 42B is a plan view of a peripheral circuit transistor, FIG. 42C is a cross-sectional view of the memory cell of FIG. 42A cut across line A-A', and FIG. 42D is a cross-sectional view of the peripheral circuit transistor of FIG. 42B cut across line B-B'. It is noted that components that are identical to those shown in FIGS. 16A-16D are given the same numerical references and their descriptions are omitted.

According to the present embodiment, an n-well 202 is created at a predetermined region of a p-substrate 201, and a field oxide film 203 is arranged on the surface of the p-substrate 201.

A selection transistor realized by p-type diffusion layers 205, 207, a selection gate oxide film 243, and a selection gate 213 is arranged at a selection transistor region.

A memory transistor realized by p-type diffusion layers 207, 209, a memory gate oxide film 245, and a floating gate 217 is arranged at a memory transistor region.

A peripheral circuit transistor realized by p-type diffusion layers 219 and 221, a peripheral circuit gate oxide film 259, and a peripheral circuit gate 225 is arranged at a peripheral circuit transistor region.

In the present embodiment, the selection gate oxide film 255 and the memory gate oxide film 257 are created in the same process by performing an oxidation process once. The peripheral circuit gate oxide film 259 is created in a separate process by performing the oxidation process two times. The selection gate oxide film 255 and the memory gate oxide film 257 may be arranged to have a thickness of 6.0-10.0 nm, for example (7.5 nm in the present example). The peripheral circuit gate oxide film 259 may be arranged to have a thickness of 10.0-15.0 nm, for example (13.5 nm in the present example).

In the present embodiment, advantageous effects similar to those obtained in the sixth embodiment as is described above with reference to FIGS. 16A-16D may be obtained.

Also, in the present embodiment, the memory gate oxide film 257 is arranged to be thinner than the peripheral circuit gate oxide film 259. Accordingly, the peripheral circuit gate oxide film 259 may be arranged to be adequately thick so that it may be protected from damage when a writing operation is performed on the memory transistor, and the memory gate oxide film 257 may be arranged to be adequately thin so that good writing characteristics may be obtained in the memory transistor. In this way, writing may be suitably performed on the memory transistor while protecting the peripheral circuit gate oxide film 247 from damage and preventing the occurrence of snapback breakdown.

Figure 43A:
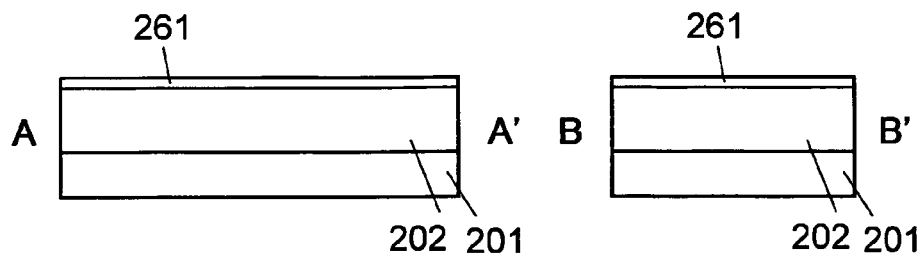
FIGS. 43A-43C are cross-sectional views illustrating exemplary process steps for fabricating the memory cell and the peripheral circuit transistor of the eighteenth embodiment.
Figure 43B:
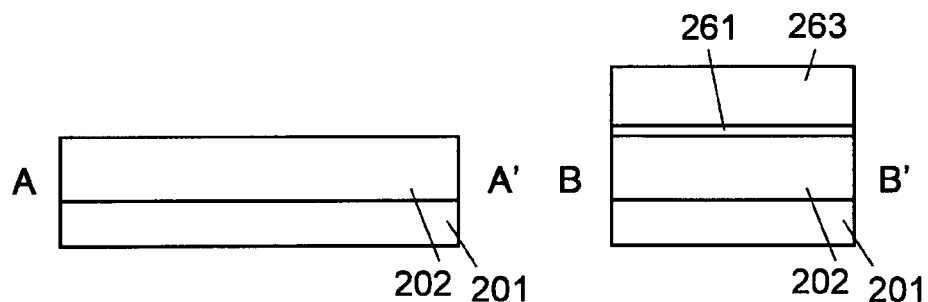
Figure 43C:
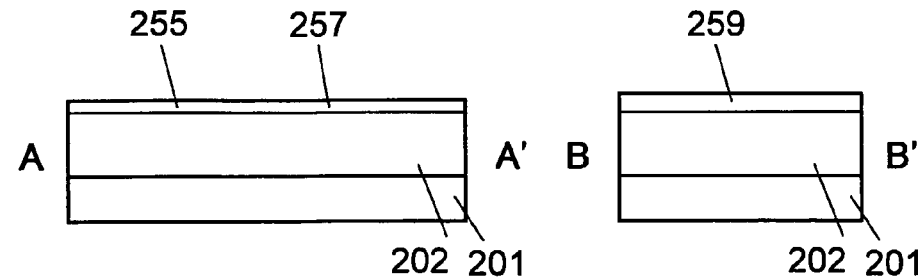

FIGS. 43A through 43C are cross-sectional views illustrating exemplary process steps for fabricating the memory cell and the peripheral circuit transistor of the eighteenth embodiment. It is noted that the cross-sectional views of FIGS.

43A-43C correspond to the cross-sectional views of FIGS. 42C and 42D cut across lines A-A' and B-B'. In the following, an exemplary method for fabricating the memory cell and the peripheral circuit transistor of the eighteenth embodiment is described with reference to FIGS. 42A-42D and FIGS. 43A-43C.

(1) After creating the n-well 202 at the p-substrate 201, the field oxide film 203 is arranged on the p-substrate 201 through a conventional LOCOS (local oxidation of silicon) process to realize device isolation (see FIGS. 42A and 42B). Then, a sacrificial oxide film 261 having a thickness of 6-16 nm, for example, is created on the surface of an active region defined by the field oxide film 203, and channel doping is performed (see FIG. 43A).

(2) A resist pattern 263 is created that covers a peripheral circuit transistor formation region and has opening portions at a selection transistor formation region and a memory transistor formation region. Then, the sacrificial oxide film 261 at the selection transistor region and the memory transistor region is selectively removed using the resist pattern 63 as a mask (see FIG. 43B).

(3) After removing the resist pattern 263, the selection gate oxide film 255 and the memory gate oxide film 257 each having a thickness of 7.5 nm, for example, are created on the surface of the n-well 202 at the selection transistor region and the memory transistor region by performing a thermal oxidation process. In this process, the sacrificial oxide film 261 at the peripheral circuit transistor region grows in thickness to become the peripheral circuit gate oxide film 259 (see FIG. 43C).

(4) By performing processes similar to process steps (1) through (3) as is described above with reference to FIGS. 19A-19C, the selection gate 213 is created on the field oxide film 203 and the selection gate oxide film 255 at the selection transistor region, the floating gate 217 is created at the field oxide film 203 and the memory gate oxide film 257 at the memory transistor region, and the peripheral circuit gate 225 is created on the field oxide film 203 and the peripheral circuit gate oxide film 259 at the peripheral circuit transistor region. Then, the p-type diffusion layers 205, 207, 209, 219, and 221 are created through a process similar to process step (4) as is described above with reference to FIGS. 16A-16D (see FIGS. 42A-42D).

Figure 44A:
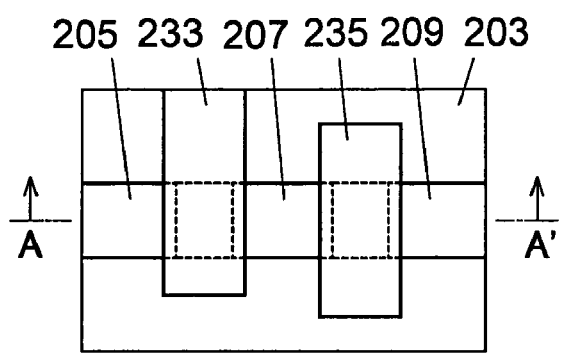
FIGS. 44A-44D are diagrams illustrating a nineteenth embodiment of the present invention, FIG. 44A being a plan view of a memory cell, FIG. 44B being a plan view of a peripheral circuit transistor, FIG. 44C being a cross-sectional view of the memory cell of FIG. 44A cut across line A-A', and FIG. 44D being a cross-sectional view of the peripheral circuit transistor of FIG. 44B cut across line B-B'.
Figure 44B:
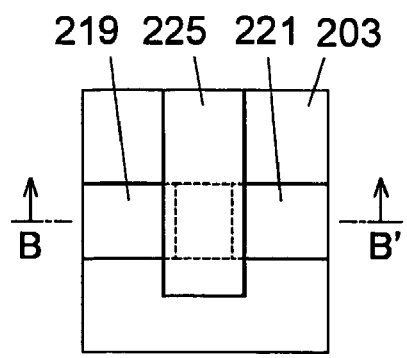
Figure 44C:
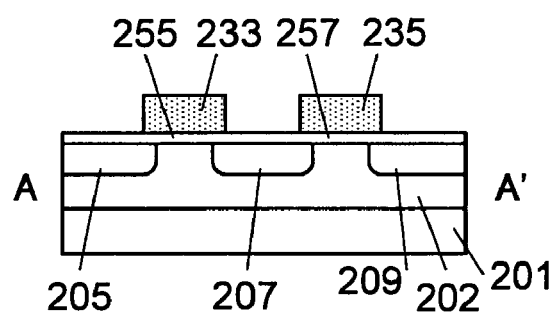
Figure 44D:
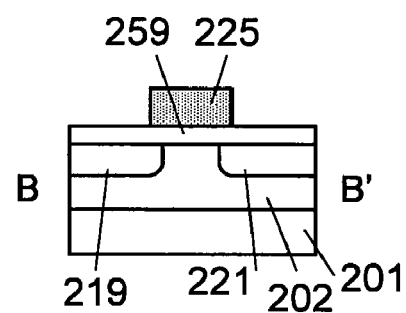

FIGS. 44A through 44D are diagrams illustrating a nineteenth embodiment of the present invention. FIG. 44A is a plan view of a memory cell, FIG. 44B is a plan view of a peripheral circuit transistor, FIG. 44C is a cross-sectional view of the memory cell of FIG. 44A cut across line A-A', and FIG. 44D is a cross-sectional view of the peripheral circuit transistor of FIG. 44B cut across line B-B'. It is noted that components that are identical to those shown in FIGS. 16A-16D, FIGS. 20A-20D, and FIGS. 42A-42D are given the same numerical references and their descriptions are omitted.

The present embodiment differs from the eighteenth embodiment as is described above with reference to FIGS. 42A-42D in that a p-type impurity such as boron is introduced into the polysilicon of a selection gate 233 and a floating gate 235 instead of phosphorous. The boron concentration within the selection gate 233 and the floating gate 235 may be around $7.0 \times 10^{18}$ to $5.0 \times 10^{19}$ atoms/cm$^3$, for example.

According to the present embodiment, the process steps (1) through (3) described above with reference to FIGS. 43A-43C are performed, after which the process steps (1) through (4) described above with reference to FIGS. 20A-20D and FIGS. 21A-21C are performed to create the memory cell and the peripheral circuit transistor.

In the present embodiment, advantageous effects that are identical to those obtained in the seventh embodiment described above with reference to FIGS. 20A-20D may be obtained.

Also, in the present embodiment, the memory gate oxide film 257 is arranged to be thinner than the peripheral circuit gate oxide film 259, and thereby, writing may be suitably performed on the memory transistor while protecting the peripheral circuit gate oxide film 259 from damage and preventing the occurrence of snapback breakdown.

Figure 45A:
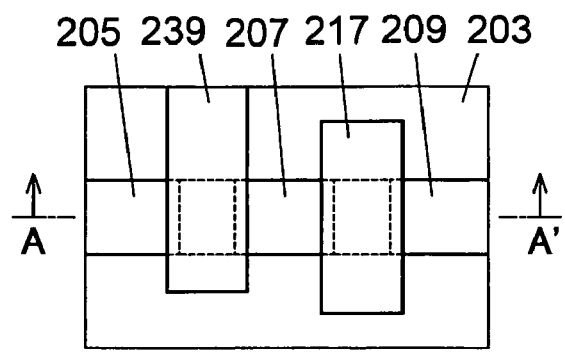
FIGS. 45A-45D are diagrams illustrating a twentieth embodiment of the present invention, FIG. 45A being a plan view of a memory cell, FIG. 45B being a plan view of a peripheral circuit transistor, FIG. 45C being a cross-sectional view of the memory cell of FIG. 45A cut across line A-A', and FIG. 45D being a cross-sectional view of the peripheral circuit transistor of FIG. 45B cut across line B-B'.
Figure 45B:
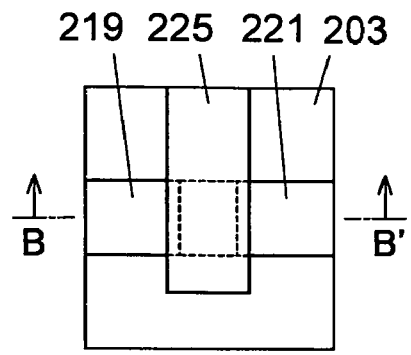
Figure 45C:
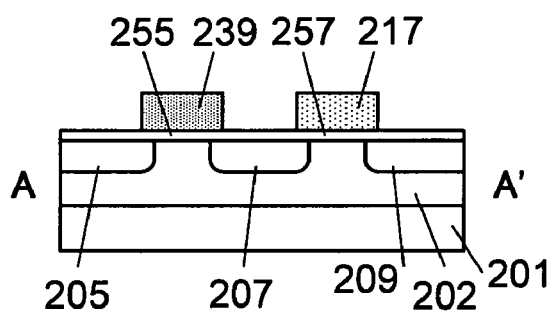
Figure 45D:
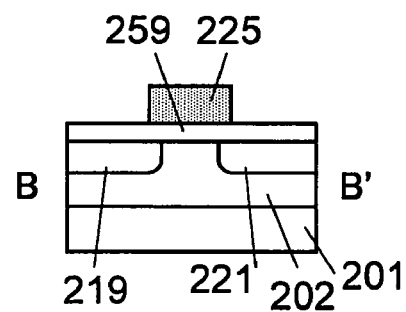

FIGS. 45A through 45D are diagrams illustrating a twentieth embodiment of the present invention. FIG. 45A is a plan view of a memory cell, FIG. 45B is a plan view of a peripheral circuit transistor, FIG. 45C is a cross-sectional view of the memory cell of FIG. 45A cut across line A-A', and FIG. 45D is a cross-sectional view of the peripheral circuit transistor of FIG. 45B cut across line B-B'. It is noted that components that are identical to those shown in FIGS. 16A-16D, FIGS. 22A-22D, and FIGS. 42A-42D are given the same numerical references and their descriptions are omitted.

The present embodiment differs from the eighteenth embodiment as is described above with reference to FIGS. 42A-42D in that a selection gate 239 and a peripheral circuit gate 225 are simultaneously created, and an n-type impurity such as phosphorous is introduced into the selection gate 239 at a higher concentration than that for a floating gate 217. The substantial phosphorous concentration within the selection gate 239 may be around $1.0 \times 10^{20}$ atoms/cm$^3$, for example.

According to the present embodiment, the process steps (1) through (3) described above with reference to FIGS. 43A-43C are performed, after which the process steps (1) through (4) described above with reference to FIGS. 22A-22D and FIGS. 23A-23C are performed to create the memory cell and the peripheral circuit transistor.

In the present embodiment, advantageous effects that are identical to those obtained in the eighth embodiment described above with reference to FIGS. 22A-22D may be obtained.

Also, in the present embodiment, the memory gate oxide film 257 is arranged to be thinner than the peripheral circuit gate oxide film 259, and thereby, writing may be suitably performed on the memory transistor while protecting the peripheral circuit gate oxide film 259 from damage and preventing the occurrence of snapback breakdown.

Figure 46A:
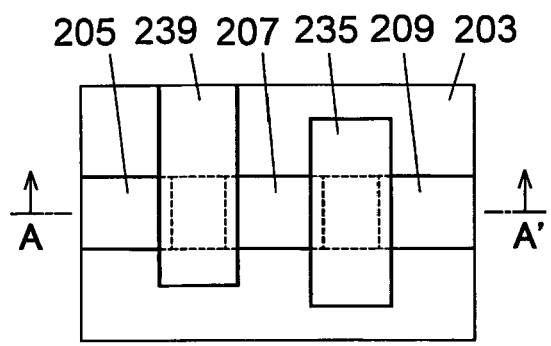
FIGS. 46A-46D are diagrams illustrating a twenty first embodiment of the present invention, FIG. 46A being a plan view of a memory cell, FIG. 46B being a plan view of a peripheral circuit transistor, FIG. 46C being a cross-sectional view of the memory cell of FIG. 46A cut across line A-A', and FIG. 46D being a cross-sectional view of the peripheral circuit transistor of FIG. 46B cut across line B-B'.
Figure 46B:
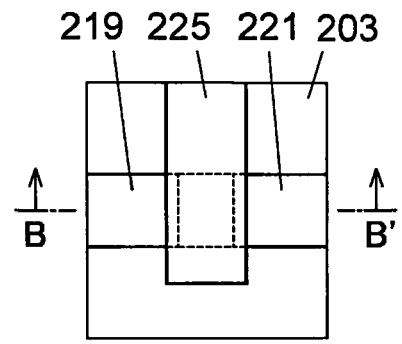
Figure 46C:
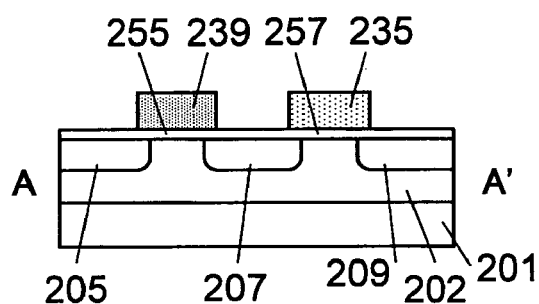
Figure 46D:
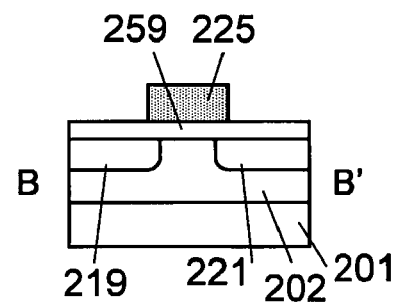

FIGS. 46A through 46D are diagrams illustrating a twenty first embodiment of the present invention. FIG. 46A is a plan view of a memory cell, FIG. 46B is a plan view of a peripheral circuit transistor, FIG. 46C is a cross-sectional view of the memory cell of FIG. 46A cut across line A-A', and FIG. 46D is a cross-sectional view of the peripheral circuit transistor of FIG. 46B cut across line B-B'. It is noted that components that are identical to those shown in FIGS. 16A-16D, FIGS. 20A-20D, FIGS. 22A-22D, FIGS. 24A-24D, and FIGS. 42A-42D are given the same numerical references and their descriptions are omitted.

The present embodiment differs from the twentieth embodiment as is described above with reference to FIGS. 45A-45D in that a p-type impurity such as boron is introduced into the polysilicon of a floating gate 235 instead of phosphorous. The boron concentration within the floating gate 235 may be around $7.0 \times 10^{18}$ to $5.0 \times 10^{19}$ atoms/cm$^3$, for example.

According to the present embodiment, the process steps (1) through (3) described above with reference to FIGS. 43A-43C are performed, after which the process steps (1) through (4) described above with reference to FIGS. 24A-24D and FIGS. 25A-25C are performed to create the memory cell and the peripheral circuit transistor.

In the present embodiment, advantageous effects that are identical to those obtained in the ninth embodiment described above with reference to FIGS. 24A-24D may be obtained.

Also, in the present embodiment, the memory gate oxide film 257 is arranged to be thinner than the peripheral circuit gate oxide film 259, and thereby, writing may be suitably performed on the memory transistor while protecting the peripheral circuit gate oxide film 259 from damage and preventing the occurrence of snapback breakdown.

In the eighteenth embodiment as is described above with reference to FIGS. 42A-42D and FIGS. 43A-43C, the nineteenth embodiment as is described above with reference to FIGS. 44A-44D, the twentieth embodiment as is described above with reference to FIGS. 45A-45D, and the twenty first embodiment as is described above with reference to FIGS. 46A-46D, the selection gate oxide film 255 is arranged to have the same thickness as that of the memory gate oxide film 257, and thereby, the two gate oxide films 255 and 257 may be created simultaneously. In this way, the number of processes required for creating the gate oxide films may be reduced compared to a case of creating the selection gate oxide film 255, the memory gate oxide film 257, and the peripheral circuit gate oxide film 259 separately.

Figure 47A:
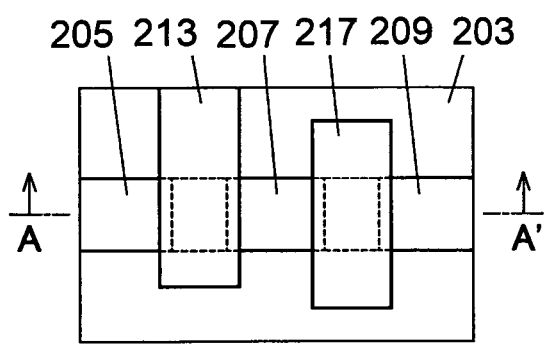
FIGS. 47A-47D are diagrams illustrating a twenty second embodiment of the present invention, FIG. 47A being a plan view of a memory cell, FIG. 47B being a plan view of a peripheral circuit transistor, FIG. 47C being a cross-sectional view of the memory cell of FIG. 47A cut across line A-A', and FIG. 47D being a cross-sectional view of the peripheral circuit transistor of FIG. 47B cut across line B-B'.
Figure 47B:
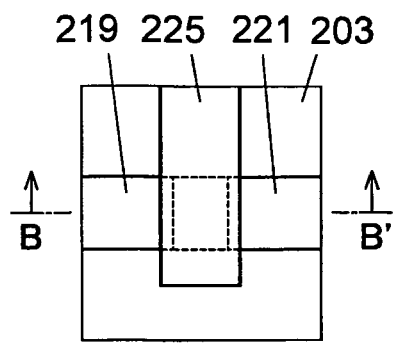
Figure 47C:
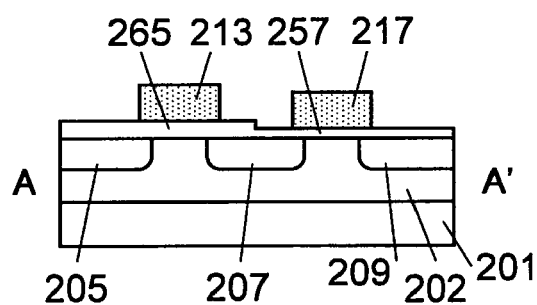
Figure 47D:
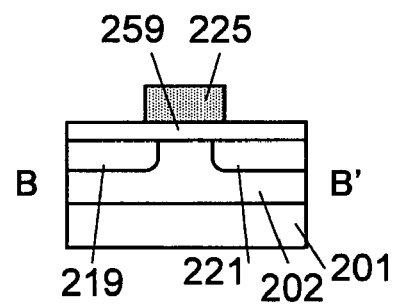

FIGS. 47A through 47D are diagrams illustrating a twenty second embodiment of the present invention. FIG. 47A is a plan view of a memory cell, FIG. 47B is a plan view of a peripheral circuit transistor, FIG. 47C is a cross-sectional view of the memory cell of FIG. 47A cut across line A-A', and FIG. 47D is a cross-sectional view of the peripheral circuit transistor of FIG. 47B cut across line B-B'. It is noted that components that are identical to those shown in FIGS. 16A-16D are given the same numerical references and their descriptions are omitted.

The present embodiment differs from the eighteenth embodiment as is described above with reference to FIGS. 42A-42D in that a selection gate oxide film 265 and a peripheral circuit gate oxide film 259 are created simultaneously by performing an oxidation process two times. The thickness of the selection gate oxide film 265 and the peripheral circuit gate oxide film 259 may be around 10.0-15.0 nm, for example (13.5 nm in the present example).

In the present embodiment, advantageous effects similar to those obtained in the sixth embodiment as is described above with reference to FIGS. 16A-16D may be obtained.

Also, in the present embodiment, a memory gate oxide film 257 is arranged to be thinner than the peripheral circuit gate oxide film 259, and thereby, writing may be suitably performed on the memory transistor while protecting the peripheral circuit gate oxide film 247 from damage and preventing the occurrence of snapback breakdown.

Figure 48A:
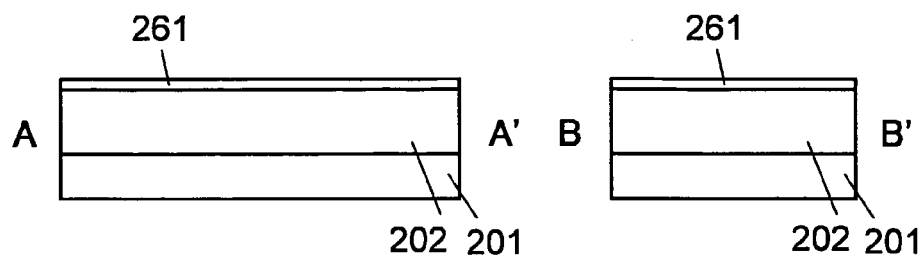
FIGS. 48A-48C are cross-sectional views illustrating exemplary process steps for fabricating the memory cell and the peripheral circuit transistor of the twenty second embodiment.
Figure 48B:
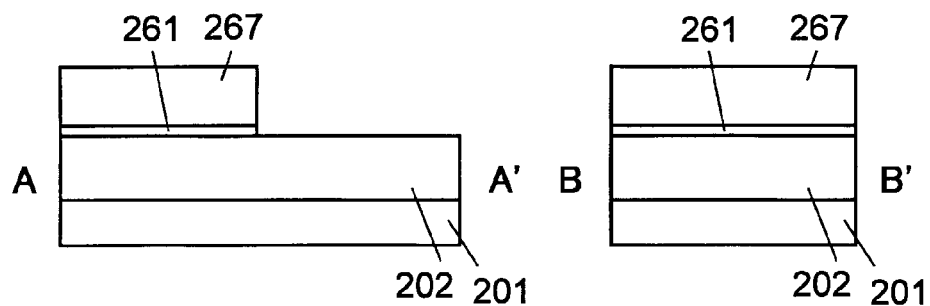
Figure 48C:
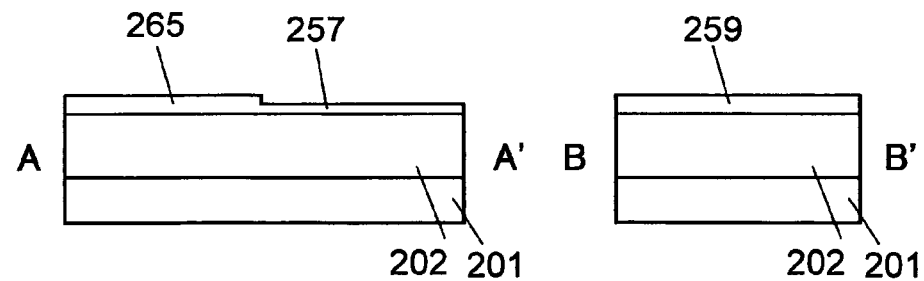

FIGS. 48A through 48C are cross-sectional views illustrating exemplary process steps for fabricating the memory cell and the peripheral circuit transistor of the twenty second embodiment. It is noted that the cross-sectional views of FIGS. 48A-48C correspond to the cross-sectional views of FIGS. 47C and 47D cut across lines A-A' and B-B'. In the following, an exemplary method for fabricating the memory cell and the peripheral circuit transistor of the eighteenth embodiment is described with reference to FIGS. 47A-47D and FIGS. 48A-48C.

(1) An n-well 202, a field oxide film 203 (see FIGS. 47A and 47B), and a sacrificial oxide film 261 are created on a p-substrate 201, and channel doping is performed through a process similar to the process step (1) as is described above with reference to FIG. 43A (see FIG. 48A).

(2) A resist pattern 263 is created that covers a selection transistor region and a peripheral circuit transistor formation region and has opening portions at a memory transistor formation region. Then, the sacrificial oxide film 261 at the memory transistor region is selectively removed using the resist pattern 63 as a mask (see FIG. 48B).

(3) After removing the resist pattern 263, a thermal oxidation process is performed to create the memory gate oxide film 257 having a thickness of 7.5 nm, for example, on the surface of the n-well 202 at the memory transistor region. In this process, the sacrificial oxide film 261 at the selection transistor region and the peripheral circuit transistor region grows in thickness to become the selection gate oxide film 265 and the peripheral circuit gate oxide film 259 (see FIG. 48C).

(4) By performing processes similar to the process steps (1) through (3) described above with reference to FIGS. 19A-19C, the selection gate 213 is created on the field oxide film 203 and the selection gate oxide film 255 at the selection transistor region, the floating gate 217 is created at the field oxide film 203 and the memory gate oxide film 257 at the memory transistor region, and the peripheral circuit gate 225 is created on the field oxide film 203 and the peripheral circuit gate oxide film 259 at the peripheral circuit transistor region. Then, p-type diffusion layers 205, 207, 209, 219, and 221 are created through a process similar to process step (4) as is described above with reference to FIGS. 16A-16D (see FIGS. 47A-47D).

FIGS. 49A through 49D are diagrams illustrating a twenty third embodiment of the present invention. FIG. 49A is a plan view of a memory cell, FIG. 49B is a plan view of a peripheral circuit transistor, FIG. 49C is a cross-sectional view of the memory cell of FIG. 49A cut across line A-A', and FIG. 49D is a cross-sectional view of the peripheral circuit transistor of FIG. 49B cut across line B-B'. It is noted that components that are identical to those shown in FIGS. 16A-16D, FIGS. 20A-20D, FIGS. 42A-42D, and FIGS. 47A-47D are given the same numerical references and their descriptions are omitted.

The present embodiment differs from the twenty second embodiment as is described above with reference to FIGS. 47A-47D in that a p-type impurity such as boron is introduced into the polysilicon of a selection gate 233 and a floating gate 235 instead of phosphorous. The boron concentration within the selection gate 233 and the floating gate 235 may be around $7.0 \times 10^{18}$ to $5.0 \times 10^{19}$ atoms/cm$^3$, for example.

According to the present embodiment, the process steps (1) through (3) described above with reference to FIGS. 48A-48C are performed, after which the process steps (1) through (4) described above with reference to FIGS. 20A-20D and FIGS. 21A-21C are performed to create the memory cell and the peripheral circuit transistor.

In the present embodiment, advantageous effects similar to those obtained in the seventh embodiment described above with reference to FIGS. 20A-20D may be obtained.

Also, in the present embodiment, the memory gate oxide film 257 is arranged to be thinner than the peripheral circuit gate oxide film 259, and thereby, writing may be suitably performed on the memory transistor while protecting the peripheral circuit gate oxide film 259 from damage and preventing the occurrence of snapback breakdown.

Figure 50A:
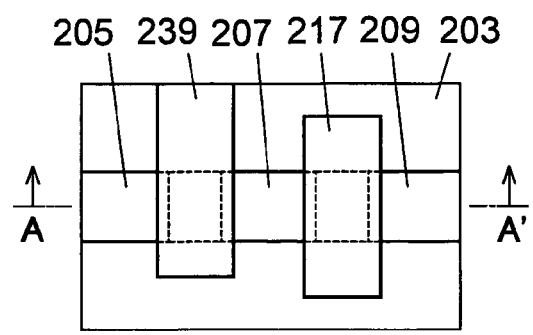
FIGS. 50A-50D are diagrams illustrating a twenty fourth embodiment of the present invention, FIG. 50A being a plan view of a memory cell, FIG. 50B being a plan view of a peripheral circuit transistor, FIG. 50C being a cross-sectional view of the memory cell of FIG. 50A cut across line A-A', and FIG. 50D being a cross-sectional view of the peripheral circuit transistor of FIG. 50B cut across line B-B'.
Figure 50B:
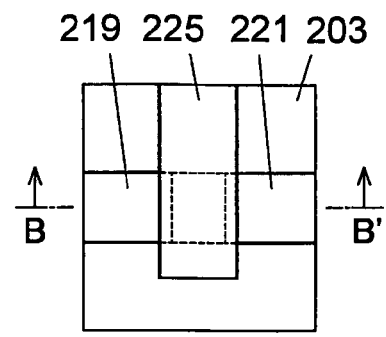
Figure 50C:
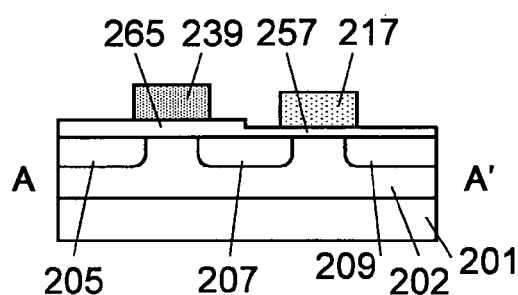
Figure 50D:
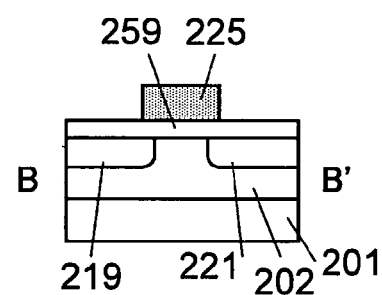

FIGS. 50A through 50D are diagrams illustrating a twenty fourth embodiment of the present invention. FIG. 50A is a plan view of a memory cell, FIG. 50B is a plan view of a peripheral circuit transistor, FIG. 50C is a cross-sectional view of the memory cell of FIG. 50A cut across line A-A', and FIG. 50D is a cross-sectional view of the peripheral circuit transistor of FIG. 50B cut across line B-B'. It is noted that components that are identical to those shown in FIGS. 16A-

16D, FIGS. 22A-22D, FIGS. 42A-42D, and FIGS. 47A-47D are given the same numerical references and their descriptions are omitted.

The present embodiment differs from the twenty second embodiment as is described above with reference to FIGS. 47A-47D in that a selection gate 239 and a peripheral circuit gate 225 are simultaneously created, and an n-type impurity such as phosphorous is introduced into the selection gate 239 at a higher concentration than that for a floating gate 217. The substantial phosphorous concentration within the selection gate 239 may be around $1.0 \times 10^{20}$ atoms/cm$^3$, for example.

According to the present embodiment, the process steps (1) through (3) described above with reference to FIGS. 48A-48C are performed, after which the process steps (1) through (4) described above with reference to FIGS. 22A-22D and FIGS. 23A-23C are performed to create the memory cell and the peripheral circuit transistor.

In the present embodiment, advantageous effects that are identical to those obtained in the eighth embodiment described above with reference to FIGS. 22A-22D may be obtained.

Also, in the present embodiment, the memory gate oxide film 257 is arranged to be thinner than the peripheral circuit gate oxide film 259, and thereby, writing may be suitably performed on the memory transistor while protecting the peripheral circuit gate oxide film 259 from damage and preventing the occurrence of snapback breakdown.

Figure 51A:
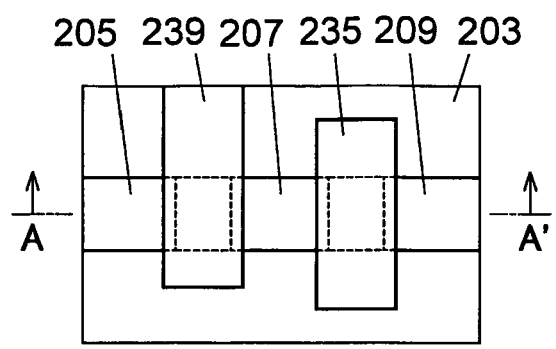
FIGS. 51A-51D are diagrams illustrating a twenty fifth embodiment of the present invention, FIG. 51A being a plan view of a memory cell, FIG. 51B being a plan view of a peripheral circuit transistor, FIG. 51C being a cross-sectional view of the memory cell of FIG. 51A cut across line A-A', and FIG. 51D being a cross-sectional view of the peripheral circuit transistor of FIG. 51B cut across line B-B'.
Figure 51B:
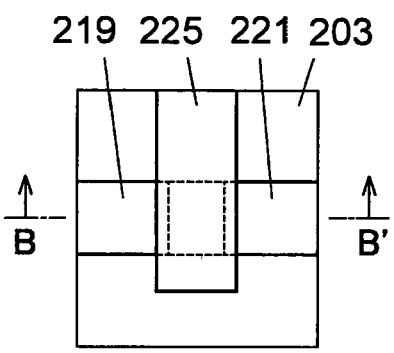
Figure 51C:
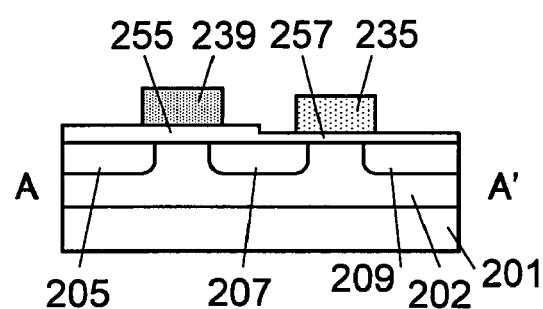
Figure 51D:
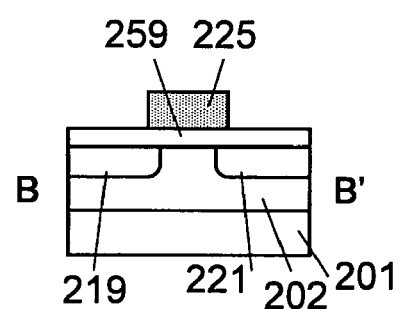

FIGS. 51A through 51D are diagrams illustrating a twenty fifth embodiment of the present invention. FIG. 51A is a plan view of a memory cell, FIG. 51B is a plan view of a peripheral circuit transistor, FIG. 51C is a cross-sectional view of the memory cell of FIG. 51A cut across line A-A', and FIG. 51D is a cross-sectional view of the peripheral circuit transistor of FIG. 51B cut across line B-B'. It is noted that components that are identical to those shown in FIGS. 16A-16D, FIGS. 20A-20D, FIGS. 22A-22D, FIGS. 24A-24D, FIGS. 42A-42D, and FIGS. 47A-47D are given the same numerical references and their descriptions are omitted.

The present embodiment differs from the twenty fourth embodiment described above with reference to FIGS. 50A-50D in that a p-type impurity such as boron is introduced into the polysilicon of a floating gate 235 instead of phosphorous. The boron concentration within the floating gate 235 may be around $7.0 \times 10^{18}$ to $5.0 \times 10^{19}$ atoms/cm$^3$, for example.

According to the present embodiment, the process steps (1) through (3) described above with reference to FIGS. 48A-48C are performed, after which the process steps (1) through (4) described above with reference to FIGS. 24A-24D and FIGS. 25A-25C are performed to create the memory cell and the peripheral circuit transistor.

In the present embodiment, advantageous effects that are identical to those obtained in the ninth embodiment described above with reference to FIGS. 24A-24D may be obtained.

Also, in the present embodiment, a memory gate oxide film 257 is arranged to be thinner than a peripheral circuit gate oxide film 259, and thereby, writing may be suitably performed on the memory transistor while protecting the peripheral circuit gate oxide film 259 from damage and preventing the occurrence of snapback breakdown.

In the twenty second embodiment as is described above with reference to FIGS. 47A-47D, the twenty third embodiment as is described above with reference to FIGS. 49A-49D, the twenty fourth embodiment as is describe above with reference to FIGS. 50A-50D, and the twenty fifth embodiment as is described above with reference to FIGS. 51A-51D, the selection gate oxide film 265 is arranged to be thinner than the peripheral circuit gate oxide film 259, and thereby, the gate oxide films 259 and 265 may be created simultaneously so that the number of processes required for creating the gate oxide films may be reduced compared to a case of creating the selection gate oxide film 265, the memory gate oxide film 257, and the peripheral circuit gate oxide film 259 separately.

It is noted that in the above illustrated embodiments, the memory transistor and the selection transistor correspond to PMOS transistors (with write power voltages of approximately 6-7 V), and thereby, the so-called control gate does not have to be used for writing and the write voltage may be lowered compared to a case of using an NMOS transistor as the memory transistor (with write voltages of approximately 10 V).

However, the present invention is not limited to the use of the PMOS transistor, and NMOS transistors may be used as the memory transistor and the selection transistor in other embodiments of the present invention.

Also, in the above illustrated embodiments, a PMOS transistor is shown as the peripheral circuit transistor; however the present invention is not limited to such embodiments, and for example, an NMOS transistor as another peripheral circuit transistor may be arranged at another region.

Also, the semiconductor substrate may be an n-substrate according to alternative embodiments of the present invention.

In another embodiment, a silicide film may be arranged on at least one of the selection gate, the memory gate, and the peripheral circuit gate to reduce gate resistance.

Figure 52:
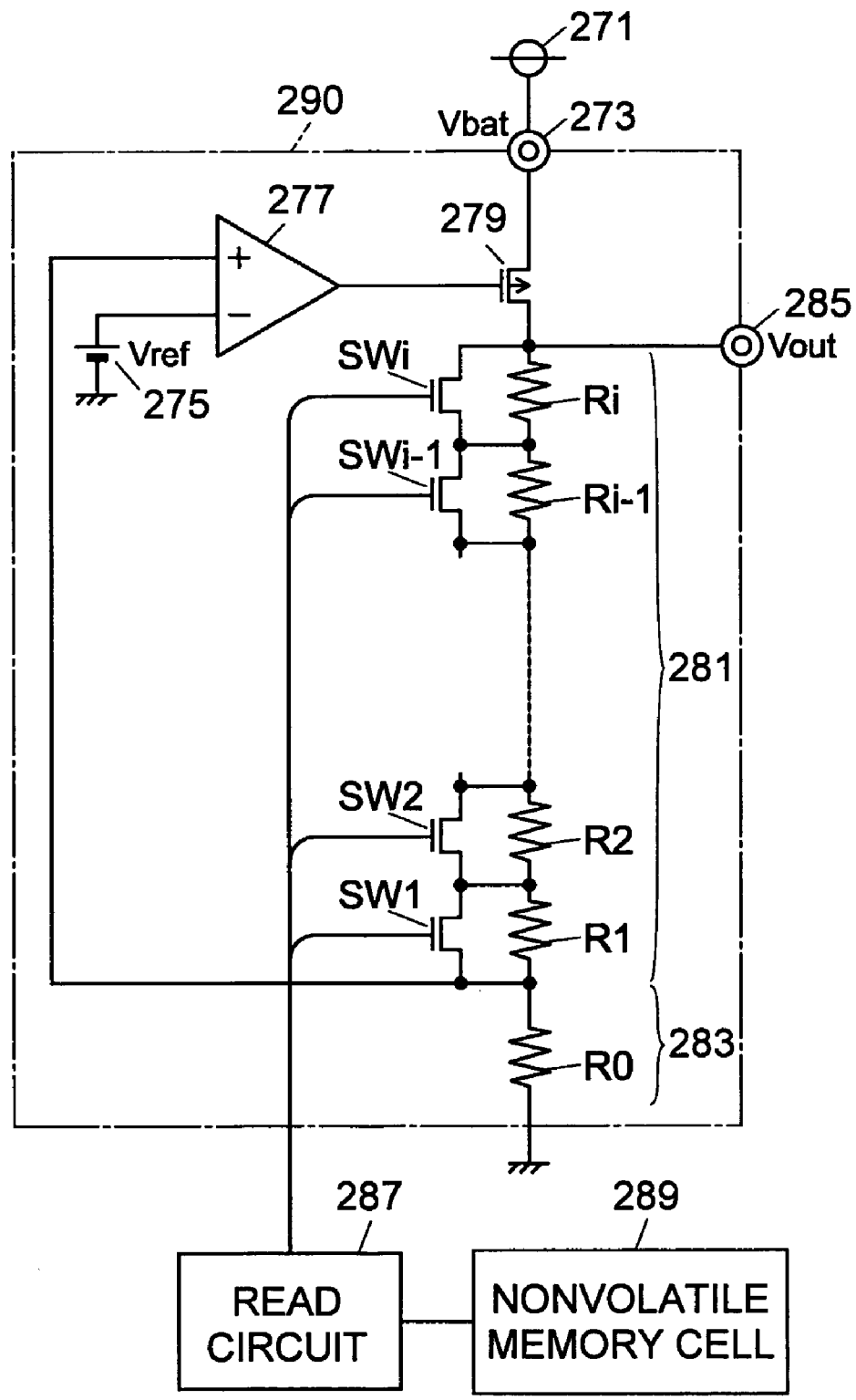
FIG. 52 is a circuit diagram illustrating a constant voltage generating circuit including a divider resistor circuit according to an embodiment of the present invention.

FIG. 52 is a circuit diagram illustrating a constant voltage generating circuit including a divider resistor circuit according to an embodiment of the present invention.

The constant voltage generating circuit 290 shown in FIG. 52 is configured to regulate power supplied from a direct current power source 271. The constant voltage generating circuit 290 includes an input terminal (Vbat) 273 that is connected to the direct current power source 271, a reference voltage generating circuit (Vref) 275, a computing amplifier 277, a p-channel type MOS transistor (referred to as 'PMOS' hereinafter) 279 as an output driver, divider resistors 281, 283, and an output terminal (Vout) 285.

The divider resistor 283 includes a resistor element R0. The divider resistor 281 includes plural resistance value adjusting resistor elements R1, R2, •Ri-1, and Ri that are serially connected. Fuse MOS transistors SW1, SW2, •SWi-1, and SWi are connected in parallel with the resistance value adjusting resistor elements R1, R2, •Ri-1, and Ri, respectively.

The constant voltage generating circuit 290 of the present embodiment also includes a read circuit 287 for switching on/off the fuse MOS transistors SW1, SW2, •SWi-1, and SWi, and a nonvolatile memory cell 289. The output of the read circuit 287 is connected to the corresponding gates of the fuse MOS transistors SW1, SW2, •SWi-1, and SWi. The nonvolatile memory cell 289 includes plural memory cells that store information pertaining to switching on/off the fuse MOS transistors SW1, SW2, •SWi-1, and SWi. The read circuit 287 switches on/off the fuse MOS transistors SW1, SW2, •SWi-1, and SWi according to the storage state of the nonvolatile memory cell 289.

In the computing amplifier 277 of the constant voltage generating circuit 290, an output terminal of the computing amplifier 277 is connected to a gate electrode of the PMOS 279. A reference voltage Vref from the reference voltage generating circuit 275 is applied to an inverting input terminal of the computing amplifier 277. A voltage resulting from dividing the output voltage by the resistors 281 and 283 is applied to the non-inverting input terminal of the computing amplifier 277. The divided voltage of the resistors 281 and 283 is controlled to be equal to the reference voltage Vref.

Figure 53:
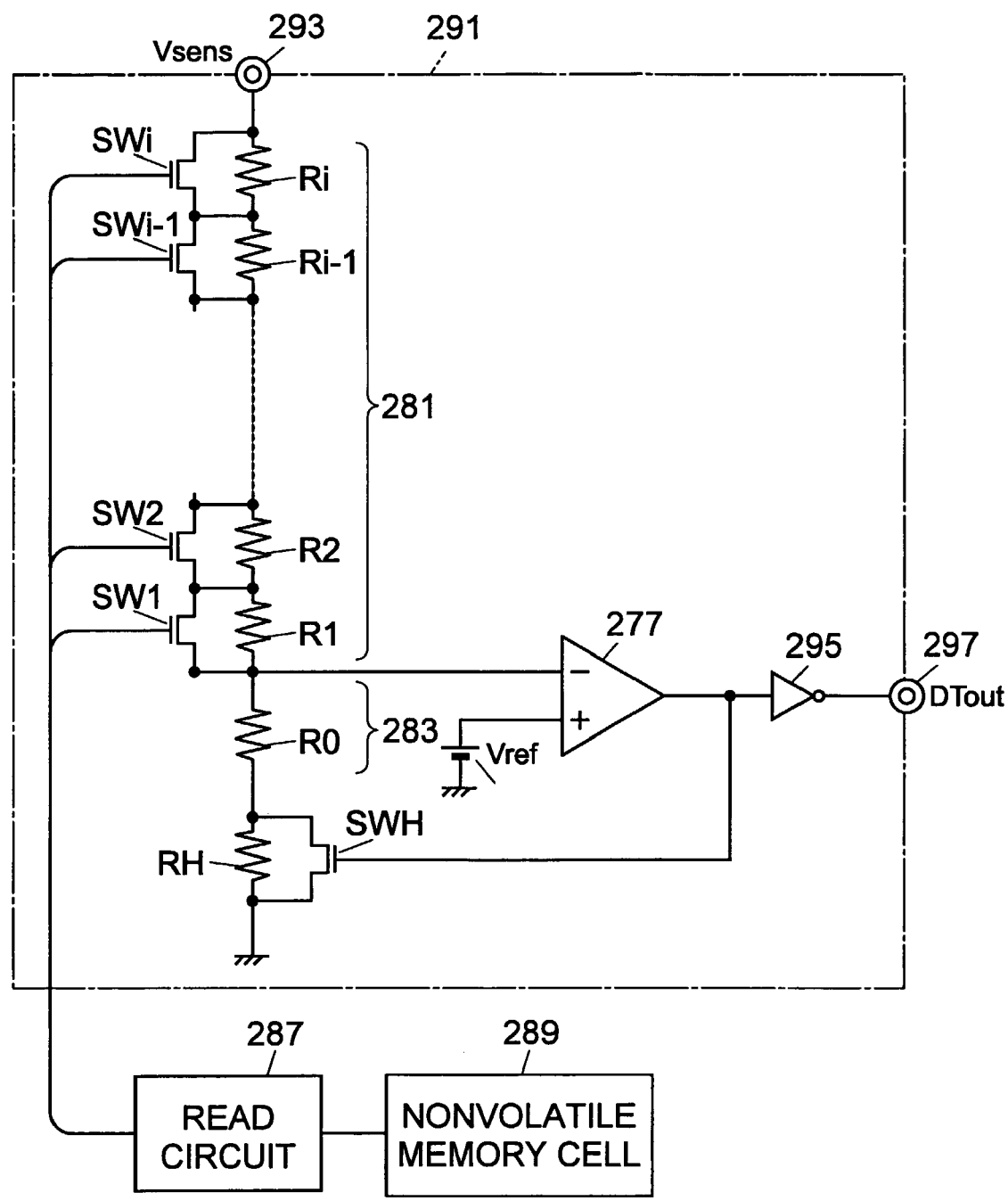
FIG. 53 is a circuit diagram illustrating a voltage detecting circuit including a divider resistor circuit according to an embodiment of the present invention.

FIG. 53 is a circuit diagram illustrating a voltage detecting circuit including a divider resistor circuit according to an embodiment of the present invention. It is noted that in this drawing, components that are identical to those shown in FIG. 52 are given the same numerical references.

In the voltage detecting circuit 291 shown in FIG. 53, divider resistors 281, 283, and an oscillation preventing resistor element RH are serially connected between ground potential and an input terminal 293 that inputs a voltage of a terminal to be measured (input voltage Vsens). It is noted that in the present embodiment, the configurations of the resistors 281 and 283 are arranged to be identical to those of the resistors 281 and 283 shown in FIG. 52.

According to the present embodiment, fuse MOS transistors SW1, SW2, •SWi-1, and SWi are connected in parallel with resistance value adjusting resistor elements R1, R2, •Ri-1, and Ri, respectively. A read circuit 287 is connected to the fuse MOS transistors SW1, SW2, •SWi-1, and SWi. A nonvolatile memory cell 289 is connected to the read circuit 287.

The oscillation preventing resistor element RH is arranged between the divider resistor 283 and ground. An n-channel type oscillation preventing fuse MOS transistor SWH is connected in parallel with the oscillation preventing resistor element RH. A gate of the oscillation preventing fuse MOS transistor SWH is connected to the output of a computing amplifier 277.

An inverting input terminal of the computing amplifier 277 is connected to a connection point between the divider resistors 281 and 283. A non-inverting input terminal of the computing amplifier 277 is connected to a reference voltage generating circuit 275 so that a reference voltage Vref may be applied thereto. The output of the computing amplifier 277 is output to the exterior via an inverter 295 and an output terminal (D Tout) 297.

When the voltage detecting circuit 291 is in a high voltage detecting state, the oscillation preventing resistor element RH is switched off, and when the voltage of the terminal to be measured that is input from the input terminal 293 is high, and the voltage divided by the divider resistors 281, 283, and the oscillation preventing resistor element RH is higher than the reference voltage Vref, the output of the computing amplifier 277 is maintained at logical value 0, and this output is inverted into logical value 1 by the inverter 295 and output from the output terminal 297. In this case, the divided voltage input to the inverting input terminal of the calculating amplifier 277 can be expressed as follows:

$$\{(R0)+(RH)\}/\{(R1)+\ldots+(Ri-1)+(Ri)+(R0)+\ldots\}$$

When the voltage of the terminal to be measured decreases and the voltage divided by the divider resistors 281, 283, and the oscillation preventing resistor element RH becomes lower than the reference voltage Vref, the output of the computing amplifier 277 is set to logical value 1, and this output is inverted into logical value 0 by the inverter 295 to be output from the output terminal 297.

When the output of the computing amplifier 277 is set to logical value 1, the oscillation preventing fuse MOS transistor SWH is switched on, the divider resistor 283 is connected to ground potential via the oscillation preventing fuse MOS transistor SWH, and the voltage between the divider resistors 281 and 283 decreases. In turn, the output of the computing amplifier 277 is maintained at logical value 1, and the voltage detecting circuit 291 falls into a low voltage detecting state. It is noted that the oscillation preventing resistor element RH and the oscillation preventing fuse MOS transistor SWH are configured to prevent oscillation of the output of the voltage detecting circuit 291 when the input voltage Vsens decreases.

The divided voltage input to the inverting input terminal of the computing amplifier 277 when the voltage detecting circuit 291 is in a lower voltage detecting state can be expressed as follows:

$$(R0)/\{(R1)+\ldots+(Ri-1)+(Ri)+\ldots\}$$

The awake voltage for switching the voltage detecting circuit 291 to a high voltage detecting state may be an input voltage Vsens at a level such that the divided voltage input to the inverting input terminal of the computing amplifier 277 in the lower voltage detecting state may be greater than the reference voltage Vref.

It is noted that in FIGS. 52 and 53, the MOS transistor realized by the read circuit 287, the reference voltage generating circuit 275, and the computing amplifier 277; the fuse MOS transistors SW1, SW2, •SWi-1, and SWi; and the oscillation preventing fuse MOS transistor SWH are applied as peripheral circuit transistors of a semiconductor device according to an embodiment of the present invention. However, the present invention is not limited to the above embodiments and it does not require all of the MOS transistors to embody peripheral circuit transistors of the present embodiment as is described above.

Also, in FIGS. 52 and 53, the fuse MOS transistors SW1, SW2, •SWi-1, and SWi may be switched on/off through control by the read circuit 287 and the nonvolatile memory cell 289 so that the resistance value of the divider resistor 281 may be adjusted. In this way, the setting voltage for the output voltage of the constant voltage generating circuit 290 and the output voltage of the voltage detecting circuit 291 may be adjusted.

It is noted that in a conventional constant voltage generating circuit and a conventional voltage detecting circuit, a fuse made of polysilicon or metal is connected in parallel with each resistance value adjusting resistor element R1, R2, •Ri-1, and Ri instead of using the fuse MOS transistors SW1, SW2, •SWi-1, SWi, the read circuit 287, and the nonvolatile memory cell 289 according to the present embodiment, and in such conventional circuits, resistance values of the divider resistors are adjusted by cutting the fuse.

In the embodiments illustrated in FIGS. 52 and 53, a switch (i.e., fuse MOS transistors SW1, SW2, •SWi-1, SWi) that is once turned off may be turned on again through control by the read circuit 287 and the nonvolatile memory cell 289, which on/off operation has been difficult to realize with a fuse. In this way, the setting voltages for the output voltage of the constant voltage generating circuit 290 and the output voltage of the voltage detecting circuit 291 may be freely changed.

According to a preferred embodiment of the present invention, the on/off states of the fuse MOS transistors SW1, SW2, •SWi-1, and SWi may be switched through writing on the nonvolatile memory cell 289, and thereby, the setting voltages for the output voltage of the constant voltage generating circuit 290 and the output voltage of the voltage detecting circuit 291 may be adjusted and changed even after the semiconductor device is accommodated within a package.

Also, it is noted that in FIGS. 52 and 53, the divider resistor circuit according to an embodiment of the present invention is applied to a constant voltage generating circuit and a voltage detecting circuit; however, the present invention is not limited to such applications and the divider resistor circuit may be applied to other types of circuits as well.

In the following, exemplary advantageous effects obtained by one or more of the embodiments of the present invention are described.

According to one aspect of the present invention, in a semiconductor device including a nonvolatile memory cell made up of a memory transistor having a floating gate but no control gate and a selection transistor, and a peripheral circuit transistor, by arranging a memory gate oxide film to be thinner than a peripheral circuit gate oxide film, the peripheral circuit gate oxide film may be arranged to have an adequate thickness so that it may be protected from damage when a write operation is performed on a memory transistor, and the memory gate oxide film may be arranged to be adequately thin so that good writing characteristics may be obtained in the memory transistor. In this way, writing may be suitably performed on the memory transistor while protecting the peripheral circuit gate oxide film from damage and preventing the occurrence of snapback breakdown.

According to another aspect of the present invention, by applying PMOS transistors as the memory transistor and the selection transistor (e.g., with a write voltage of 6-7 V), a control gate may not have to be used upon performing a write operation and the write voltage may be lowered compared to a case of using an NMOS transistor as the memory transistor (e.g., with a write voltage of approximately 10 V), for example. However, it is noted that the present invention is not limited to the use of PMOS transistors as the memory transistor and the selection transistor, and NMOS transistors may equally be used according to alternative embodiments of the present invention.

According to another aspect of the present invention, by arranging a selection gate oxide film to have the same thickness as that of the memory gate oxide film, the two gate oxide films may be created simultaneously, and the number of process steps for creating the gate oxide films may be reduced compared to a case of performing separate processes for creating the selection gate oxide film, the memory gate oxide film, and the peripheral circuit gate oxide film, for example.

According to another aspect of the present invention, by arranging the selection gate oxide film and the peripheral circuit gate oxide film to have the same thickness, the two gate oxide films may be created simultaneously, and the number of process steps required for creating the selection gate oxide film, the memory gate oxide film, and the peripheral circuit gate oxide film may be reduced compared to a case of creating each of the gate oxide films separately. Further, in this case, the selection gate oxide film is arranged to be thicker than the memory gate oxide film, and thereby, the durability of the selection transistor may be improved.

According to another aspect of the present invention, by providing a capacitor including a lower electrode made of polysilicon that is arranged on a semiconductor substrate via an insulating film, and an upper electrode made of polysilicon that is arranged on the lower electrode via a capacitor insulating film, arranging the floating gate and the lower electrode to be created from the same polysilicon layer, and arranging the capacitor insulating film on the upper surface and the side surface of a floating gate, the floating gate may be adequately covered by the capacitor insulating film so that retention characteristics may be improved.

According to another aspect of the present invention, by arranging the peripheral circuit gate and the upper electrode to be created from the same polysilicon layer, the number of process steps required for creating these gates may be reduced compared to a case of creating the peripheral circuit gate and the upper electrode separately.

According to another aspect of the present invention, by arranging the selection gate and the lower electrode to be created from the same polysilicon layer, the number of process steps required for creating these gates may be reduced compared to a case of creating the peripheral circuit gate and the upper electrode separately.

According to another aspect of the present invention, by arranging the selection gate, the peripheral circuit gate, and the upper electrode to be created from the same polysilicon layer, the number of process steps may be reduced compared to a case of creating these gates separately.

According to another aspect of the present invention, in a semiconductor device that includes a divider resistor circuit that is configured to obtain a voltage output through voltage division and adjust the voltage output through cuffing one or more fuse elements, by configuring the divider resistor circuit to include plural resistance value adjusting resistor elements that are serially connected, plural fuse MOS transistors as the fuse elements that are connected in parallel to the resistance value adjusting resistor elements, the nonvolatile memory cell according to one embodiment of the present invention, and a read circuit for switching on/off the fuse MOS transistors according to the storage state of the nonvolatile memory cell, and by configuring at least one of the fuse MOS transistors and the read circuit into the peripheral circuit transistor according to one embodiment of the present invention, the output voltage of the divider resistor circuit may be adjusted according to the storage state of the nonvolatile memory cell having good writing characteristics. Further, by changing the storage state of the nonvolatile memory cell, the output voltage of the divider resistor circuit may be reset, for example.

According to another aspect of the present invention, in a semiconductor device that includes a voltage detecting circuit including a divider resistor circuit that divides an input voltage and outputs the divided voltage, a reference voltage generating circuit that generates a reference voltage, and a comparator circuit that compares the divided voltage from the divider resistor circuit with the reference voltage from the reference voltage generating circuit, by applying the divider resistor circuit according to one embodiment of the present invention as the divider resistor circuit of the voltage detecting circuit, the output voltage setting of the voltage detecting circuit may be changed by changing the storage state of the nonvolatile memory cell.

According to another aspect of the present invention, in a semiconductor device that includes a constant voltage generating circuit including an output driver that controls output of an input voltage, a divider resistor circuit that divides an output voltage and outputs the divided voltage, a reference voltage generating circuit that generates a reference voltage, and a comparator circuit that compares the divided voltage from the divider resistor circuit with the reference voltage from the reference voltage generating circuit and controls an operation of the output driver according to the comparison result, by applying the divider resistor circuit according to one embodiment of the present invention as the divider resistor circuit of the constant voltage generating circuit, the output voltage setting of the constant voltage generating circuit may be changed by changing the storage state of the nonvolatile memory cell.

According to another aspect of the present invention, in a semiconductor device including a nonvolatile memory cell made up of a memory transistor having a floating gate but no control gate and a selection transistor, and a peripheral circuit transistor, by arranging the impurity concentration within the polysilicon of the floating gate to be lower than the impurity concentration within the polysilicon of a peripheral circuit gate of the peripheral circuit transistor, the substantial impurity concentration within the polysilicon of the floating gate may be set to a low concentration below $1.0 \times 10^{20}$ atoms/cm$^3$, for example, so that the charge retaining characteristics of the memory transistor may be improved. Further, since the impurity concentration within the polysilicon of the peripheral circuit gate is arranged to be higher than the impurity concentration within the polysilicon of the floating gate, the resistance of the peripheral circuit gate may be adequately lowered, and a decrease in the processing speed of the peripheral circuit gate may be prevented.

According to another aspect of the present invention, by arranging the impurity concentration within the polysilicon of the selection gate to be equal to the impurity concentration within the polysilicon of the floating gate, the two gates may be created simultaneously, and the number of processes required for creating the gates may be reduced compared to a case of creating the selection gate, the floating gate, and the peripheral circuit gate separately.

According to another aspect of the present invention, by arranging the impurity concentration within the polysilicon of the selection gate to be equal to the impurity concentration within the polysilicon of the peripheral circuit gate, the two gates may be created simultaneously, and the number of processes required for creating the gates may be reduced compared to a case of creating the selection gate, the floating gate, and the peripheral circuit gate separately.

According to another aspect of the present invention, by arranging the memory gate oxide film, the selection gate oxide film, and the peripheral circuit gate oxide film to have the same thickness, these gate oxide films may be created simultaneously, and the number of processes required for creating the gate oxide films may be reduced compared to a case of creating the selection gate oxide film, the floating gate oxide film, and the peripheral circuit gate oxide film separately.

It is noted that in a semiconductor device including a memory transistor without a control gate, a selection transistor, and a peripheral circuit transistor, when the gate oxide films of the transistors are arranged to have the same thickness, and the gate oxide film thickness is set to a sub half level of 7.5 nm, for example, the memory transistor gate oxide film of the memory transistor becomes 7.5 nm. In such a case, according to findings of the present inventor, a predetermine voltage Vpp of 6-7 V or higher is required in order to obtain good writing characteristics in the memory transistor.

However, in this case, a voltage of 6-7 V or higher, for example, may have to be applied to the peripheral circuit transistor that is arranged to apply the predetermine voltage Vpp to the memory upon performing a write operation on the memory transistor. This means that an electric field reaching up to 10 MV/cm may have to be applied to the peripheral circuit gate oxide film having a thickness of merely 7.5 nm. Thus, the peripheral circuit gate oxide film may be vulnerable to damage, and in turn, the yield and reliability of the semiconductor device may be degraded.

Also, according to findings of the present inventor, the snapback voltage of an NMOS transistor (n-channel MOS transistor) having a gate oxide film with a thickness of 7.5 nm is just about equal to the predetermined voltage Vpp of 6-7 V, and thereby, the peripheral circuit may be highly vulnerable to damage when a write operation is performed. Thus, the yield and reliability of the semiconductor device may be degraded from this aspect as well.

Even if the film thickness of the gate oxide films of the memory transistor, the selection transistor, and the peripheral circuit transistor is increased to half level of 13.5 nm, for example, to counter the above problems, the write voltage Vpp has to be increased in such a case, and thereby the problem may not be solved. Specifically, when the gate oxide film thickness is set to approximately 13.5 nm and the write voltage Vpp is set to approximately 6-7 V, although the peripheral circuit gate oxide film may be protected from damage, the memory gate oxide film may be too thick at 13.5 nm to realize good writing characteristics.

Thus, according to another aspect of the present invention, by arranging the memory gate oxide film to be thinner than the peripheral circuit gate oxide film, the peripheral circuit gate oxide film may be arranged to be adequately thick so that it may be prevented from being damaged when a write operation is performed on the memory transistor, and the memory gate oxide film may be arranged to be adequately thin so that good writing characteristics may be obtained at the memory transistor. In this way, writing may be suitably performed on the memory transistor while protecting the peripheral circuit gate oxide film from damage and preventing the occurrence of snapback breakdown.

According to another aspect of the present invention, by arranging the memory transistor and the selection transistor to be PMOS transistors (with a write voltage of 6-7 V), a control gate does not have to be used as in the case of using an NMOS transistor (with a write voltage of approximately 10 V) as the memory transistor, and thereby, the write voltage may be lowered. However, it is noted that the present invention is not limited to the use of PMOS transistors as the memory transistor and the selection transistor, and in alternative embodiments, both of these transistors may be arranged into NMOS transistors, for example.

According to another aspect of the present invention, in an embodiment where the memory gate oxide film is arranged to be thinner than the peripheral circuit gate oxide film, by arranging the selection gate oxide film and the memory gate oxide film to have the same thickness, the two gates may be created simultaneously, and the number of processes required for creating the gates may be reduced compared to a case of creating the selection gate oxide film, the memory gate oxide film, and the peripheral circuit gate oxide film separately.

According to another aspect of the present invention, by arranging the selection gate oxide film and the peripheral circuit gate oxide film to have the same thickness, the two gates may be created simultaneously, and the number of processes required for creating the gates may be reduced compared to a case of creating the selection gate oxide film, the memory gate oxide film, and the peripheral circuit gate oxide film separately. Also, with such an arrangement, the pressure resistance of the selection transistor may be improved compared to the case in which the selection gate oxide film and the memory gate oxide film are arranged to have the same thickness.

According to another aspect of the present invention, in a semiconductor device according to an embodiment of the present invention, by arranging the memory transistor and the selection transistor to be PMOS transistors (with a write voltage of 6-7 V), a control gate does not have to be used as in the case of using an NMOS transistor (with a write voltage of approximately 10 V) as the memory transistor, and thereby, the write voltage may be lowered. However, it is noted that the present invention is not limited to the use of PMOS transistors as the memory transistor and the selection transistor, and in alternative embodiments, both of these transistors may be arranged into NMOS transistors, for example.

According to another aspect of the present invention, in a semiconductor device that includes a divider resistor circuit that is configured to obtain a voltage output through voltage division and adjust the voltage output through cutting one or more fuse elements, by configuring the divider resistor circuit to include plural resistance value adjusting resistor elements that are serially connected, plural fuse MOS transistors as the fuse elements that are connected in parallel to the resistance value adjusting resistor elements, the nonvolatile memory cell according to one embodiment of the present invention, and a read circuit for switching on/off the fuse MOS transistors according to the storage state of the nonvolatile memory cell, and by configuring at least one of the fuse MOS transistors and the read circuit into the peripheral circuit transistor according to one embodiment of the present invention, the output voltage of the divider resistor circuit may be adjusted according to the storage state of the nonvolatile memory cell having good writing characteristics. Further, by changing the storage state of the nonvolatile memory cell, the output voltage of the divider resistor circuit may be reset, for example.

According to another aspect of the present invention, in a semiconductor device that includes a voltage detecting circuit including a divider resistor circuit that divides an input voltage and outputs the divided voltage, a reference voltage generating circuit that generates a reference voltage, and a comparator circuit that compares the divided voltage from the divider resistor circuit with the reference voltage from the reference voltage generating circuit, by applying the divider resistor circuit according to one embodiment of the present invention as the divider resistor circuit of the voltage detecting circuit, the output voltage setting of the voltage detecting circuit may be changed by changing the storage state of the nonvolatile memory cell.

According to another aspect of the present invention, in a semiconductor device that includes a constant voltage generating circuit including an output driver that controls output of an input voltage, a divider resistor circuit that divides an output voltage and outputs the divided voltage, a reference voltage generating circuit that generates a reference voltage, and a comparator circuit that compares the divided voltage from the divider resistor circuit with the reference voltage from the reference voltage generating circuit and controls an operation of the output driver according to the comparison result, by applying the divider resistor circuit according to one embodiment of the present invention as the divider resistor circuit of the constant voltage generating circuit, the output voltage setting of the constant voltage generating circuit may be changed by changing the storage state of the nonvolatile memory cell.

It is noted that although the present invention is shown and described with respect to certain preferred embodiments, features such as numerical values, configurations, materials, and arrangements described in association with the preferred embodiments are merely illustrative examples, and it is obvious that equivalents and modifications will occur to others skilled in the art upon reading and understanding the specification. The present invention includes all such equivalents and modifications, and is limited only by the scope of the claims.

The present application is based on and claims the benefit of the earlier filing date of Japanese Patent Application No. 2004-372775 filed on Dec. 24, 2004, and Japanese Patent Application No. 2005-097472 filed on Mar. 30, 2005, the entire contents of which are hereby incorporated by reference.

The invention claimed is:

1. A semiconductor device, comprising:
a semiconductor substrate;
a nonvolatile memory cell that includes
a memory transistor realized by a MOS transistor including a memory gate oxide film that is arranged on the semiconductor substrate, and a floating gate made of polysilicon that is arranged on the memory gate oxide film which floating gate is in an electrically floating state; and
a selection transistor realized by a MOS transistor that is serially connected to the memory transistor, the selection transistor including a selection gate oxide film that is arranged on the semiconductor substrate, and a selection gate made of polysilicon that is arranged on the selection gate oxide film, wherein an n-type impurity is introduced into the selection gate; and
a peripheral circuit transistor realized by a MOS transistor including a peripheral circuit gate oxide film that is arranged on the semiconductor substrate, and a peripheral circuit gate made of polysilicon that is arranged on the peripheral circuit gate oxide film; wherein the memory gate oxide film is arranged to be thinner than the peripheral circuit gate oxide film,
wherein an impurity concentration of the selection gate and the peripheral circuit gate is higher than an impurity concentration of the floating gate.

2. The semiconductor device as claimed in claim 1, wherein the memory transistor and the selection transistor are PMOS transistors.

3. The semiconductor device as claimed in claim 1, wherein the selection gate oxide film and the memory gate oxide film are arranged to have a same thickness.

4. The semiconductor device as claimed in claim 1, wherein the selection gate oxide film and the peripheral circuit gate oxide film are arranged to have a same thickness.

5. The semiconductor device as claimed in claim 1, further comprising: a capacitor including a lower electrode made of polysilicon that is arranged on the semiconductor substrate via an insulating film, and an upper electrode made of polysilicon that is arranged on the lower electrode via a capacitor insulating film;
wherein the floating gate and the lower electrode are created from a same polysilicon layer, and the capacitor insulating film is arranged on an upper surface and a side surface of the floating gate.

6. The semiconductor device as claimed in claim 5, wherein the peripheral circuit gate and the upper electrode are created from a same polysilicon layer.

7. The semiconductor device as claimed in claim 5, wherein the selection gate, the floating gate, and the lower electrode are created from the same polysilicon layer.

8. The semiconductor device as claimed in claim 6, wherein the selection gate, the peripheral circuit gate, and the upper electrode are created from the same polysilicon layer.

9. The semiconductor device as claimed in claim 1, wherein the n-type impurity is phosphorous.

* * * * *